(12) United States Patent
Madigan et al.

(10) Patent No.: US 10,468,279 B2
(45) Date of Patent: Nov. 5, 2019

(54) APPARATUS AND TECHNIQUES FOR THERMAL TREATMENT OF ELECTRONIC DEVICES

(71) Applicant: Kateeva, Inc., Newark, CA (US)

(72) Inventors: Conor F. Madigan, San Francisco, CA (US); Eliyahu Vronsky, Los Altos, CA (US); Alexander Sou-Kang Ko, Santa Clara, CA (US); Justin Mauck, Belmont, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/106,907

(22) PCT Filed: Dec. 23, 2014

(86) PCT No.: PCT/US2014/072263
§ 371 (c)(1),
(2) Date: Jun. 21, 2016

(87) PCT Pub. No.: WO2015/100375
PCT Pub. Date: Jul. 2, 2015

(65) Prior Publication Data
US 2017/0004983 A1    Jan. 5, 2017

Related U.S. Application Data

(60) Provisional application No. 62/002,384, filed on May 23, 2014, provisional application No. 61/986,868, (Continued)

(51) Int. Cl.
*H01L 21/67* (2006.01)
*H01L 51/56* (2006.01)
(Continued)

(52) U.S. Cl.
CPC .. *H01L 21/67225* (2013.01); *H01L 21/67393* (2013.01); *H01L 51/0005* (2013.01);
(Continued)

(58) Field of Classification Search
USPC .......... 118/300, 313–315, 326, 500, 58, 663, 118/666, 667
See application file for complete search history.

(56) References Cited

U.S. PATENT DOCUMENTS 4,226,897 A   10/1980  Coleman
4,788,447 A   11/1988  Kiyono et al.
(Continued)

FOREIGN PATENT DOCUMENTS

CN   1956209 A      5/2007
CN   201446232 U    5/2010
(Continued)

OTHER PUBLICATIONS

English Translation JP2009112889—May 28, 2009 (Year: 2009).*
(Continued)

*Primary Examiner* — Yewebdar T Tadesse
(74) *Attorney, Agent, or Firm* — Paula J. Tostado

(57) ABSTRACT

Apparatus and techniques are described herein for use in manufacturing electronic devices. such as can include organic light emitting diode (OLED) devices. Such apparatus and techniques can include using one or more modules having a controlled environment. For example, a substrate can be received from a printing system located in a first processing environment, and the substrate can be provided a second processing environment, such as to an enclosed thermal treatment module comprising a controlled second processing environment. The second processing environment can include a purified gas environment having a different composition than the first processing environment.

33 Claims, 32 Drawing Sheets

Related U.S. Application Data filed on Apr. 30, 2014, provisional application No. 61/947,671, filed on Mar. 4, 2014, provisional application No. 61/945,059, filed on Feb. 26, 2014, provisional application No. 61/929,668, filed on Jan. 21, 2014, provisional application No. 61/921,218, filed on Dec. 27, 2013, provisional application No. 61/921,034, filed on Dec. 26, 2013.

(51) Int. Cl.
    *H01L 51/00* (2006.01)
    *H01L 21/673* (2006.01)

(52) U.S. Cl.
    CPC ...... *H01L 51/0026* (2013.01); *H01L 51/0029* (2013.01); *H01L 51/56* (2013.01)

(56) References Cited

U.S. PATENT DOCUMENTS

| | | | |
|---|---|---|---|
| 5,141,918 A * | 8/1992 | Hirano | H01L 39/2429 427/126.3 |
| 5,651,625 A | 7/1997 | Smith et al. | |
| 5,788,447 A | 8/1998 | Yonemitsu et al. | |
| 6,089,282 A | 7/2000 | Spiegelman et al. | |
| 6,228,171 B1 | 5/2001 | Shirakawa | |
| 7,037,810 B2 | 5/2006 | Hayashi | |
| 7,258,768 B2 | 8/2007 | Yamazaki | |
| 7,410,251 B2 | 8/2008 | Chung et al. | |
| 7,517,549 B2 | 4/2009 | Hayashi | |
| 7,635,244 B2 | 12/2009 | Sakiya | |
| 7,703,911 B2 | 4/2010 | Chung et al. | |
| 8,414,688 B1 | 4/2013 | Delgado et al. | |
| 8,592,251 B2 | 11/2013 | Hosoba et al. | |
| 2002/0197145 A1 | 12/2002 | Yamamoto et al. | |
| 2004/0056915 A1 | 3/2004 | Miyazawa | |
| 2005/0062773 A1 | 3/2005 | Fouet | |
| 2005/0140764 A1 | 6/2005 | Chang et al. | |
| 2006/0008591 A1 | 1/2006 | Sun et al. | |
| 2006/0057750 A1 | 3/2006 | Aoki et al. | |
| 2008/0260938 A1 | 10/2008 | Ikeda et al. | |
| 2008/0273072 A1 | 11/2008 | Chung et al. | |
| 2009/0295857 A1 | 12/2009 | Kikuchi et al. | |
| 2009/0324368 A1 | 12/2009 | Koparal et al. | |
| 2010/0201749 A1 | 8/2010 | Somekh et al. | |
| 2011/0096124 A1 | 4/2011 | North et al. | |
| 2011/0305824 A1 | 12/2011 | Chesterfield et al. | |
| 2012/0056923 A1 | 3/2012 | Vronsky et al. | |
| 2012/0326139 A1 | 12/2012 | Chen | |
| 2013/0004656 A1 | 1/2013 | Chen et al. | |
| 2013/0005076 A1 | 1/2013 | Vronsky | |
| 2013/0038649 A1 | 2/2013 | Lowrance et al. | |
| 2013/0040061 A1 | 2/2013 | Lowrance et al. | |
| 2013/0082263 A1 * | 4/2013 | Honda | H01L 29/7869 257/57 |
| 2013/0240844 A1 * | 9/2013 | Nakatsuka | H01L 51/0029 257/40 |
| 2013/0293621 A1 | 11/2013 | Tunmore et al. | |
| 2014/0290567 A1 | 10/2014 | Mauck et al. | |
| 2017/0141310 A1 | 5/2017 | Madigan et al. | |

FOREIGN PATENT DOCUMENTS

| | | | |
|---|---|---|---|
| JP | 2001326162 A | 11/2001 | |
| JP | 2003272847 A | 9/2003 | |
| JP | 2004241751 A | 8/2004 | |
| JP | 2005254038 A | 9/2005 | |
| JP | 2006026463 A | 2/2006 | |
| JP | 2007095377 A | 4/2007 | |
| JP | 2007175703 A | 7/2007 | |
| JP | 2008004919 A | 1/2008 | |
| JP | 2011065967 A | 3/2011 | |
| JP | 2011129275 A | 6/2011 | |
| JP | 2013084946 A | 5/2013 | |
| JP | 2014026764 A | 2/2014 | |
| JP | 2014199806 A | 10/2014 | |
| JP | 2014221935 A | 11/2014 | |
| KR | 100244041 B1 | 2/2000 | |
| KR | 1020010015386 | 2/2001 | |
| KR | 1020050047313 | 5/2005 | |
| KR | 20060088909 A | 8/2006 | |
| KR | 20090126568 A | 12/2009 | |
| KR | 20120022197 A | 3/2012 | |
| TW | 504941 B | 10/2002 | |
| WO | 2012001741 A1 | 1/2012 | |
| WO | 2013023099 A1 | 2/2013 | |
| WO | 2014017194 A1 | 1/2014 | |

OTHER PUBLICATIONS

CN First Office Action dated Apr. 5, 2017 for CN Patent Application No. 80071004.7.
Ep Extended Search Report dated May 4, 2017 for EP Patent Application No. 14873900.6.
International Search Report and Written Opinion dated Apr. 3, 2015, to PCT Application PCT/US14/72263.
MBRAUN HP Stack.
International Search Report dated Feb. 1, 2017 for PCT Application No. PCT/US16/61932.
Official Letter dated Sep. 28, 2018, to TW Application No. 106111554.
Decision on Rejection dated Aug. 13, 2018, to CN Patent Application No. 201480071004.7.
Notice of Allowance dated Jul. 2, 2018, for U.S. Appl. No. 15/351,424.
Provisional Rejection dated Jul. 18, 2018, to KR Patent Application No. 10-2018-7019221.
KR Provisional Rejection dated Aug. 28, 2017, to KR Patent Application No. 10-2016-7019863.
Non-Final Office Action dated Aug. 31, 2017 for U.S. Appl. No. 15/351,424.
Notice of Allowance dated Feb. 13, 2018 for U.S. Appl. No. 15/351,424.
Official Action dated Aug. 29, 2017 for Japanese Patent Application No. 2016-537494.
Second Office Action dated Feb. 6, 2018. to CN Patent Application No. 201480071004.7.
European Search Report dated Apr. 17, 2019 for European Application No. 19162637.3.
Office Action dated Apr. 23, 2019 in Japanese Patent Application No. 2018-140175.
Office Action dated Apr. 26, 2019 in Chinese Patent Application No. 201610837821.X.
European Search Report dated Mar. 25, 2019 to EP Patent Application No. 18201256.7.
Examination Report dated Mar. 27, 2019 issued in Taiwanese Patent Application No. 107102956.
Final Office Action dated Mar. 22, 2019, to U.S. Appl. No. 15/446,984.
Non Final Office Action dated Mar. 28, 2019 to U.S. Appl. No. 16/102,392.
Notice of Allowance dated Mar. 7, 2019 in U.S. Appl. No. 15/605,806.
Notice of Allowance dated Apr. 17, 2019 in U.S. Appl. No. 15/184,755.
Notice of Allowance dated Feb. 14, 2019 in U.S. Appl. No. 14/275,637.
Notice of Allowance dated Feb. 27, 2019, in U.S. Appl. No. 14/543,786.
Notice of allowance dated Mar. 4, 2019, in U.S. Appl. No. 15/409,844.
Notice of Allowance dated Mar. 4, 2019, to U.S. Appl. No. 15/409,844.
Notice of Allowance dated Mar. 7, 2019, to U.S. Appl. No. 15/605,806.
Notice of Allowance dated Mar. 8, 2019 in U.S. Appl. No. 14/275,637.
Notffication of Provisional Rejection dated Apr. 4, 2019 issued in Korean Patent Application 10-20197008155.
Office Action dated Feb. 28, 2019, to CN Patent Application No. 201810257998.1.
Provisional Rejection dated Feb. 25, 2019, issued in Korean Patent Application No. KR 20187027231.

(56) References Cited

OTHER PUBLICATIONS

Second Office Action dated Mar. 5, 2019, to CN Patent Application No. 201580023550.8.
Supplemental Notice of Allowability dated Feb. 28, 2019, in U.S. Appl. No. 15/184,755.

* cited by examiner

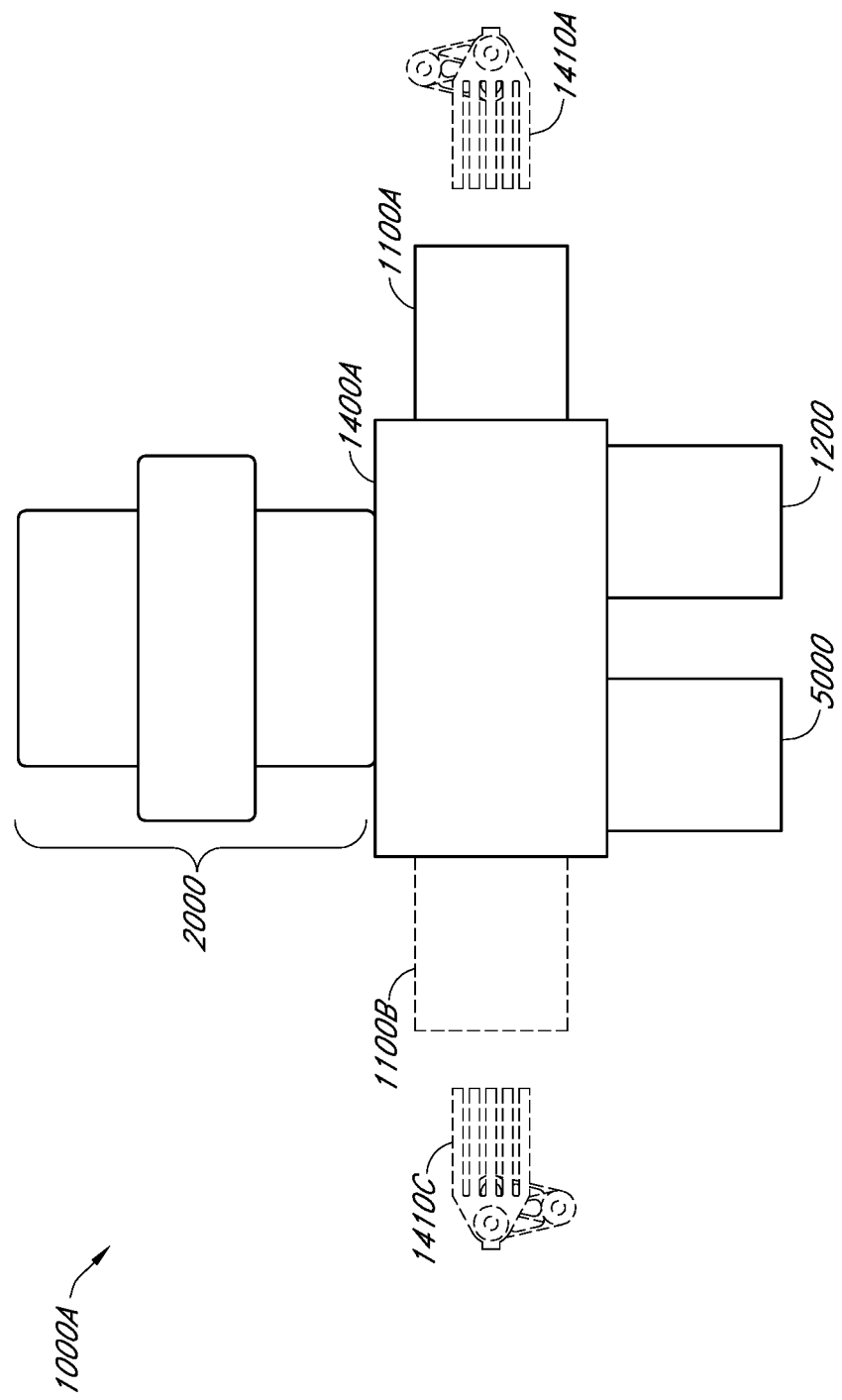

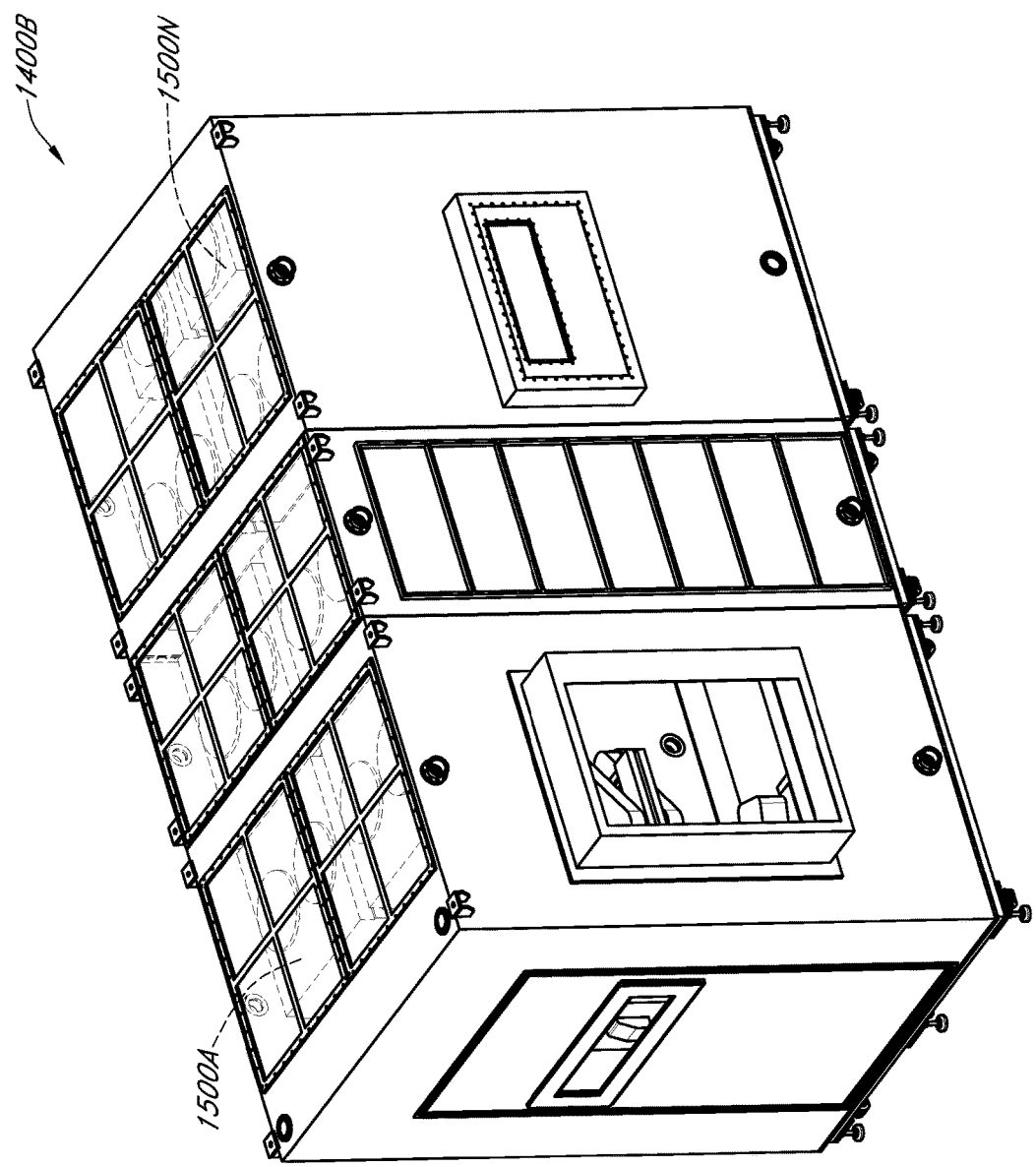

APPARATUS AND TECHNIQUES FOR THERMAL TREATMENT OF ELECTRONIC DEVICES

CLAIM OF PRIORITY

This application is the National Stage of International Application No. PCT/US14/72263, titled "APPARATUS AND TECHNIQUES FOR THERMAL TREATMENT OF ELECTRONIC DEVICES," filed Dec. 23, 2014. International Application No. PCT/US14/72263 claims benefit of priority of each of the following: (1) U.S. Provisional Patent Application Ser. No. 61/921,034, titled "DISPLAY DEVICE FABRICATION SYSTEMS AND TECHNIQUES USING INERT ENVIRONMENT," filed on Dec. 26, 2013; (2) U.S. Provisional Patent Application Ser. No. 61/921,218, titled "DISPLAY DEVICE FABRICATION SYSTEMS AND TECHNIQUES USING INERT ENVIRONMENT," filed on Dec. 27, 2013; (3) U.S. Provisional Patent Application Ser. No. 61/929,668, titled "DISPLAY DEVICE FABRICATION SYSTEMS AND TECHNIQUES USING INERT ENVIRONMENT," filed on Feb. 26, 2014; (4) U.S. Provisional Patent Application Ser. No. 61/945,059, titled "DISPLAY DEVICE FABRICATION SYSTEMS AND TECHNIQUES USING INERT ENVIRONMENT," filed on Feb. 26, 2014; (5) U.S. Provisional Patent Application Ser. No. 61/947,671, titled "DISPLAY DEVICE FABRICATION SYSTEMS AND TECHNIQUES USING INERT ENVIRONMENT," filed on Mar. 4, 2014; (6) U.S. Provisional Patent Application Ser. No. 61/986,868, titled "Systems and Methods for the Fabrication of Inkjet Printed Encapsulation Layers," filed on Apr. 30, 2014; and (7) U.S. Provisional Patent Application Ser. No. 62/002,384, titled "DISPLAY DEVICE FABRICATION SYSTEMS AND TECHNIQUES USING INERT ENVIRONMENT," filed on May 23, 2014. Each application identified in the present Claim of Priority section is hereby incorporated herein by reference in its entirety.

CROSS-REFERENCE TO RELATED PATENT DOCUMENTS

This patent application is related to U.S. Patent Pub. No. US 2013/0252533 A1 (Mauck, et al.), titled "GAS ENCLOSURE ASSEMBLY AND SYSTEM," U.S. Patent Pub. No. US 2013/0206058 A1 (Mauck, et al.), titled "GAS ENCLOSURE ASSEMBLY AND SYSTEM," and U.S. Pat. No. 8,383,202 (Somekh et al.), titled "METHOD AND APPARATUS FOR LOAD-LOCKED PRINTING," each of which is hereby incorporated herein by reference in its entirety.

BACKGROUND

Electronic devices, such as optoelectronic devices, can be fabricated using organic materials, particularly using thin-film processing techniques. Such organic optoelectronic devices can be volumetrically compact because of their relatively thin and planar structure, along with providing enhanced power efficiency and enhanced visual performance, such as compared to other display technologies. In certain examples, such devices can be mechanically flexible (e.g., foldable or bendable), or optically transparent, unlike competing technologies. Applications for an organic optoelectronic device can include general illumination, use as a backlight illumination source, or use as a pixel light source or other element in an electroluminescent display, for example. One class of organic optoelectronic devices includes organic light emitting diode (OLED) devices, which can generate light using electroluminescent emissive organic materials such as small molecules, polymers, fluorescent, or phosphorescent materials, for example.

In one approach, OLED devices can be fabricated in part via vacuum deposition of a series of organic thin films onto a substrate using the technique of thermal evaporation. However, vacuum processing in this manner is relatively: (1) complex, generally involving a large vacuum chamber and pumping subsystem to maintain such vacuum; (2) wasteful of the organic raw material, as a large fraction of the material in such a system is generally deposited onto the walls and fixtures of the interior, such that more material is generally wasted than deposited onto the substrate; and (3) difficult to maintain, due to the need to frequently stop the operation of the vacuum deposition tool to open and clean the walls and fixtures of the built up waste material. Furthermore, in most OLED applications it is desirable to deposit the organic films in a pattern.

In one approach, a blanket coating can be deposited over the substrate and photolithography could be considered for achieving the desired patterning. But in many applications and for most OLED materials in particular, such photolithography processes can damage the deposited organic film or the underlying organic films. A so-called shadowmask can be used to pattern the deposited layer directly when utilizing the vacuum deposition method. The shadowmask in such cases comprises a physical stencil, often manufactured as a metal sheet with cut-outs for the deposition regions. The shadowmask is generally placed in proximity to or in contact with, and aligned to, the substrate prior to deposition, kept in place during deposition, and then removed after deposition. Such direct-patterning via shadowmask adds substantial complexity to vacuum-based deposition techniques, generally involving additional mechanisms and fixturing to handle and position the mask precisely relative to the substrate, further increasing the material waste (due to the waste from material deposited onto the shadowmask), and further increasing the need for maintenance to continuously clean and replace the shadowmasks themselves. Shadowmask techniques also generally involve relatively thin masks to achieve the pixel scale patterning required for display applications, and such thin masks are mechanically unstable over large areas, limiting the maximum size of substrate that can be processed. Improving scalability remains a major challenge for OLED manufacturing, so such limitations on scalability can be significant.

The organic materials used in OLED devices are also generally highly sensitive to exposure to various ambient materials, such as oxygen, ozone, or water. For example, organic materials used in various internal layers of an OLED device, such as including an electron injection or transport layer, a hole injection or transport layer, a blocking layer, or an emission layer, for example, can be subject to a variety of degradation mechanisms. Such degradation can be driven at least in part by incorporation of chemically or electrically/optically active contaminants into the device structure, either within the bulk material of each film or at the interfaces between layers in the overall device stack. Over time chemically active contaminants can trigger a chemical reaction in the film that degrades the film material. Such chemical reactions can occur simply as a function of time, absent any other triggers, or can be triggered by ambient optical energy or injected electrical energy, for example. Electrically/optically active contaminants can create parasitic electrical/optical pathways for the electrical/optical energy introduced or generated in the device during operation, and such pathways can result in suppression of light output, or generation of incorrect light output (e.g., light output of the wrong spectrum.) The degradation or loss may manifest as failure of an individual OLED display elements, "black" spotting in portions of an array of OLED elements, visible artifacts or "mura," loss of electrical/optical efficiency, or unwanted deviation in color rendering accuracy, contrast, or brightness in various affected regions of the array of OLED elements.

OVERVIEW

One or more layers of an OLED device can be fabricated (e.g., deposited or patterned) using a printing technique. For example, an organic material, such as for example a hole injection material, a hole transport material, an emissive material, an electron transport material, a hole blocking material, or an electron injection material can be dissolved or otherwise suspended in a carrier fluid (e.g., a solvent), and a layer of an OLED device including the organic material can be formed by ink-jet printing and subsequent evaporation of the carrier fluid to provide a patterned layer. In another approach, a solid-phase organic material can be vaporized thermally for deposition onto a substrate through a jet. In yet another approach, organic material can be dissolved or otherwise suspended in a carrier liquid, and a layer of OLED device including the organic material can be formed by dispensing a continuous stream on fluid from a nozzle onto a substrate to form a line (so-called "nozzle printing" or "nozzle jet") and subsequent evaporation of the carrier to provide a line patterned layer. Such approaches can generally be referred to as organic "printing" techniques, such as can be performed using a printing system.

In an example, an electronic device fabrication system can include a printing system configured to deposit a first patterned organic layer on a substrate, the patterned layer comprising at least a portion of a light-emitting device being fabricated upon the substrate, the first printing system located in a first processing environment, the first processing environment comprising a controlled environment established to remain below specified limits of any one or more of particulate contamination level, water vapor content, and ozone content. The electronic device fabrication system can include an enclosed thermal treatment module including a stacked configuration of thermally-controlled regions, the thermally-controlled regions offset from each other and each configured to accommodate a substrate including providing one or more of a specified substrate temperature or a specified substrate temperature uniformity, the enclosed thermal treatment module providing a controlled second processing environment, the second processing environment comprising a controlled environment established to remain below specified limits of any one or more of particulate contamination level, water vapor content, oxygen content, and ozone content. The system can include a substrate transfer module, such as coupled to a loading module or configured as a loading module, the substrate transfer module configured to receive the substrate from the printing system and configured to provide the substrate to the second processing environment within the enclosed thermal treatment module. The oxygen content of the first processing environment during the printing of the substrate in the first printing system can be at least 100 times greater than the oxygen content of the second processing environment during the thermal treating of the substrate in the thermal treatment module. In an example, the second processing environment can be established to maintain an environment having less than 1000 parts-per-million of oxygen or less than 1000 parts-per-million of water vapor or less than 1000 parts-per-million of ozone, or any combination of the three.

The fabrication system can include an enclosed substrate cooling module including one or more substrate holding regions, each configured to accommodate the substrate, the substrate cooling module configured to hold the substrate for a duration specified to include cooling the substrate until the substrate is below a specified threshold temperature. The enclosed cooling module can be configured to establish a third processing environment, the third processing environment comprising a controlled environment established to remain below specified limits of one or more of particulate contamination level, water vapor content, oxygen content, and ozone content. In an example, the second and third environments can be substantially similar.

The systems and techniques described herein can be used in support of manufacturing a range of different electronic device configurations, such as including one or more optoelectronic devices. For example, a flat panel display device can be fabricated at least in part using systems or techniques described herein. Such a flat panel display device can include an organic light emitting diode (OLED) flat panel display. Several OLED flat panel displays can be processed on a substrate (or "mother" glass). Use of the word "substrate" or the phrase "substrate being fabricated" refers generally to an assembly in-process that can include an OLED device. The examples herein need not be restricted to a particular panel geometry or size. For example, such systems and techniques can be used in support of fabrication of display devices on substrates having a generation 2 ("Gen 2") size, such as having a rectangular geometry including dimensions of about 37 centimeters (cm) by about 47 cm. The systems described herein can also be used for somewhat larger substrate geometries, such as in support of fabrication of display devices on substrates having a generation 3.5 ("Gen 3.5") substrate size, such as having a rectangular geometry including dimensions of about 61 centimeters (cm) by about 72 cm. The systems described herein can also be used for even larger substrate geometries, such as in support of fabrication of display devices on substrates having a substrate size corresponding to "Gen 5.5," having dimensions of about 130 cm×150 cm, or a "Gen 7" or "Gen 7.5" substrate, having dimensions of about 195 cm×225 cm. For example, a Gen 7 or Gen 7.5 substrate can be singulated (e.g., cut or otherwise separated) into eight 42 inch (diagonal dimension) or six 47 inch (diagonal dimension) flat panel displays. A "Gen 8" substrate can include dimensions of about 216×246 cm. A "Gen 8.5" substrate can include dimensions of about 220 cm×250 cm, and can be singulated to provide six 55 inch or eight 46 inch flat panels per substrate.

Dimensions beyond Gen 8.5 can be supported using systems and techniques described herein. For example, a "Gen 10" substrate having dimensions of about 285 cm×305 cm, or beyond, can be fabricated at least in part using systems and techniques described herein. The panel sizes described herein, while generally applicable to glass substrates, can applied to substrates of any material suitable for use in display device fabrication, and in particular OLED display fabrication that can include forming one or more layers using printing techniques. For example, a variety of glass substrate materials can be used, as well as a variety of polymeric substrate materials, for example, polyimide.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 1A illustrates generally an example of a plan view of at least a portion of a system, such as including a printing system and a thermal treatment module, that can be used in manufacturing an electronic device (e.g., an organic light emitting diode (OLED) device).

FIG. 12A illustrates generally a portion of a system, such as including a transfer module coupled to other chambers or modules, that can be used in manufacturing an electronic device (e.g., an organic light emitting diode (OLED) device).

Figure 1B:
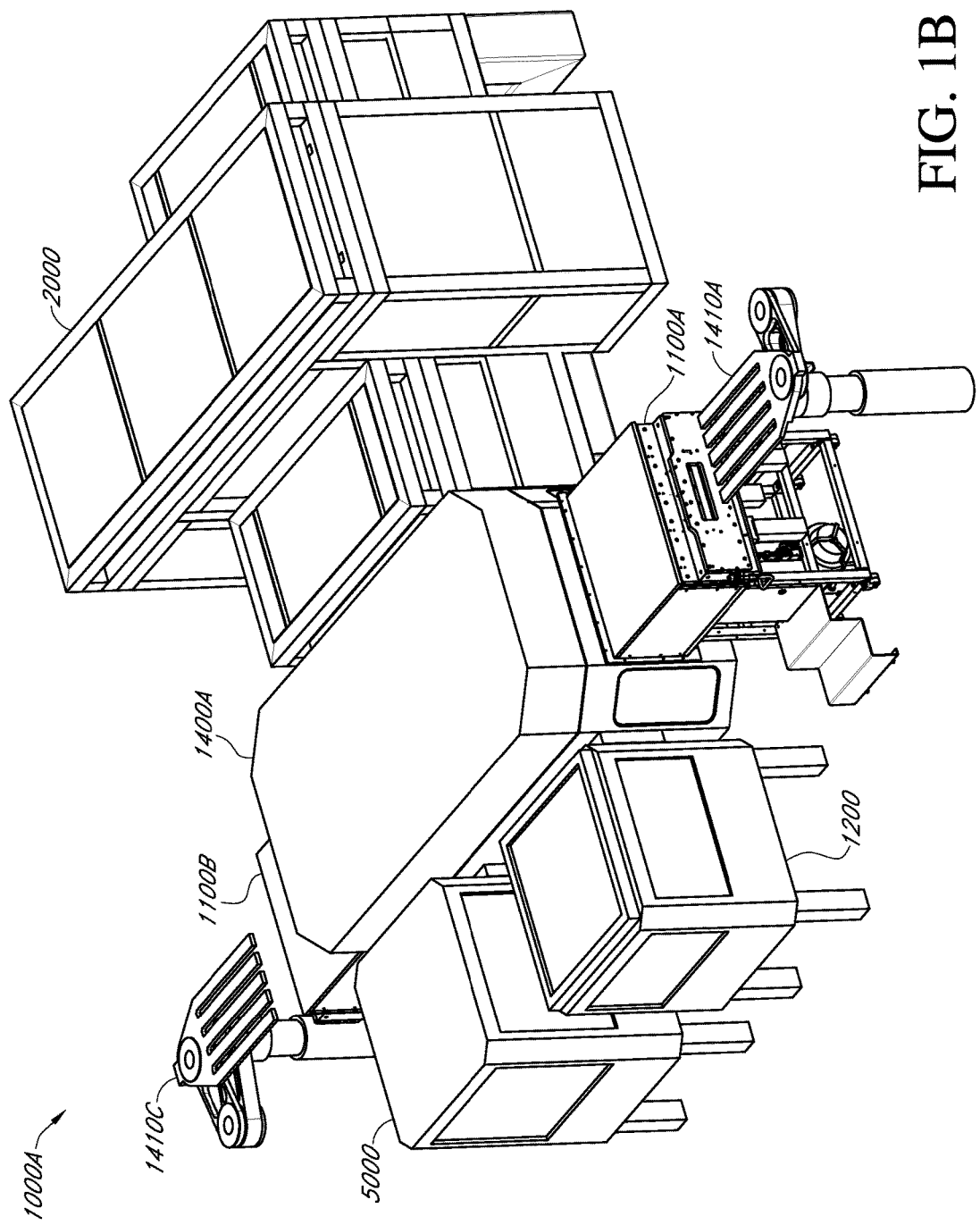
FIG. 1B illustrates generally an illustrative example of an isometric view of at least a portion of a system, such as including a printing system and a thermal treatment module, that can be used in manufacturing an electronic device (e.g., an organic light emitting diode (OLED) device).

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that various electronic device fabrication operations can be performed using an arrangement of modules, such as having controlled processing environments. For example, the arrangement of modules can include respective modules having individually-maintained controlled environments, or one or more of the modules can share a controlled processing environment with other modules. An environment of one module or combinations of modules can be different from other modules. Facilities such as one or more of gas purification, temperature control, solvent abatement, or particulate control can be shared between modules or can be provided in a dedicated manner. In an example, a substrate can include one or more optoelectronic device, such as one or more organic light emitting diode (OLED) devices.

OLED devices being fabricated, such as substrates including many OLED devices, can be transferred to or from fabrication equipment such as using one or more of a loading module (e.g., a "load-lock"), a transfer module including a handler, or a handler external to one or more enclosed modules, for example. Interfaces between modules can include using one or more of a gas curtain or gate valve arrangement. In this manner, transfer of a respective substrate being fabricated can occur without substantially altering an environment of enclosed modules. The present inventors have recognized that use of a load-locked arrangement can allow for controlled-atmosphere-containing line elements to be integrated with other fabrication processes such as open-air or vacuum processes, without substantially altering a controlled (e.g., non-reactive and particulate controlled) environment within a respective module, or without requiring time-consuming purging of the large volumes in each enclosed module. A processing environment of one or more enclosed modules can be controlled, such as established to remain below specified limits of one or more of particulate contamination level, water vapor content, oxygen content, or organic vapor content. A processing environment of one or more enclosed modules can be further controlled to maintain an interior pressure approximately equal to or greater than the ambient pressure surrounding such one or more enclosed modules.

In an example, an arrangement of modules in a fabrication system can include a thermal treatment module, particularly in the case that the fabrication system involves deposition of coatings via one or more printing processes. The thermal treatment module can include respective thermally-controlled regions, such as each configured to accommodate a respective substrate being fabricated. An enclosure of the thermal treatment module can include an adjustable temperature established using a heat source controlled by a temperature controller, where the thermally-controlled regions are configured to provide one or more of a specified temperature or a specified temperature uniformity, at least in part using the heat source. The respective thermally-controlled regions can be offset from each other along a specified axis of the thermal treatment system (e.g., in a vertical or horizontal configuration, such as a "stacked" configuration). In an example, laminar flow can be provided in a direction substantially or entirely parallel to a surface of each substrate being fabricated when each substrate is located in a respective one of the thermally-controlled regions. In an example, the laminar flow can include an atmospheric constituent of a controlled processing environment within the thermal treatment module.

The present inventors have also recognized that in many manufacturing processes, such as including OLED manufacturing, a thermal treatment operation can be long in duration relative to one or more of the other processing operations in the manufacturing line. In an illustrative example, a thermal treatment operation can be between about 5 and about 60 minutes in duration, whereas other processing operations, such as printing operations, might only last 1 to 3 minutes in duration. If only a single process chamber is used for each operation, this can create inefficiency in the line, which will be limited in throughput to the slowest individual process chamber.

In one approach, the problem mentioned above can be solved by utilizing many individual thermal treatment chambers (e.g., as separate units) to keep up with the processing rate of the fastest chamber in the line. However, the present inventors have also recognized that it can be advantageous to provide a stacked thermal treatment configuration, having spaces, or "slots," for multiple substrates in a single system, such as providing a single large enclosure or unit but increasing throughput by providing for parallel thermal processing of many substrates within the unit, in spite of the potentially long thermal processing time. Further, the present inventors have recognized that when such thermal treatment steps include processing in a controlled environment, particular consideration can be given to aspects relating to loading and unloading substrates, and providing for clean, particle free environments, when using such a multi-substrate thermal treatment module. For example, a thermal treatment module having such a controlled processing environment can include providing an atmosphere including a gas (e.g., nitrogen) having a specified purity level. Such a purity level can also include controlled maximum impurity concentrations of other species, such as oxygen or water, such as to prevent degradation of OLED devices during fabrication or to inhibit or suppress defects. Particulate controls can also be provided, such as to maintain a specified particulate level within the inert environment.

FIG. 1A illustrates generally an example of a plan view of at least a portion of a system 1000A, such as including a printing system 2000 and a thermal treatment module 5000, that can be used in manufacturing an electronic device (e.g., an organic light emitting diode (OLED) device) and FIG. 1B illustrates generally an illustrative example of an isometric view of at least a portion of the system 1000A. The thermal treatment module 5000 can include a configuration as shown in the examples of FIGS. 5A, 5B, 5C, 5D or as described in other examples herein.

The system 1000A can include a clustered configuration, such as having a transfer module 1400A coupled to the printing system 2000. One or more other modules can be coupled to the printing system 2000, such as through the transfer module 1400A. For example, the thermal treatment system 5000 and a processing module 1200 can be coupled to the first transfer module 1400A. The thermal treatment system 5000 can include a stacked configuration as mentioned in other examples described herein, such as shown and described in the examples of FIGS. 5A, 5B, 5C, and 5D. The processing module 1200 can include a holding or buffer module, such as can accommodate a single substrate, or multiple substrates, such as in a stacked configuration as shown illustratively in FIGS. 13A and 13B. In addition to simply holding substrates for the purpose of substrate flow management, such as holding a substrate for a period of time until another module is ready to receive it or providing a place to hold defective or damaged substrates until they can be removed, such a holding or buffer module can also be used to hold substrates for a period of time as a part of the functional process flow. For example, after a thermal treatment operation, the substrate can be held for in the holding or buffer module, such as to bring the substrate into approximate thermal equilibrium with the surrounding environment within the holding or buffer module.

In an example, a timed holding operation may be performed to allow the substrate to evolve from one state to another. For example, after a printing operation in which a liquid material is deposited onto the substrate and prior to a curing operation to form a solid film, a timed holding operation having a specified duration may be used to allow the liquid to flow, settle, dry, or any combination of the three prior to fixing the film via a curing operation, such as a curing operation including thermal treatment or optical treatment. The processing module 1200 can include a vacuum drying module, such as can accommodate a single substrate or multiple substrates, such as in a stacked configuration, as shown illustratively in FIG. 13A. Such a vacuum drying module can provide for the drying (at pressures below ambient pressures) of a liquid material, such as can be deposited onto the substrate via printing. In an example, the system 1000A can include both a holding module providing various functions as described above and a separate vacuum drying module. Alternatively (or in addition), the system 1000A can include a holding module configured to provide holding or buffering at ambient pressure, or at about ambient pressure during certain durations, and to provide vacuum drying during other durations.

The system 1000A can be enclosed, such as having an controlled processing environment. Such a controlled processing environment can be established to remain below specified limits of one or more of particulate contamination level, water vapor content, oxygen content, and organic vapor content. For example, the controlled processing environment can include nitrogen or another gas or mixture of gases specified for minimal or no reactivity with a species deposited on a substrate being processed using the system 1000A. As described in other examples below, such a controlled processing environment can be established at least in part using a gas purification system include within or coupled to various portions of the system 1000A (e.g., as shown in FIGS. 8, 9A-9B, 10A-10B). A particulate level of the controlled environment can also be controlled, such as using apparatus coupled to the system 1000A or located within one or more modules of the system 1000A, as shown and described in other examples herein.

As an illustrative example, one or more of the processing module 1200, the printing system 2000, the transfer module 1400A, can include an controlled environment established by a shared gas purification facility, a single dedicated gas purification facility, or multiple dedicated gas purification facilities individually associated with different portions of the system 1000. For example, various modules can include gates or valving such as to be controllably isolated from other portions of the system 1000 to allow various operations as might be performed during nominal system operation or during maintenance, without requiring an entirety of the controlled environment of the system 1000 to be purged or otherwise contaminated.

The system 1000A can include one or more loading modules, such as one or more of a first loading module 1100A or a second loading module 1100B, such as to provide a point-of-entry or point-of-exit for one or more substrates being fabricated. The first or second loading modules 1100A or 1100B can be fixed or removable, such as directly coupling the system 1000A to other apparatus in a manufacturing line, or even providing a removable assembly that can be transported to or from other apparatus. For example, one or more of the first or second loading modules 1100A or 1100B can be configured to transfer the substrate to or from an environment different from the environment within the system 1000A.

For example, the first loading module 1100A or second loading module 1100B can be coupled to a vacuum source, or a purge source, or both, and can be configured for independently sealing the interface port to system 1000A and the interface port to the prior or next environment (which could be the ambient environment or a controlled environment associated with another enclosed processing module.) In this manner, the first or second loading module 1100A or 1100B can internally seal itself and transition the internal environment of the loading module 1100A or 1100B between one that is not compatible with system 1000A to one that is compatible with system 1000A (e.g., a controlled environment at about atmospheric pressure or above atmospheric pressure that when exposed to system 1000A via the interface port would substantially maintain the quality of the controlled environment in system 1000A). Similarly, the first loading module 1100A or second loading module 1100B can be used to transfer the substrate to an environment suitable for other processing (e.g., a second environment at or near atmospheric pressure but having a different composition than the controlled environment, or a vacuum environment). In this manner, the first or second loading modules 1100A and 1100B can provide a transfer conduit between the controlled environment of the system 1000A and other apparatus. While the illustrations of FIGS. 1A and 1B show a single processing module 1200 coupled to the transfer module 1400A, other configurations are possible, such as shown and discussed in the examples below.

As mentioned above, the first loading module 1100A or the second loading module 1100B can include a permanently-attached configuration, or a cart or other transportable configuration. A substrate being fabricated can be placed within one of the loading modules 1100A or 1100B through a port, such as using a handler located within the system 1000A, or using one or more handlers located elsewhere, such as a first handler 1410A or a second handler 1410B.

In an example, the loading module (e.g., the first loading module 1100A) can then be provided with a non-reactive atmosphere or otherwise "charged" using a purified gas stream, such as including one or more purge operations, to prepare an interior region of the loading module 1100A for exposure to interior portions of the enclosed system 1000A. For example, an internal region of one or more of the first or second loading modules can be at least partially evacuated or purged in order to avoid contamination in a manner exceeding the specified limits of particulate contamination level, water vapor content, oxygen content, ozone content, and organic vapor content of the controlled processing environment within an enclosed region defined by other portions of the system 1000A.

Similarly, after processing by the system 1000A, a substrate being fabricated can be placed in the first or second loading modules 1100A or 1100B. As an illustration, the second loading module 1100B, for example, can then be isolated from a non-reactive gas environment elsewhere in the system 1000A, such as coupled to a vacuum source to be evacuated for subsequent processing under vacuum conditions, or otherwise for transport of the substrate being fabricated to other apparatus or processing under vacuum conditions, ambient conditions or some other static controlled environment provided within the second loading module 1100B. Alternatively (or in addition), the substrate could be returned back to the first loading module 1100A for further processing or handling once exiting the enclosure of the system 1000A. As a further illustration, one of the first or second loading modules can be configured to provide the substrate to the controlled processing environment within the system 1000A without raising a concentration of a reactive species by more than 1000 parts per million within the enclosed region or similarly, without raising the ambient particle levels by more than a specified amount, or without depositing more than a specified number of particles of specified size per square meter of substrate area onto the substrate.

In an example, the first loading module 1100A can be coupled to the transfer module 1400A by a port (e.g., including a physical gate having a substantially gas impermeable seal) or gas curtain. When the port is opened, an interior of the first loading module 1100A can be accessed by a handler located in the first transfer module 1400A. The handler can include a robotic assembly having various degrees of freedom, such as to manipulate a substrate using an end effector. Such an end effector can include a tray or frame configured to support the substrate by gravity, or the end effector can securely grasp, clamp, or otherwise retain the substrate, such as to allow reorientation of the substrate from a face-up or face-down configuration to one or more other configurations. Other end effector configurations can be used, such as including pneumatic or vacuum-operated features to either actuate portions of the end effector or otherwise retain the substrate. Illustrative examples of transfer modules including handlers are shown in FIGS. 11A through 11C, and FIGS. 12A and 12B.

The processing module 1200, can comprise an enclosed module having an controlled environment similar to other modules included in the system 1000A. As described in other examples, the controlled environment in the processing module 1200 can be maintained independently of other portions of the system 1000A, such as isolatable from other enclosed regions of the system 1000A (e.g., for maintenance or as related to particular processing tasks). In an illustrative example, the processing module 1200 can include a holding module configured to provide respective environmentally-controlled regions to accommodate respective substrates being fabricated. The respective substrates can be conveyed to the respective environmentally-controlled regions using a handler and end effector. The environmentally-controlled regions can be offset from each other along a specified (e.g., vertical) axis of the "holding" module to provide a "stack buffer" configuration. In this manner, one or more substrates can be buffered or stored within the controlled environment of the system 1000A, such as queued for further processing in one or more other modules.

In addition to queuing substrates (or instead of queueing substrates), such as until the next module is ready to receive such substrates, a holding module can functionally participate in the substrate fabrication process, for example by providing drying functions, cooling functions, or by holding the substrate for a specified duration (or until specified criteria are met) so as to allow the substrate to evolve from one condition to another. In the case of holding for the purpose of evolving the substrate, for example, the substrate can be held so as to allow for a liquid to settle or flow. In the case of cooling the substrate, for example, after a prior thermal treatment operation and before loading into a printing module for a subsequent printing process, the substrate can be held for a specified duration or until it is within a specified temperature range (or both). In such an application, the cooling process can be controlled through the controlled application of temperature controlled gas flow across the substrate surface, such as laminar flow, which can be provided to flow across the plane of the substrate, as indicated in FIG. 13B.

The temperature of a controlled environment within the holding module can be raised or lowered so as to slow or accelerate the cooling process, and in general, the holding module temperature need not be the same as the temperature of the environment in or surrounding the other system modules, for example, the printing module or the substrate handling module. Alternatively (or additionally), a cooling process can be further controlled using a chuck configuration supporting the substrate. For example, the substrate can be held by physical contact between the substrate (or at least portions of the substrate) and an actively cooled tray or chuck. In another example, the substrate can rest on a cushion of actively cooled gas (similar to other examples described herein, such as where the substrate is supported using a floating cushion of gas for one or more of printing or thermal treatment operations). To reduce a likelihood of damaging the substrate, the substrate can be cooled slowly, such as over a specified duration of more than 30 seconds (30 s), more than 60 s, more than 120 s, or over one or more other specified durations. Accordingly, in an example, the substrate can be cooled primarily using ambient gas flow, as described above, to avoid thermal shock, as compared to placing the substrate directly on an active cooling tray, chuck, or gas cushion. However, the rate of cooling on an active cooling tray, chuck, or gas cushion can also be controlled by controlling a rate at which the substrate is lowered onto a tray, chuck, or gas cushion, such as via the use of controlled movement of lift pins or controlled movement of a substrate handler.

In a representative printing process example, a substrate may be received at a temperature substantially above the ambient temperature of the printing module environment (e.g., as a result of a prior thermal treatment), and such a substrate may undergo continuous cooling as it achieves equilibrium with the ambient temperature around the substrate. Such cooling can occur over a period of time that can be long in duration when compared to the time generally involved in transferring the substrate to the printing module. Also, without cooling prior to initiation of the printing process, a substrate can undergo substantial temperature changes during the printing process, which in turn can lead to mechanical shrinkage of the substrate between the start and end of the printing process. Such shrinkage can create error in the placement of the ink on the substrate. According to various illustrative examples, a substrate can be held for a minimum duration of one of 60 s, 120 s, 240 s, or 480 s, or another specified duration, prior to loading into the printing module.

According to an illustrative example, a substrate can be held until the substrate temperature is within one of 10 C, 5 C, 2 C, or 1 C of the temperature within the environment of printing module prior to loading into the printing module. In an illustrative example, a substrate can be received by the handler in the transfer module 1400A at a temperature of about 200 C and can be placed by the handler in the transfer module 1400A into the processing module 1200, such as where the processing module 1200 is configured as a holding module operating at a controlled internal temperature of 25 C. In this illustrative example, the substrate can be held in the holding module for a period of at least 240 s, such that the substrate is thereby cooled to within 5 C of the holding chamber controlled internal temperature (i.e., in this example, the substrate is cooled to 30 C or less) prior to transferring the substrate via the handler in the transfer module 1400A from the processing module 1200 to the printing system 2000 operating at a controlled internal temperature of 25 C. In avariation of this illustrative example, the processing module 1200 can contain an actively cooled vacuum chuck onto which the substrate is lowered over a period of 30 s, and thereafter held on the chuck for a period of 30 s, by which time the substrate is within 5 C of the printing system 2000 working temperature, after which point the substrate can be transferred to the printing system 2000. In yet another variation of this illustrative example, the processing module 1200 can contain an actively-cooled floating platform onto which the substrate is lowered over a period of 30 s, and thereafter floated on the chuck for a period of 30 s, by which time the substrate is within 5 C of the printing system 2000 working temperature, after which point the substrate can be transferred to the printing system 2000.

In another representative printing process involving two printing operations, such as after printing a first coating, a thermal treatment may be performed on the first coating including treating the substrate using temperatures of between about 120 C and about 300 C, and following such thermal treatment, a substrate can be held to cool it prior to transferring it to a printing module for printing a second coating. In a representative example, following printing of a coating in printing system 2000, a substrate can be transferred to the thermal treatment module 5000 by the handler in the transfer module 1400A and therein heated to a temperature of about 200 C for a duration in excess of 5 minutes, and thereafter the handler in the transfer module 1400A transfers the substrate to processing module 1200, such as where the processing module 1200 is configured as a holding module operating at a controlled internal temperature of 25 C. In this illustrative example, the substrate can be held in the holding module for a period of at least 240 s, such that the substrate is thereby cooled to within 5 C of the holding chamber controlled internal temperature (i.e., in this example, the substrate is cooled to 30 C or less) prior to transferring the substrate via the handler in the transfer module 1400A from the processing module 1200 to the printing system 2000 back to the printing system 2000, or to the loading modules 1100A or 1100B wherein the substrate is thereafter transferred to another printing system or other equipment. In instances wherein a holding step for the purpose of cooling is long relative to the duration for a printing operation, which can be between 30 s and 90 s, between 60 s and 120 s, or between 90 s and 240 s, in various representative examples, the inventors have recognized that a stack configuration can be valuable for the holding module to support higher throughput.

In the case of drying a substrate in a processing module 1200, the controlled environment can provide for continuous removal of evaporated vapors via a vapor trap or gas recirculation and purification system, and the dying process can be further controlled through the controlled application of gas flow across the substrate surface, such as laminar flow, which can be provided to flow across the plane of the substrate, as indicated in FIG. 13B. In an example, the processing module 1200 includes a drying module, and the system 1000A is configured to at least partially evacuate or purge an atmosphere within the drying module to facilitate a drying operation, such as one or more of after a printing operation or prior to a thermal treatment operation using the thermal treatment module 5000. In this example, the drying operation and drying module are distinct from a separate "bake" operation that can be performed using the thermal treatment module 5000.

In aggregate, the system 1000A can be operated in so-called "cluster" and "linear" (or "in-line") modes, these two operating modes being mainly differentiated by the flow of a substrate in from and then back to the same chamber in the "cluster" mode and the flow of a substrate in from one chamber and out to a different chamber in the "linear" or "in-line" mode. The subject matter described herein can be included or used in both "cluster" and "linear" or "in-line" configurations. Where systems are generically referred to herein as "cluster," "clustered," this reflects the presence in various non-limiting representative example systems (which can in aggregate be operating in either cluster or in-line modes) of one or more clustered elements.

Figure 2A:
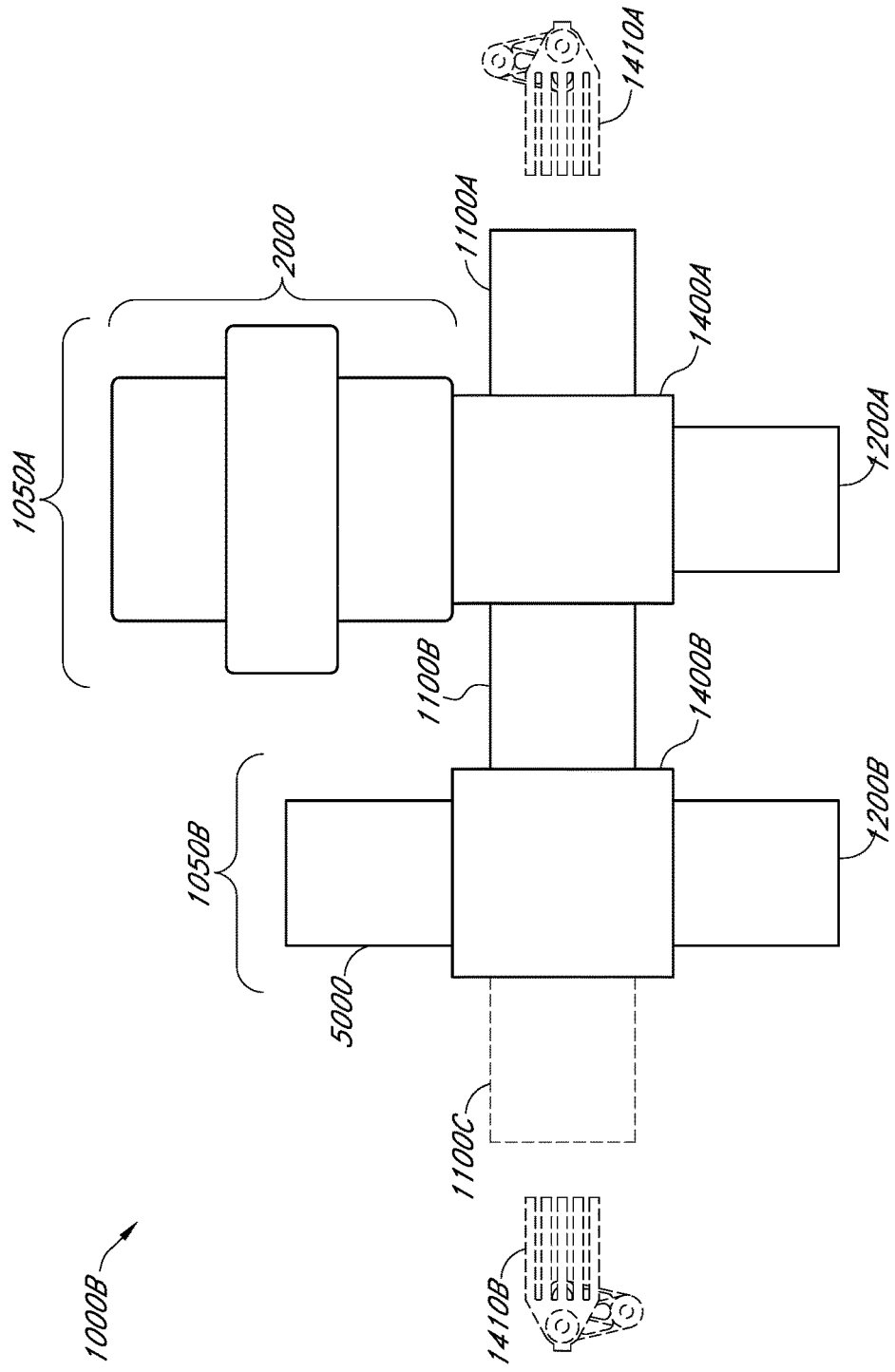
FIG. 2A illustrates generally an example of a plan view of at least a portion of a system, such as including a printing system and a thermal treatment module, that can be used in manufacturing an electronic device (e.g., an organic light emitting diode (OLED) device).
Figure 2B:
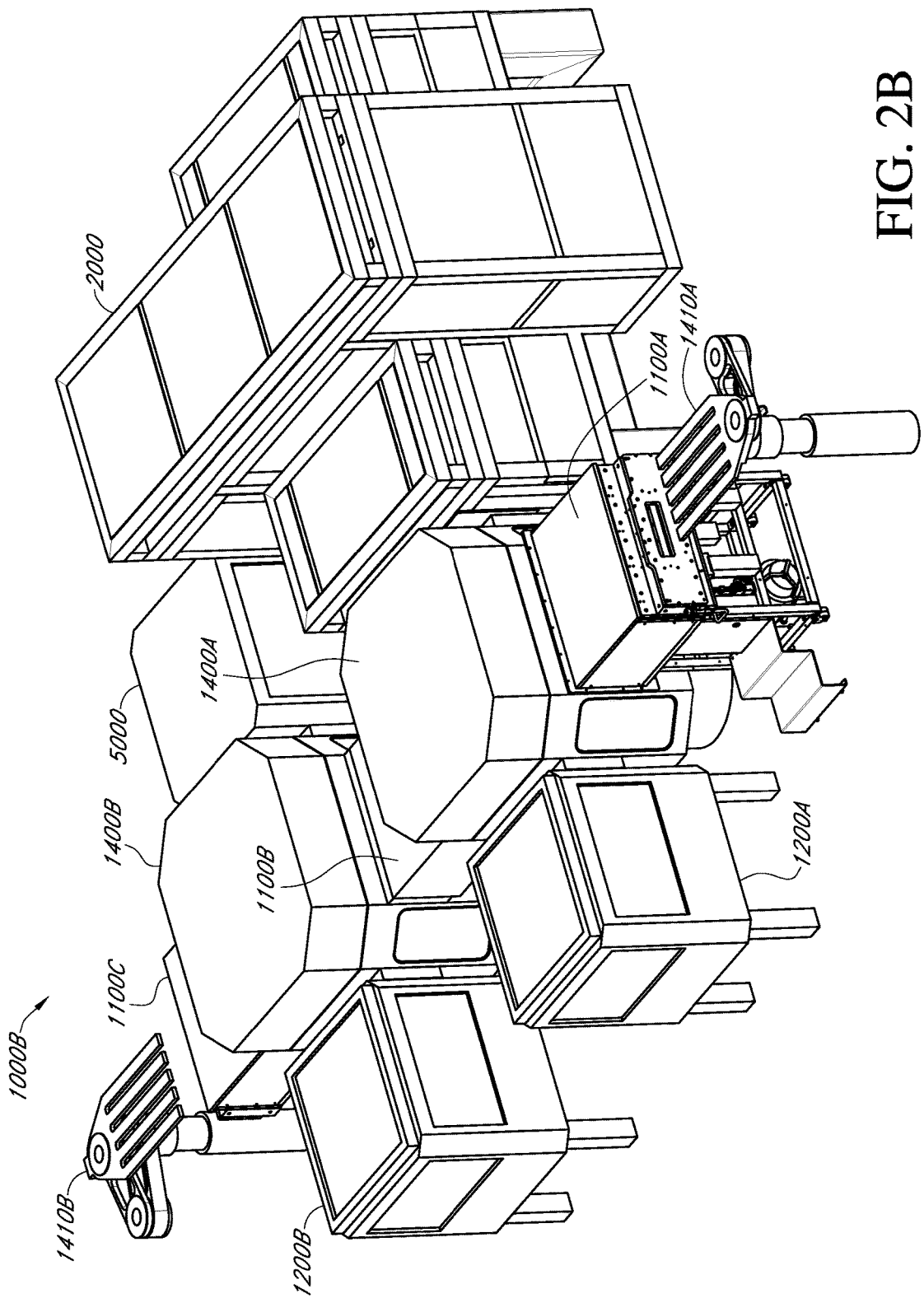
FIG. 2B illustrates generally an illustrative example of an isometric view of at least a portion of a system, such as including a printing system and a thermal treatment module, that can be used in manufacturing an electronic device (e.g., an organic light emitting diode (OLED) device).

FIG. 2A illustrates generally an example of a plan view of at least a portion of a system 1000B, and FIG. 2B illustrates generally an illustrative example of an isometric view of at least a portion of the system 1000B, such as including a printing system 2000 and a thermal treatment module 5000, that can be used in manufacturing an electronic device (e.g., an organic light emitting diode (OLED) device). The topology of the system 1000B shown in FIGS. 2A and 2B is an illustrative example of a variation on the configuration shown in FIGS. 1A and 1B. The elements shown in the example of FIGS. 2A and 2B can be similar in function and configuration to those shown and described in FIGS. 1A and 1B and in examples elsewhere herein.

In FIGS. 2A and 2B, a printing system 2000 can be coupled to a first transfer module 1400A. A processing module 1200A can be coupled to the first transfer module 1400A. In an illustrative example, a first controlled processing environment 1050A within or surrounding the printing system 2000, the first transfer module 1400A, and the processing module 1200A can include either an ambient environment at or near atmospheric pressure, or some other first environment (e.g., a particulate controlled environment having a purified gas environment, or a particulate controlled environment that need not include a purified gas environment). In an example where the printing system 2000, the transfer module 1400A, and the processing module 1200A are enclosed, such a first environment 1050A can be defined by one or more enclosures surrounding the printing system 2000, the transfer module 1400A, and the processing module 1200A. A first loading module 1100A can be coupled to the first transfer module 1400A, and the first loading module 1100A can be used to transfer a substrate to or from the first controlled processing environment, such as without substantially altering the first processing environment. If the first processing environment is similar to the ambient environment, the first loading module 1100A can be omitted. In such instance, the transfer module 1400A need not comprise an enclosure, and rather may simply comprise a substrate handling robot that can further include a surrounding frame or structure defining the working area of the transfer robot for safety. In an example in which the first processing environment is similar to the ambient environment, a gas curtain or gate valve can be used instead of the first loading module 1100A to provide an input or exit port to the first transfer module 1400A, or transfer module 1400A can be accessed through an open port without any gas curtain or gate valve.

The system 1000B of FIGS. 2A and 2B can include a thermal treatment module 5000, such as coupled to a second transfer chamber 1400B. The system 1000B can further include a second processing module 1200B, such as coupled to 1400B. (Alternatively, one or both processing modules 1200A and 1200B can be omitted, in the case that the operations to be performed by the system 1000B do not need such modules.) One or more of the thermal treatment module 5000, processing module 1200B, and the second transfer chamber 1400B can provide a second controlled processing environment 1050B, such as a purified gas environment having a different gas composition than the first processing environment. For example, the second processing environment can be controlled, such as including a purified non-reactive gas specified for minimal or no reactivity with a species deposited on the substrate. In an example, the second processing environment can include nitrogen above atmospheric pressure. The second processing environment can be established to maintain an environment having less than 1000 parts-per-million of oxygen and less than 1000 parts-per-million of water vapor. The second processing environment can also be established to further maintain an environment having less than 1000 parts-per-million of ozone or less than 1000 parts-per-million of a specified organic vapor. The first processing environment can include an environment exceeding one or more of 1000 parts-per-million of oxygen but having less than 1000 parts-per-million of water vapor.

The first processing environment can include an environment exceeding one or more of 1000 parts-per-million of ozone or a particular organic vapor. Other combinations of the two environments are possible. However, particular consideration is given by the inventors to the case that the level of oxygen in the second processing environment is controlled to a greater degree than in the first processing environment, for example, such that the first environment can include an oxygen level 100 times greater than the second environment, or 1000 times greater, such as specified in parts per million. In this manner, the control of the first processing environment can be different from the second environment, such as less stringent, with respect to one or more of particulate contamination level, water vapor content, oxygen content, ozone content, and organic vapor content.

According to various illustrative examples, the environmental control for a given contaminant for a given process can be specified to maintain the level at less than 100 parts-per-million, less than 10 parts-per-million, less than 1 parts-per-million, or even less than 0.1 parts-per-million, instead of the 1000 parts-per-million level mentioned illustratively above, and the inventors have recognized that any combination of the recited contaminants at any of the recited contamination levels can be specified for a controlled environment.

In an illustrative example, a first environment, wherein a printing system for printing an OLED device layer operates, can include ozone-controlled clean dry air, having less than 100 parts per million of water, less than 100 parts per million of ozone and between 100,000 and 250,000 parts per million of oxygen, whereas a second environment, wherein a thermal treatment module for thermally treating a printed OLED device layer operates, comprises purified nitrogen gas having less than 100 parts per million of water, less than 100 parts per million of oxygen, and less than 100 parts per million of ozone. The inventors have recognized that such a combination of environments can be desirable for printing certain OLED device layers in such cases where it is undesirable to print within the second controlled environment, for example, due to the increased complexity of providing such a second environment for a complex fabrication device like a printer, but at the same time it is desirable to thermally treat the printed layer in the second environment having greater purity than the first environment with respect to a chemically active contaminant, such as water, oxygen, or ozone, due to the increased reactivity of such contaminants with the OLED device layer material at elevated temperatures. Furthermore, the inventors have also recognized that in such a case, the thermal treatment step can be substantially longer than the printing step, and providing for a stacked oven configuration in the second environment can be desirable to enhance the fabrication efficiency of the system.

As described with respect to FIGS. 1A and 1B, the processing modules 1200A and 1200B can be configured as a holding module or a buffer module, which can provide the function of queuing substrates until another module is ready to receive them or such holding can be used to provide a controlled environment for the substrate to evolve in some way. For example, if a liquid ink has been provided on the substrate, the holding module can provide a controlled environment for such ink to dry, flow, or settle, or in the example where the substrate is heated to an elevated temperature relative to the temperature within another module, the holding module can provide a controlled environment for the substrate to cool. One or more of the processing modules 1200A and 1200B can alternatively (or additionally) function as a vacuum drying module. For example, a processing module configured as a vacuum drying module can be coupled to or can include a pumping stack, for example, such as including one or more of a mechanical pump, a turbo pump, a cryopump, or a diffusion pump. Such a drying module can include facilities for removing solvent before or after the pump stack, for example, such as using one or more of a cold trap, a molecular sieve, and an activated carbon filter. In an illustrative example including printing an OLED device layer, the first processing module 1200A can include a vacuum drying module for drying coatings deposited by the printing system 2000, and the second processing module 1200B can be configured as a holding chamber for cooling substrates thermally treated by thermal treatment module 5000, wherein the first environment comprises ozone controlled clean dry air, having less than 100 parts per million of water, less than 10 parts per million of ozone and between 10,000 and 250,000 parts per million of oxygen, and the second environment comprises purified nitrogen having less than 10 parts per million of water, less than 10 parts per million of oxygen, and less than 10 parts per million of ozone.

The inventors have recognized that it can be desirable to have a thermal treatment module 5000 and a holding chamber for cooling substrates after thermal treatment together in a second environment, where such a second environment is established to include greater purity than a first environment with respect to contaminants that can degrade the printed substrate material particularly when the substrate experiences elevated temperatures. For example, before the substrates are removed from the second environment, the temperature of the substrates can be lowered within the controlled second environment so that the substrates can then be exposed to a less pure environment (e.g., the first environment) with less likelihood of defects or degradation of substrates.

A processing module 1200B configured as a holding module and the thermal treatment module 5000 can include different enclosed environments, such as third and second environments respectively, provided they share specified purities with respect to the specified contaminants at risk of degrading the printed substrate. In one representative example of printing an OLED device layer, a first OLED device layer ink can be printed in an environment comprising ozone-controlled clean dry air. The ink can then be thermally treated in a nitrogen environment controlled to maintain low oxygen, water, and ozone at a temperature equal to or greater than 150 C, and subsequently the substrate can be cooled in a nitrogen environment controlled to maintain low oxygen, water, and ozone until such substrate temperature is below 100 C, after which point the substrate can be transferred back into an environment comprising ozone-controlled clean dry air. The illustrative example of a temperature of 100 C is specified such that exposure of the substrate at such temperature to the oxygen in the ozone-controlled clean dry air environment will not substantially degrade the printed OLED device layer material, and such a specified substrate temperature can be adjusted depending on the materials being deposited on the substrate via printing, and other factors such as substrate geometry and whether substrate cooling is forced or occurs naturally. Depending on the material, other target cooling threshold temperatures can be used, such as 80 C, 60 C, or for sensitive materials, even 40 C or a lower temperature. Depending on the OLED device layer material, various thermal treatment temperatures can be used, for example, 150 C, 180 C, 210 C, 240 C, 270 C, or 300 C. The inventors have also recognized that the holding time associated with cooling a substrate to a specified temperature can be substantially longer than a duration of a printing operation, for example, the cooling duration can be between 5 minutes and 60 minutes whereas the printing operation duration can be between 1 minute and 3 minutes. Accordingly, a stacked holding module configuration can be used to enhance the fabrication efficiency of the system by allowing multiple substrates to be cooled in parallel.

In an illustrative example, a first environment, such as established within a printing system 2000 for printing an OLED device layer ink, can include purified nitrogen such as having less than 10 parts per million of water, less than 10 parts per million of oxygen, and less than 10 parts per million of ozone, and a second environment, wherein a thermal treatment module 5000 for thermally treating a printed OLED device layer coating operates, can include ozone-controlled clean dry air, having less than 1000 parts per million of water, less than 100 parts per million of ozone and between 1000 and 100,000 parts per million of oxygen. The inventors have recognized that such a combination of environments can be used for printing certain OLED device layers in such cases where it is undesirable to expose the inks associated with the printing the OLED device layer to high concentrations of oxygen, for example, in the case that oxygen exposure degrades the ink, but also where it is desired to thermally treat the printed layer in an environment in the presence of oxygen such as to facilitate a chemical reaction in the OLED device layer material during the thermal treatment process. The inventors further have recognized that many different combinations of first and second environments are possible, some having greater purity in the second environment, some have greater purity in the first environment, and some having different environments that are neither greater in purity or lesser in purity with respect to all contaminants of interest. For example, the first and second environments can be specified to meet similar purity thresholds with respect to contaminants of interest, but such environments may still be different (such as different in one or both of pressure or gas composition).

A second loading module 1100B can couple the first transfer module 1400A to the second transfer module 1400B. As in other examples described herein, the second loading module can include one or more ports or gates, and can be configured to be at least partially evacuated or purged such as to avoid or reduce contamination of the second processing environment within the second transfer module 1400B when a substrate is transferred to or from the second transfer module 1400B. Optionally, such as for use in an "in-line" configuration, a third loading module 1100C can be included, such as to transfer a substrate to or from other fabrication equipment or an environment other than the first or second processing environments. In an example, the first and second processing environments can be the same (or at least similar), and the second loading module 1100B can operate a pass-through, such as shown and described in relation to FIGS. 3A and 3B.

As in the examples of FIGS. 1A and 1B and other examples herein, one or more handlers can be used to manipulate the substrate being processed or transferred. For example, one or more handlers such as a first handler 1410A or a second handler 1410B can be used to place a substrate in or retrieve a substrate from the first or third loading modules 1100A or 1100C. Similarly, one or more handlers can be located within the system 1000B, such as within the first transfer module 1400A or the second transfer module 1400B, such as to manipulate substrates within the system 1000B. For example, a handler within one or more of the second transfer module 1400B or the thermal treatment module 5000 can be configured to transfer the substrate from a loading module (e.g., the second loading module 1100B or the third loading module 1100C) to a specified one of respective thermally-controlled regions within the thermal treatment module 5000.

Figure 3A:
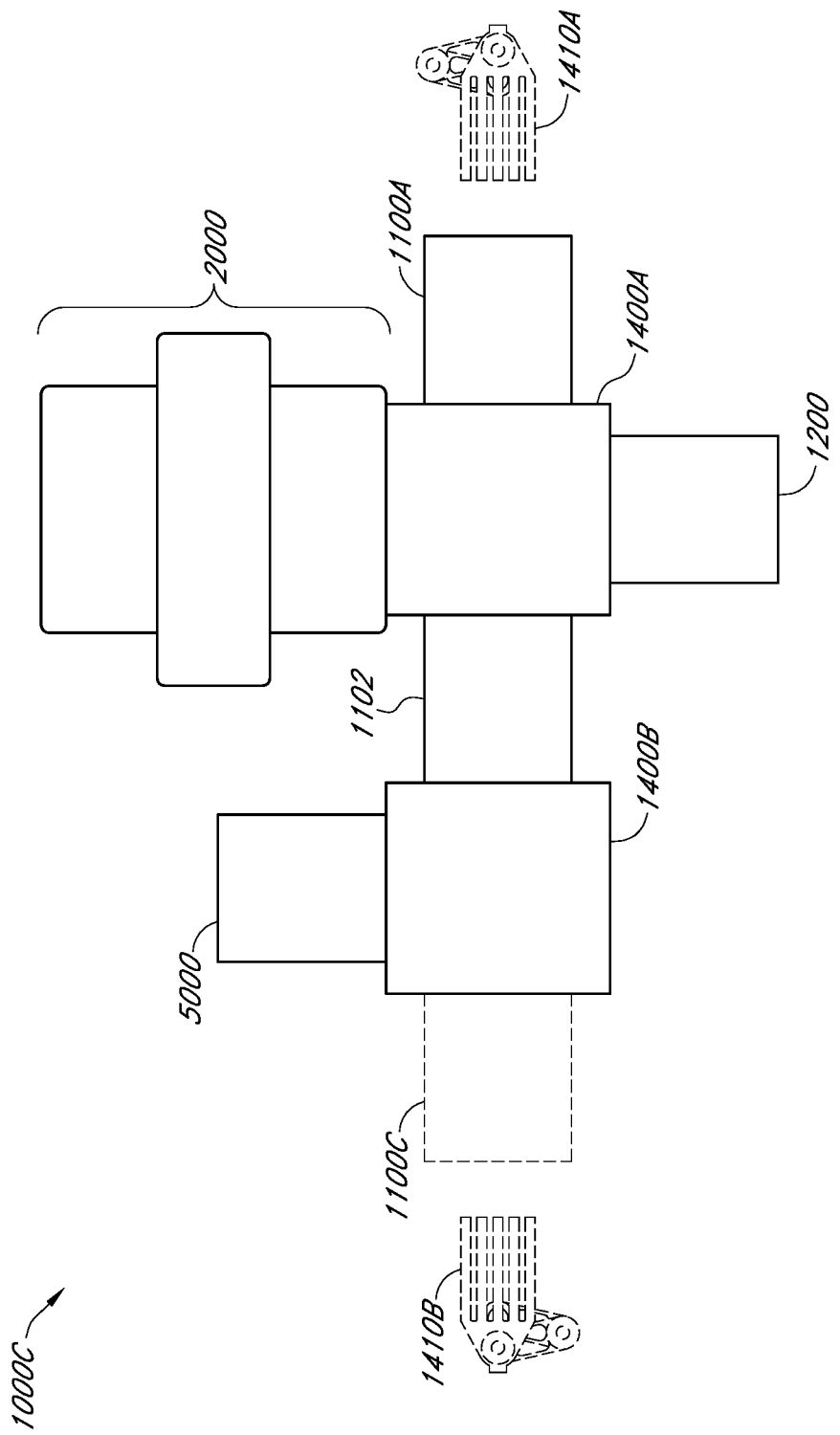
FIG. 3A illustrates generally an example of a plan view of at least a portion of a system, such as including a printing system and a thermal treatment module, that can be used in manufacturing an electronic device (e.g., an organic light emitting diode (OLED) device).
Figure 3B:
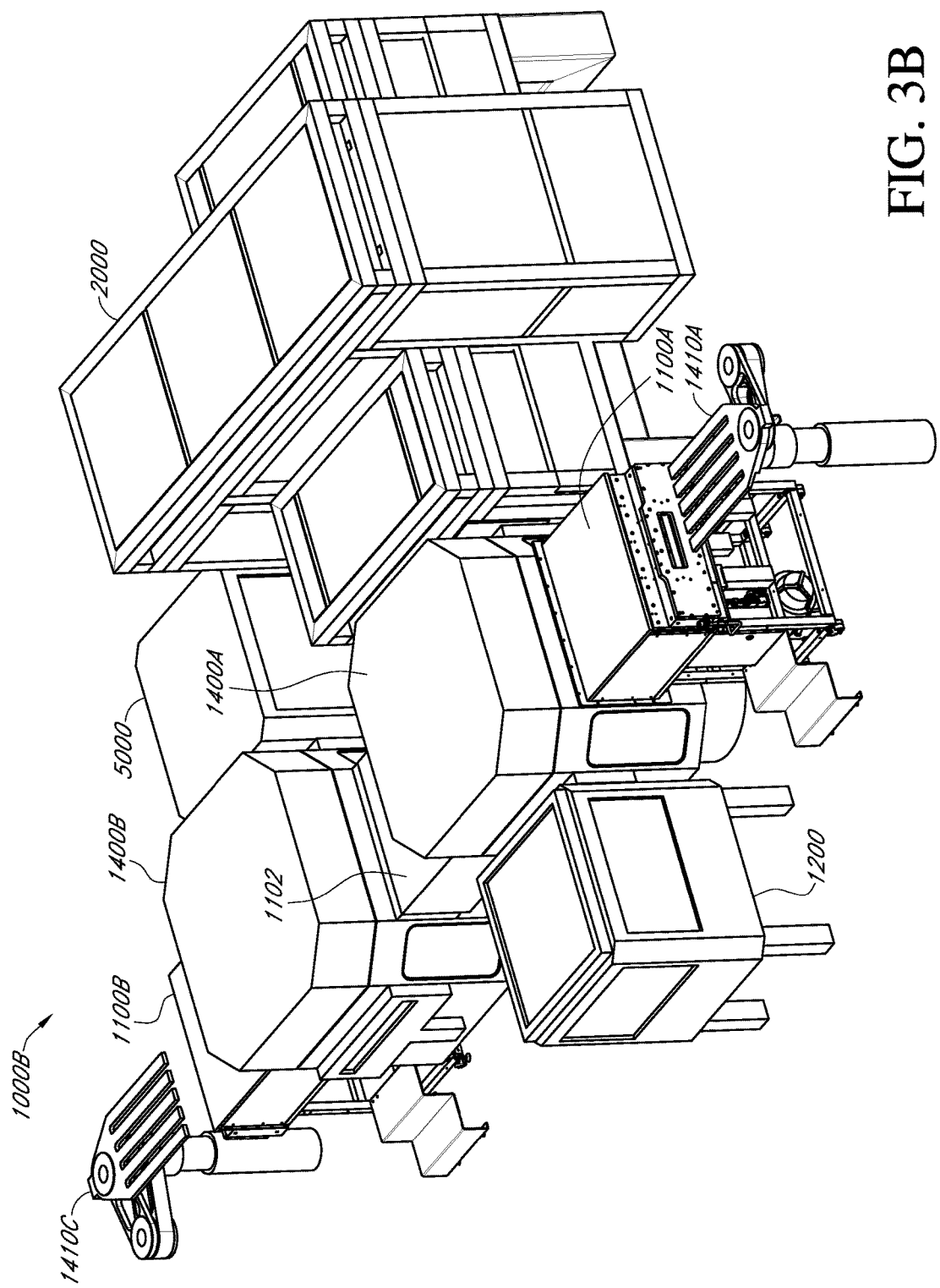
FIG. 3B illustrates generally an illustrative example of an isometric view of at least a portion of a system, such as including a printing system and a thermal treatment module, that can be used in manufacturing an electronic device (e.g., an organic light emitting diode (OLED) device).

FIG. 3A illustrates generally an example of a plan view of at least a portion of a system 1000C, and FIG. 3B illustrates generally an illustrative example of an isometric view of at least a portion of the system 1000C, such as including a printing system 2000 and a thermal treatment module 5000, that can be used in manufacturing an electronic device (e.g., an organic light emitting diode (OLED) device). The topology of the system 1000B shown in FIGS. 3A and 3B is an illustrative example of a variation on the configurations shown in FIGS. 1A and 1B or FIGS. 2A and 2B. The elements shown in the example of FIGS. 3A and 3B can be similar in function and configuration to those shown and described in FIGS. 1A and 1B or FIGS. 2A and 2B, and as described in examples elsewhere herein. In FIGS. 3A and 3B, the printing system 2000, the first transfer module 1400A, the processing module 1200, the second transfer module 1400B, and the thermal treatment module 5000 can include a controlled processing environment such as including a purified non-reactive gas specified for minimal or no reactivity with a species deposited on the substrate. In an example, the controlled processing environment can include nitrogen above atmospheric pressure. The controlled processing environment can be established to maintain an environment having less than 1000 parts-per-million of oxygen and less than 1000 parts-per-million of water vapor. The environment within each of the printing system 2000, the first transfer module 1400A, the processing module 1200, the second transfer module 1400B, and the thermal treatment module 5000 can be isolated and separately-maintained. However, because the environments in each module can be the same or substantially the same, a pass-through chamber 1102 can be used in place of the second loading module 1100B. As in the other examples above, one or more handlers such as a first handler 1410A or a second handler 1410B can be used to manipulate a substrate.

Topologies other than those illustratively shown in FIG. 1A, 1B, 2A, 2B, 3A, or 3B can be used. FIG. 4A, FIG. 4B, FIG. 4C, and FIG. 4D generally illustrate further examples of plan views of at least a portion of a system, such as including a printing system 2000 and a thermal treatment module 5000, that can be used in manufacturing an electronic device (e.g., an organic light emitting diode (OLED) device). The thermal treatment module 5000 can include a configuration as shown in the examples of FIGS. 5A, 5B, 5C, 5D or as described in other examples herein.

Figure 4A:
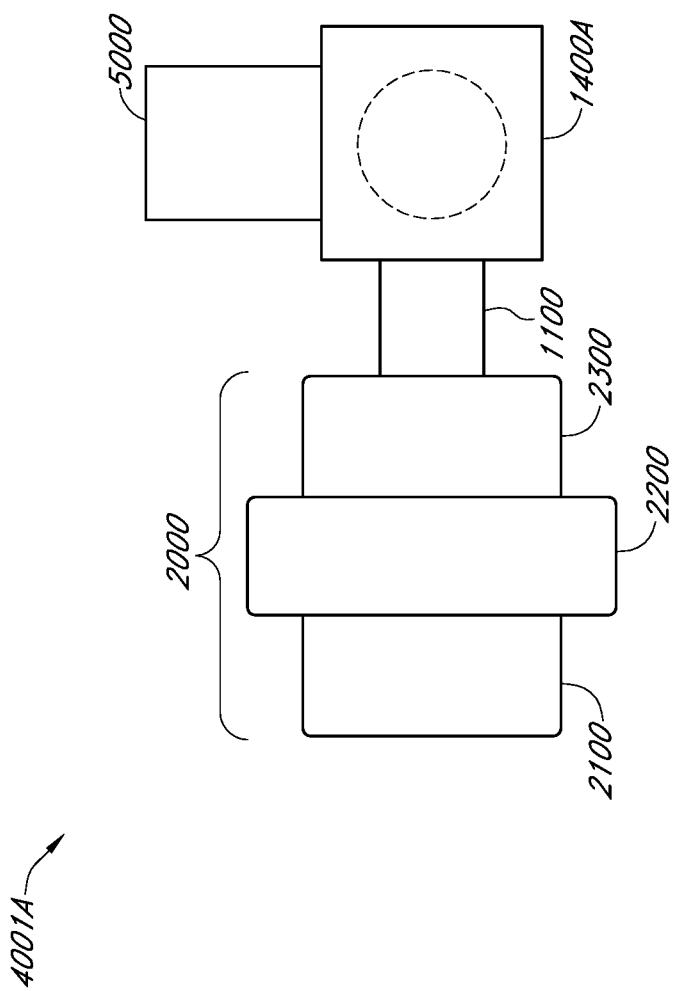
FIG. 4A, FIG. 4B, FIG. 4C, and FIG. 4D generally illustrate further examples of plan views of at least a portion of a system, such as including a printing system and a thermal treatment module, that can be used in manufacturing an electronic device (e.g., an organic light emitting diode (OLED) device).

FIG. 4A illustrates generally an example of a plan view of at least a portion of a system 4001A. The present inventors have recognized, among other things, that certain printing operations need not require a controlled environment. For example, a printing system 2000 can include an open-air configuration, or an enclosed configuration such as including particulate controls but without requiring a purified or inert gas environment. Such a printing system 2000 can include an input region 2100, a printing region 2200, and an output region 2300, such as similar to the examples described elsewhere herein.

In the example of FIG. 4A, a loading module 1100 can be used to transfer one or more substrates being fabricated from the printing system 2000 to a controlled environment (or a vacuum environment) for further processing. For example, a transfer module 1400A can be coupled to the loading module 1100, such as to manipulate a substrate for placement into a thermal treatment module 5000, or a processing module (e.g., a buffer, a vacuum chamber, or other module as mentioned in other examples). In this manner, the printing system 2000 need not (but could) use an controlled environment, and the loading module 1100 can be used to provide isolation between the environments within one or more of the transfer module 1400A, the thermal treatment module 5000, and the printing system 2000 (or environment exterior to the system 4000A).

While the printing system 2000 is shown as attached to the loading module 1100 in FIG. 4A, the printing system 2000 can be located elsewhere. For example, the loading module 1100 itself can be transportable (e.g., in a cart configuration), or the loading module 1100 can be coupled to a transfer cart to shuttle one or more substrates between the transfer module 1400A in one location and the printing system 2000 located elsewhere. In another example, the transfer module 1400A can be omitted, and the loading module 1100 can be coupled directly to the thermal treatment module 5000 (e.g., to provide a stand-alone thermal treatment module 5000). In this manner, the controlled environment of the thermal treatment module 5000 can be maintained, while substrates are transferred into or out of the controlled environment of the thermal treatment module using the loading module 1100.

Figure 4B:
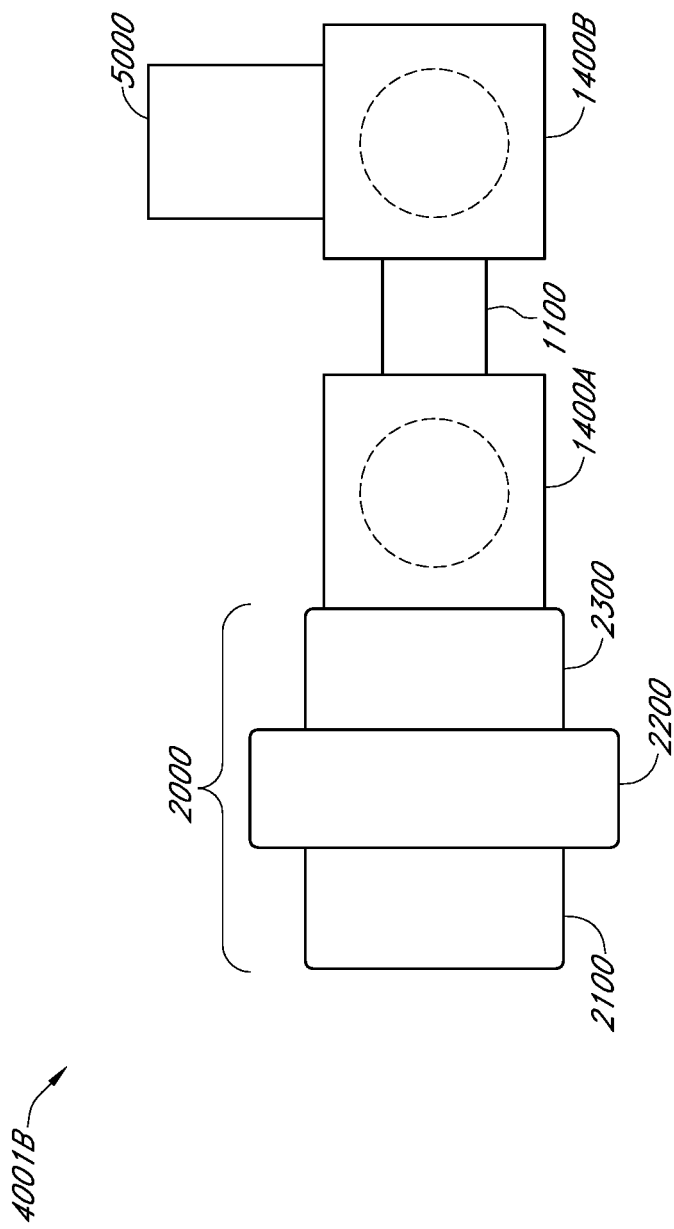

In yet another example, a system 4001B is illustrated by FIG. 4B, which is a variation on the system 4000 from FIG. 4A, here having a printing system 2000 connected to a transfer module 1400A, each of which can have a processing environment different from a controlled processing environment of the thermal treatment module 5000. The transfer module 1400B and the thermal treatment module 5000 are also provided, each of which can have a controlled internal environment, such as comprising a purified gas atmosphere. The loading module 1100 is provided between the transfer module 1400A and the transfer module 1400B. The loading module 1100 can be used for transferring substrates between the first environments of the printing system 2000 and the transfer module 1400A, and the second (e.g., different) controlled environments of the transfer module 1400B and the thermal treatment module 5000. For example, the first environment need not be a purified gas environment, and the second environment can include a purified gas environment, such as where both environments are at or near atmospheric pressure. For example, the second environment can be established at slightly above atmospheric pressure to suppress contamination of the second environment by either the first environment or the ambient environment.

Figure 4C:
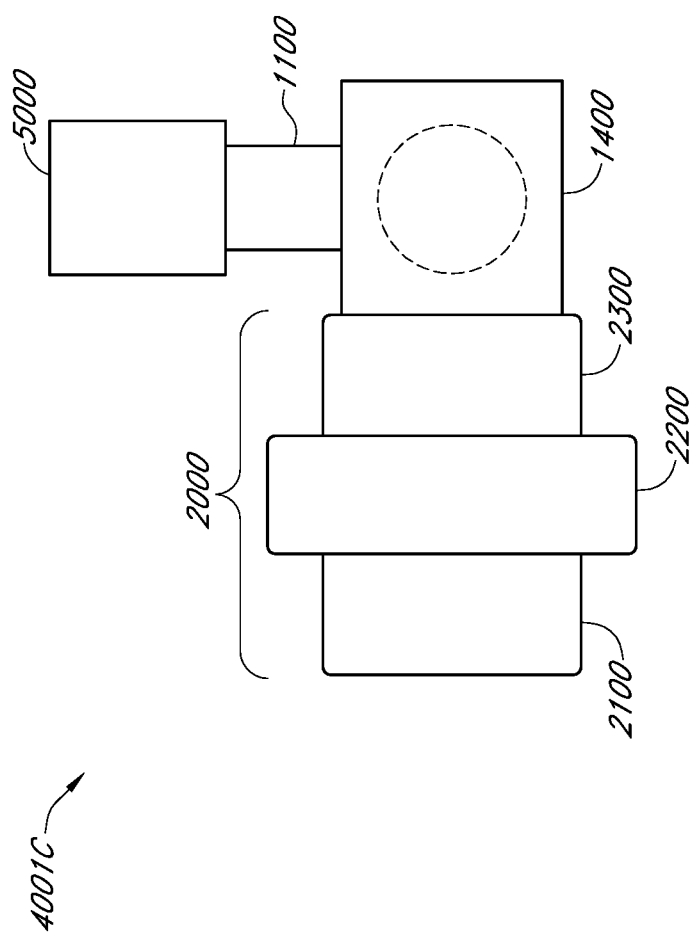

A functional difference between the examples of the systems 4001A and 4001B is the introduction of an additional transfer module to move a substrate from the printing system 2000 into the loading module 1100. And in yet another example, a system 4001C is illustrated by FIG. 4C, which is a variation on systems 4001A and 4001B of FIGS. 4A and 4B, respectively. In FIG. 4C, a printing system 2000 is connected to a transfer module 1400A, each of which can have a first environment. A thermal treatment module 5000 is also provided, which can have a controlled internal environment, such as comprising a second environment including a purified gas atmosphere. A loading module 1100 is provided between the transfer module 1400A and the thermal treatment module 5000. The loading module 1100 can be used for transferring substrates between the non-inert environments of the printing system 2000 and the transfer module 1400A, and the controlled environment of the thermal treatment module 5000.

A functional difference between the examples of systems 4001A and 4001B as compared to the example of system 4001C is the introduction of a transfer module to move substrate from the printing system 2000 into the loading module 1100 and the absence of a transfer module to move the substrate from the loading module 1100 into the thermal treatment module 5000. Many variations are possible for configuring a printing system to print a substrate in a non-inert environment and transfer a substrate to a thermal treatment module having a controlled environment such as using a loading module so as to avoid contaminating the inert thermal treatment module 5000 environment.

In addition, certain functions of modules shown to be separate modules can be combined into single modules—for example, the transfer module function and the loading function can be combined into a single module, in which case the combined module has the functionality to transfer the substrate and cycle between an controlled environment and a non-inert environment, or the transfer module and the thermal treatment module can be combined, in which case the combined module itself has the functionality to both perform the substrate processing and load/unload substrates from/to a loading/unloading station, e.g. a load-lock, or the transfer module and the printing system can be combined, in which case the combined module itself as the has the functionality to both perform the printing process on the substrate and load/unload substrate from/to a loading/unloading module (e.g., a load-lock). In another example, a thermal treatment module 5000 can comprise both heating and cooling within a single module, such as to provide for a single module that can thermally treat the substrate and then hold the substrate, similar to as described above for a holding module functioning as a cooling module.

Figure 4D:
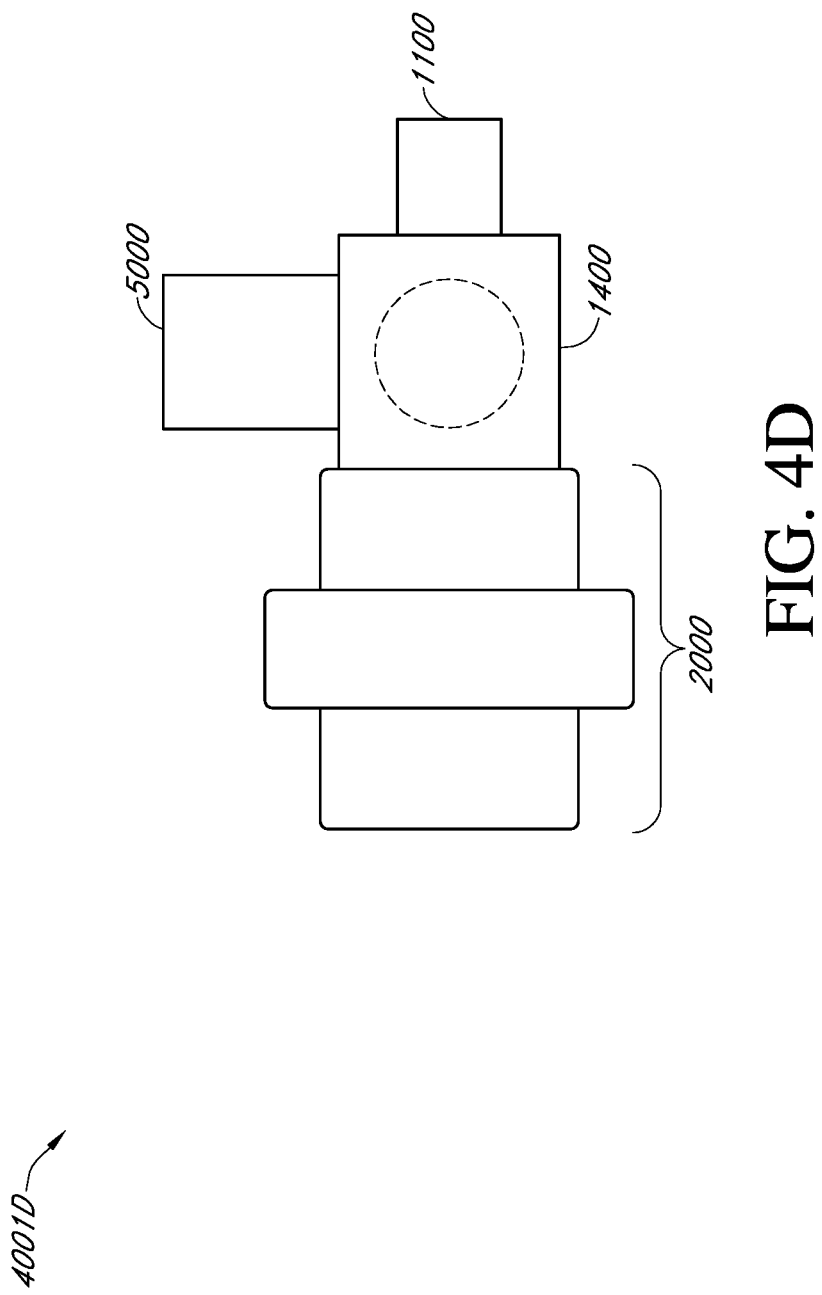

For example, FIG. 4D illustrates generally another example of a plan view of at least a portion of a system. As in the other examples herein, the system 4001D can be stand-alone, or can be integrated with other elements, such as shown in the examples elsewhere herein. System 4001D of FIG. 4D can operate in aggregate in a cluster or in-line mode. For example, in a cluster mode, substrates can be loaded and unloaded from loading module 1100. For example, in an in-line mode, substrates can be loaded into the left side of printing system 2000 and unloaded from loading module 1100.

The system 4001D can include a printing system 2000, a transfer module 1400, and a thermal treatment module 5000. As in other examples described herein, each of the printing system 2000, the transfer module, and processing module 1300 can be enclosed, such as to provide a particulate-controlled non-reactive environment at about atmospheric pressure or above atmospheric pressure (e.g., a nitrogen environment having a specified maximum level of one or more impurity species). Substrates can be transferred to or from the system 4001A such as using a loading module 1100. In this manner, respective controlled environments in one or more other portions of the system 4001A can be maintained while suppressing or reducing contamination of such controlled environments during transfer of a substrate into or out of the system 4001A. The thermal treatment module 5000 of any of the examples described above or elsewhere herein can include a configuration as shown in the examples of FIG. 5A, 5B, 5C, or 5D.

Figure 5A:
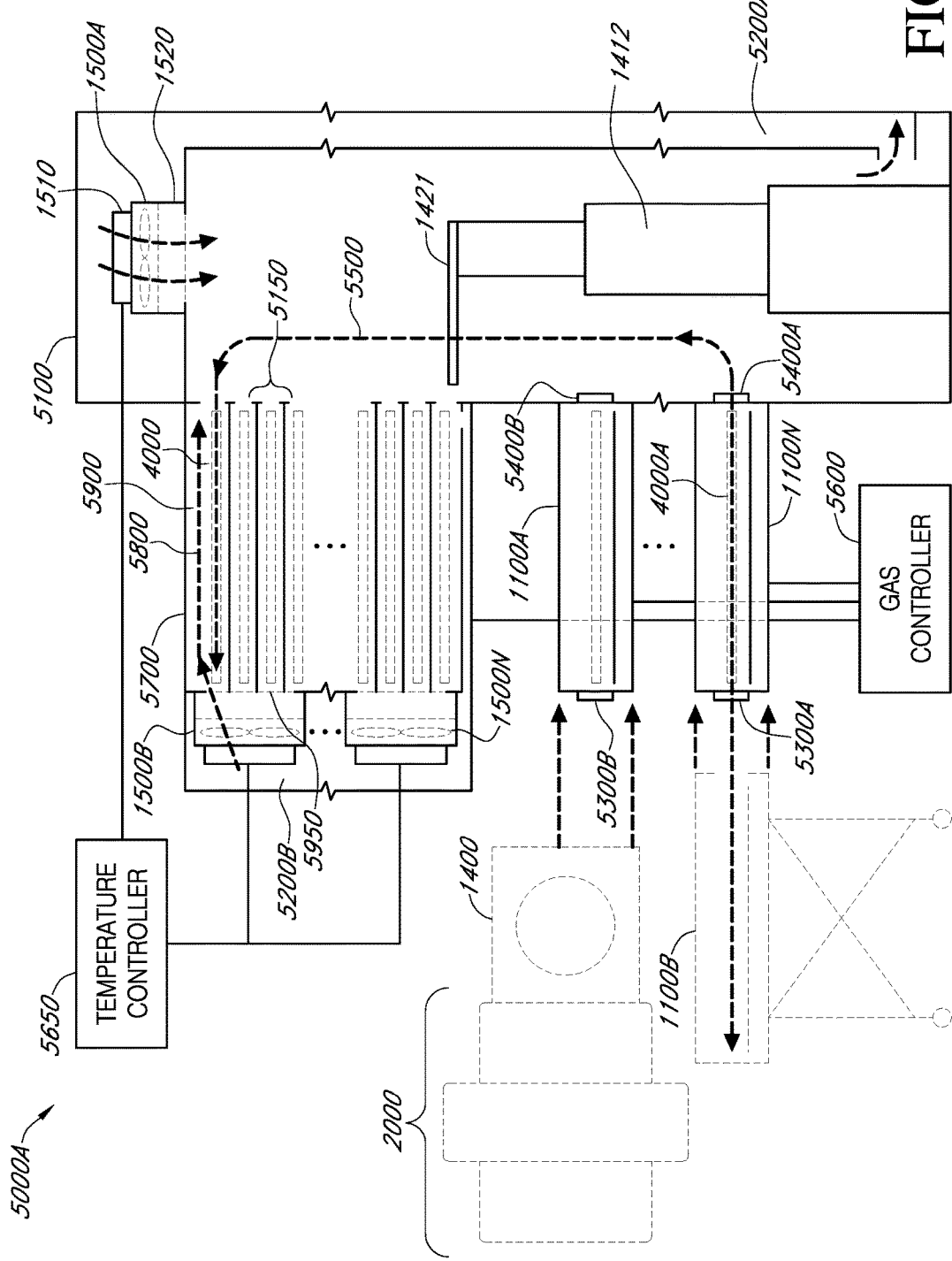
FIG. 5A, FIG. 5B, FIG. 5C, and FIG. 5D illustrate generally various examples of thermal treatment module configurations that can be used in manufacturing a light emitting device (e.g., an OLED device), such as can include a fixed stacked configuration of thermal treatment regions.

FIG. 5A illustrates generally an example of a diagram illustrating a thermal treatment module 5000A (e.g., a "stack" oven or "stacked" oven) that can be used in manufacturing a light emitting device (e.g., an OLED device), such as can include a fixed stacked configuration of thermal treatment regions.

The thermal treatment module 5000A can include a handler enclosure 5100, such as can be similar to the transfer module examples discussed elsewhere herein. The handler enclosure 5100 can include a controlled environment having a purified gas atmosphere (e.g., nitrogen) and a controlled particulate level at about atmospheric pressure, and can include a handler 1412. The handler 1412 can include an end effector 1421 such as can be used to manipulate one or more substrates such as a substrate 4000. The thermal treatment module 5000A can include an enclosure 5700 such as providing a controlled processing environment for respective thermally-controlled regions, such as including a respective thermally-controlled region 5150 (e.g., a "cell"). The respective thermally-controlled regions can be offset from each other along a specified axis of the thermal treatment module 5000A, such as vertically offset as shown in the example of FIG. 5A.

A temperature uniformity in the thermally-controlled region 5150 can be specified, such as to constrain a temperature of at least a surface of a substrate (e.g. substrate 4000) to within a specified range. In an illustrative example, such a range can be plus or minus about five percent, or about plus or minus two percent, or plus or minus one percent, of a target temperature over the substrate area. A temperature uniformity can be specified from substrate-to-substrate, such as to constrain a temperature of each of the respective substrates. In an illustrative example, such a uniformity can be specified to be within plus or minus five percent, or about plus or minus two percent, or about plus or minus one percent, of a target temperature. In holding or drying applications, where the target temperature might not be critical, temperature uniformity across a substrate can still be specified, such as to constrain a temperature of at least a surface of a substrate to be within a specified range of a central tendency (e.g., an average, a median) of a range of temperatures over the surface of the substrate. In an illustrative example, a temperature of at least a surface of a substrate can be specified to be within plus or minus five percent, or plus or minus two percent, or plus or minus one percent, of a central tendency. In an illustrative example, a specified temperature for heat treatment can be selected from a range of about 150 degrees Celsius to about 300 degrees Celsius, or from one or more other ranges.

The system 5000A can include or can be coupled to one or more loading modules (e.g., "load locks"), such as a first loading module 1100A or an "Nth" loading module 1100N. The one or more loading modules can be permanently coupled to the handler enclosure 5100 or can be detachable. A loading module can include a cart configuration (e.g., a loading module 1100B), such as can be used to transfer a substrate to or from one or more other loading modules, or to the handler enclosure 5100. The system 5000A can be coupled to a transfer module 1400, and the transfer module 1400 can be coupled to a printing system 2000, such as having a carriage including a print head configured to deposit one or more layers on the substrate 4000, as shown and described in other examples herein.

The printing system 2000 need not operate in an inert environment. For example, the loading module (e.g., loading module 1100A) can be used to transfer a substrate being fabricated from the printing system 2000, or the substrate can be transferred such as using the transfer module 1400, to a controlled environment of the handler enclosure 5100 in a manner to avoid contaminating the environment of the handler enclosure 5100, such as when the environment of the handler enclosure 5100 is different from the environment of one or more of the printing system 2000 or other modules.

For example, the one or more loading modules can include a first port (e.g., a port 5400A or a port 5400B) that can be coupled to the surrounding environment or to other apparatus. The first port 5400A or 5400B can then be closed, and a desired environment can be established within the loading module 1100A or 1100N. Then, a second port (e.g., a port 5400A or 5400B) can be opened, such as to allow the handler 1410 to access a substrate (e.g., a substrate 4000A), such as to reposition the substrate 4000A along a path 550 to a specified thermally-controlled region. The thermally-controlled regions can be individually or collectively isolated from the handler enclosure 5100. In the example of FIG. 5A, the thermally-controlled regions are not isolated from one another. Other configurations can be used, such as a configuration having individual valves or ports so that the thermally-controlled regions can be isolated from one another. One or more gas purification loops or gas control loops can be coupled to respective portions of the system 5000A, such as monitored or controlled by the gas controller 5600. Some of the controlled regions can provide thermal treatment at elevated temperatures while some of the controlled regions can be cooling stations for cooling the substrates after thermal treatment, such stations, for example, being ambient cooling stations or active cooling stations, as described previously with respect to cooling functionality in certain examples of processing module 1200.

The controlled environments of the handler enclosure 5100 or the enclosure 5700 of the thermally-controlled regions can be established at least in part using a gas purification system (e.g., a gas controller 5600), such as described in other examples herein. A temperature of one or more of the handler enclosure 5100 or the thermally-controlled regions of the enclosure 5700 can be established at least in part using a temperature controller 5650.

A temperature of a respective thermally-controlled region, such as the region 5150, can be established using a variety of techniques. For example, one or more infra-red sources can be used to irradiate the substrate 4000. Such sources could be located within the enclosure 5700, or elsewhere such as optically-coupled to the enclosure 5700 through a window or other configuration to facilitate maintenance of the infrared sources without requiring the controlled inert atmosphere within the enclosure 5700 to be disrupted. Generally, for enhanced temperature uniformity, a symmetric tray configuration can be used to mechanically support the substrate 4000 when the substrate is heated with an infrared source.

Other techniques can be used to enhance temperature uniformity. For example, any contact with the substrate can create shadow regions (when using optical heating techniques) wherein less thermal energy is provided to the substrate or thermal sinks wherein conductive heat losses are increased, and such localized changes in heating and heat sinking can adversely affect temperature uniformity. An impact from such regions can be mitigated such as by locating support pins or other contact points supporting the substrate 4000 in regions that are non-functional, such as at a perimeter of the substrate 4000, or in regions between display devices on the substrate 4000. Other techniques can be used, such as using a localized or distributed floatation support to support the substrate at least in part using gas cushion and without requiring contact of the substrate with a chuck or pins.

In an example, a hot-plate configuration can be used to provide the controlled temperature. In such a hot-plate example, a vacuum chuck configuration can be used to support the substrate. For example, the substrate can be retained by a vacuum provided by ports in the hot-plate. In an example, convection heating can be used, such as provided by one or more of a first fan-filter unit (FFU) 1500A or a second fan-filter unit (FFU) 1500B, or through another circulator or source. For example, one or more ducts such as a first duct 5200A or a second duct 5200B can be used to convey a portion of the controlled environment through the first FFU 1500A or the second FFU 1500B, or through an "Nth" FFU 1500N. The first, second or "Nth" FFUs 1500A, 1500B, or 1500N can include heating elements, heat exchangers, or can otherwise be coupled to a heat source, such as regulated by the temperature controller 5650 to provide a heated circulating gas supply having a specified temperature. One or more FFUs or other circulators, ducts, or baffles can be configured such as to minimize turbulence or otherwise provide a substantially laminar flow 5800 across a surface of the substrate 4000, such as a region 5900 above the substrate. In general, a return can be provided such as at or near the lowest point in the substrate stack, as shown in the example of FIG. 5A, or at a location laterally across from one or more FFUs, such as a continuous return illustrated generally in the example of FIG. 5B. Such lateral or downward-directed laminar flow can assist in reducing or minimizing particulate contamination of the substrates. In this manner, temperature uniformity can be enhanced while particulate contamination is suppressed, such as when convective heating is used.

One or more of the heating techniques described above can be combined. For example, to enhance temperature uniformity, a temperature of the inert gas environment can be selected to be about the same as or close to a target temperature for one or more of the thermally-controlled regions when the regions are otherwise heated using techniques other than convection (e.g., an ambient gas temperature can be specified to be close to or the same as an infrared or hot-plate heating temperature).

Figure 5B:
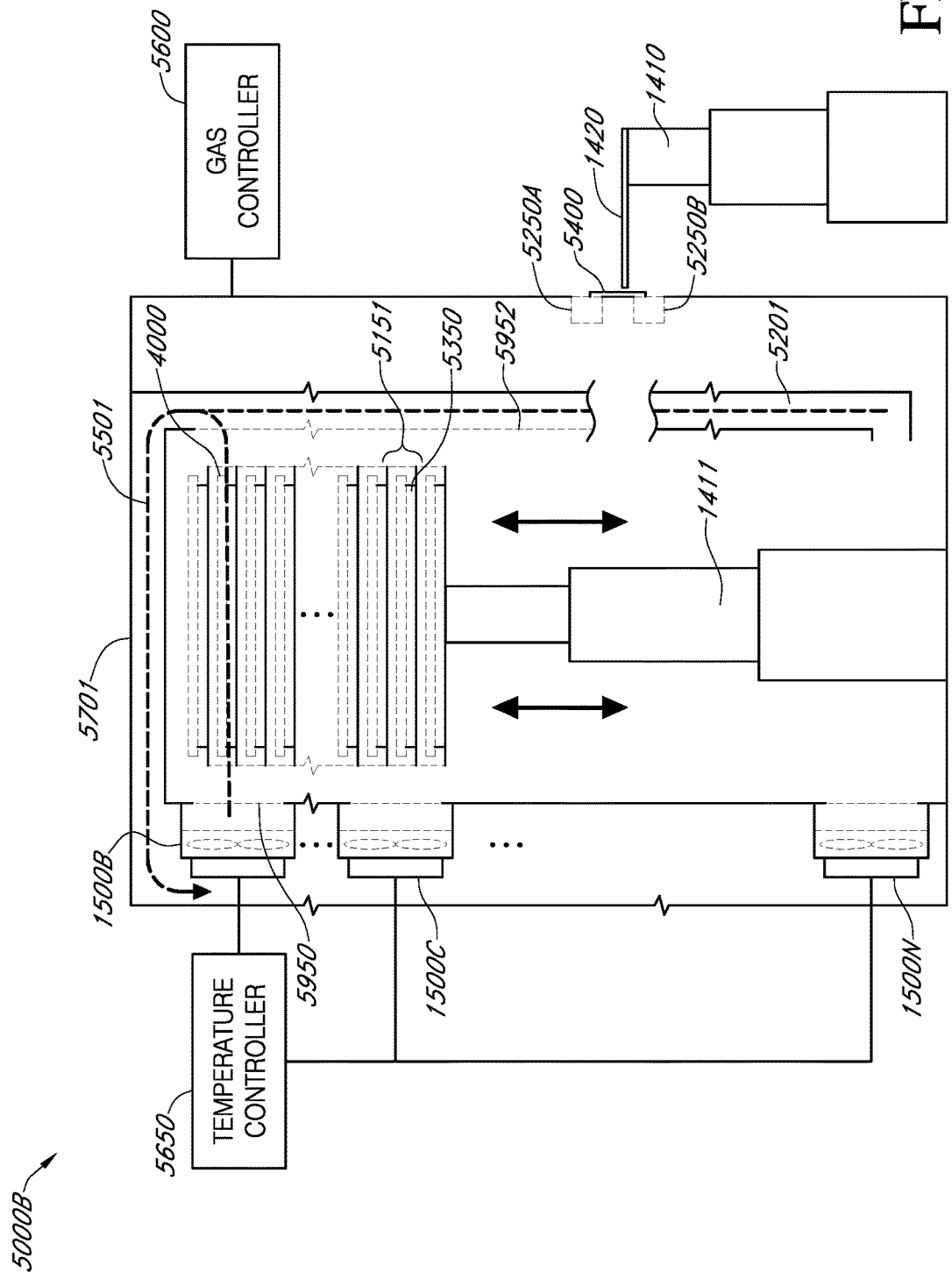

FIG. 5B illustrates generally an example of a diagram illustrating a thermal treatment module 5000B that can be used in manufacturing a light emitting device (e.g., an OLED device), such as can include a repositionable stacked configuration of thermal treatment regions.

By contrast with the example of FIG. 5A, the system 5000B can include a re-positionable stacked configuration of thermally-controlled regions located within a controlled environment of an enclosure 5701, such as re-positionable using an elevating handler 1411. A substrate 4000 can be repositioned (e.g., vertically as in the example of FIG. 5B) to permit access of a specified thermally-controlled region (e.g., a cell 5151) by a second handler 1410 including an end effector 1420, such as through a port (e.g., a gate or other configuration).

The second handler 1410 can be located in an enclosure of fabrication equipment coupled to or nearby the system 5000B, or one or more loading modules can be coupled to or included as a portion of the system 5000B as mentioned in other examples herein. In an example, first and second portions 5250A or 5250B can provide a gas curtain (e.g., a nitrogen curtain) of flowing gas to inhibit or suppress contamination of a controlled environment within the enclosure 5701 by a species from the environment outside the enclosure 5701. For example, such a curtain can inhibit or suppress ingress of oxygen or moisture to the environment of the enclosure 5701 without requiring use of a loading module.

As in the example of FIG. 5A and other examples, the controlled environment within the enclosure 5701 can include a purified gas environment established at least in part using a gas controller 5600. The gas controller 5600 can be included to monitor or control a purity level of an inert gas circulated within the enclosure. Such gas can be circulated through one or more ducts such as a duct 5201, along a path 5501, such as can be facilitated by one or more fan filter units (FFUs) 1500B, 1500C, or 1500N. As in other examples, a flow of gas across the substrate 4000 can be established to suppress turbulence or otherwise provide substantially laminar flow to enhance temperature uniformity and suppress particulate contamination. Regions 5950 (e.g., a source) and 5952 (e.g., a return) can be arranged to permit gas to be supplied or collected through vents or other apertures in portions of the interior of the enclosure 5701.

While the duct 5201 is shown as possible overlapping with a port through which the handler 1410 can access the substrates, the duct 5201 can be routed in such a way as to avoid interfering with the port (or other aperture in the enclosure 5701), while still maintaining a pathway facilitating laminar flow. Also, a flow direction along the path 5501 is illustrative and other examples need not be restricted to a left-to-right orientation as shown in FIG. 5B. For example, one or more FFUs or return assemblies can be put on the forward and back faces of the chamber (instead of the left and right sides as shown in the two-dimensional representation of FIG. 5B) such that the laminar flow is in/out of the page, avoiding any concern regarding mechanical interference with the handler 1410 during transfer of a substrate. Such a front-to-back example can also provide for a continuous inlet/outlet stream without spatial interruption, such as if there is a distributed gas return all along the length of the stack (and as might otherwise be disrupted by the presence of an access port).

As in the example of FIG. 5A, various thermal control techniques can be used, such as can include heating via one or more of convection, infrared radiation, or using a hot-plate. In an example, respective substrates such as the substrate 4000 can be supported within a thermally-controlled region (e.g., cell 5151) such as using a chuck, tray, or support frame. One or more pins, such as a pin 5350 can be configured to support or retain the substrate 4000. To facilitate handling such as by the end effector 1420, a lift pin arrangement can be used such that one or more pins are retractable or repositionable within a chuck supporting the substrate 4000. For example, the end effector 1420 can include a footprint that either includes slots or spaces such that the end effector 1420 will not interfere with the pins supporting the substrate 4000. While such chuck and lift pin examples are discussed above in the context of FIG. 5B, such examples can also be included as a portion of the system 5000A of FIG. 5A or as a portion of other examples described herein.

Figure 5C:
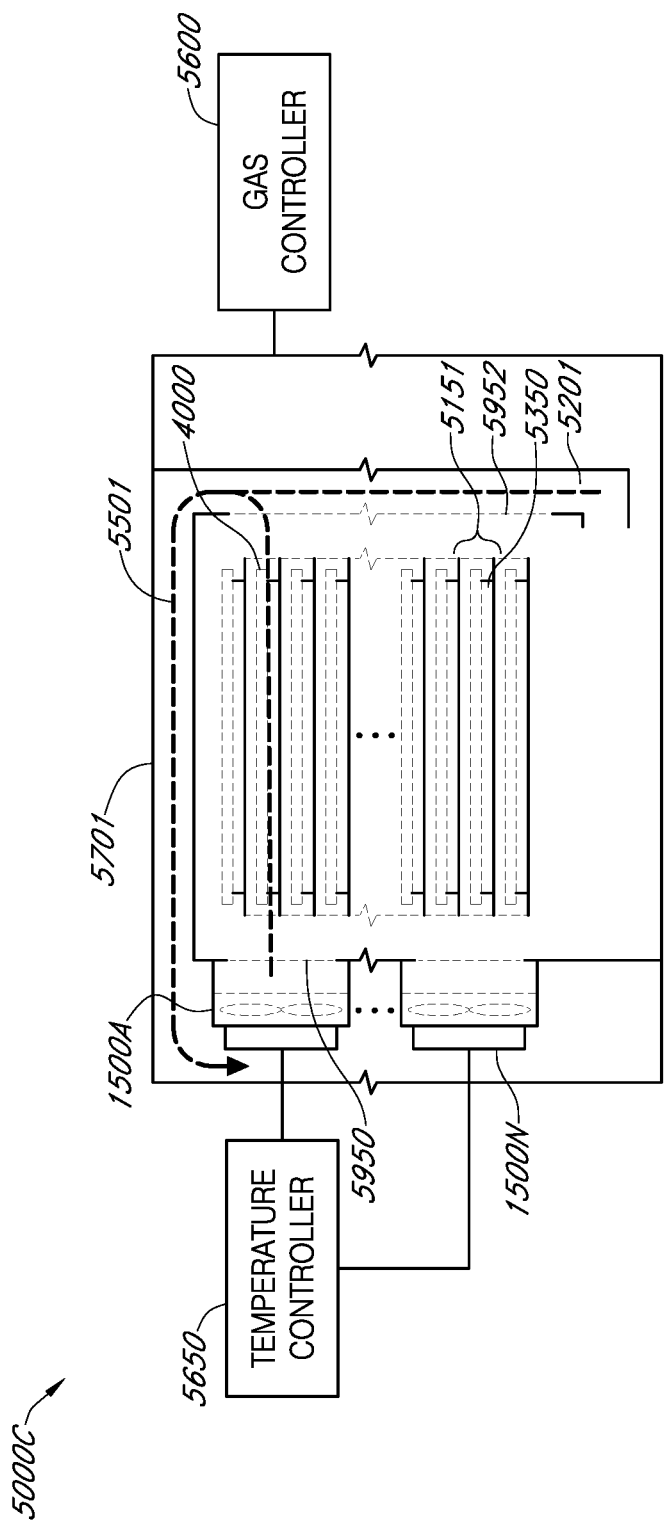
Figure 5D:
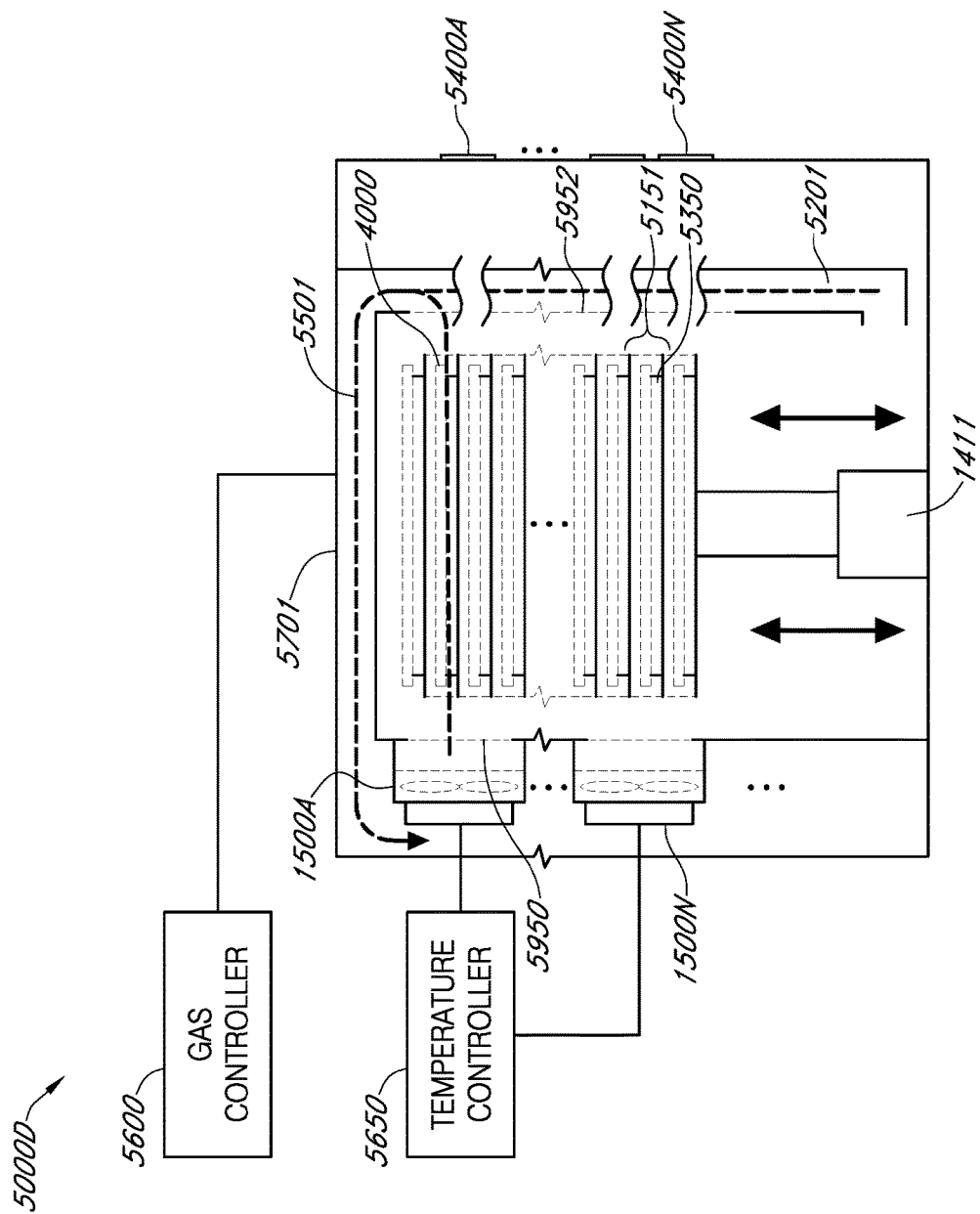

FIGS. 5C and 5D illustrate generally further examples illustrating thermal treatment modules 5000C and 5000D that can be used in manufacturing a light emitting device (e.g., an OLED device). As in the example of FIG. 5B, one or more FFUs such as a first FFU 1500A and an "Nth" FFU 1500N can be used to facilitate providing a controlled low-particle environment. For example, the controlled environment within an enclosure 5701 can include a purified gas environment established at least in part using a gas controller 5600. The gas controller 5600 can be included to monitor or control a purity level of an inert gas circulated within the enclosure. Such gas can be circulated through one or more ducts such as a duct 5201, along a path 5501, such as can be facilitated by one or more fan filter units (FFUs) 1500B, 1500C, or 1500N. As in other examples, a flow of gas across the substrate 4000 can be established to suppress turbulence or otherwise provide substantially laminar flow to enhance temperature uniformity and suppress particulate contamination. Regions 5950 (e.g., a source) and 5952 (e.g., a return) can be arranged to permit gas to be supplied or collected through vents or other apertures in portions of the interior of the enclosure 5701.

The controlled environment of the enclosure 5701 of the thermally-controlled regions can be established at least in part using a gas purification system (e.g., a gas controller 5600), such as described in other examples herein. A temperature of one or more of the handler enclosure 5100 or the thermally-controlled regions of the enclosure 5700 can be established at least in part using a temperature controller 5650. In an example, respective substrates such as the substrate 4000 can be supported within a thermally-controlled region (e.g., cell 5151) such as using a chuck, tray, or support frame. One or more pins, such as a pin 5350 can be configured to support or retain the substrate 4000.

By contrast with the examples of FIG. 5B or 5D, the example of FIG. 5C can include a static arrangement of stacked cells. Access to each of the cells can be provided by a single large gate (e.g., similar to the arrangement shown in the illustrative example of FIGS. 13A and 13B), or individual ports can be provided such as shown in the example of FIG. 5D. Locations of filter units or a heat exchanger need not be as shown in FIG. 5C or 5D, and such functions can be performed at separate locations as shown in the illustrative examples of FIGS. 13A and 13B.

FIG. 5D illustrates generally yet another variation of a thermal treatment module 5000D. In FIG. 5D, an elevating handler 1411 or other arrangement can be configured to traverse a shorter height range than shown in the illustrative example of FIG. 5B. For example, multiple ports such as a first port 5400A through an "Nth" port 5400N can be provided, such as to allow a handler external to the enclosure 5701 to access one or more respective cells in the thermal treatment module 5000D. Such ports can include one or more of a physical gate (e.g., a gate valve) or a gas curtain arrangement. In an example, respective loading modules can be coupled to each of the ports 5400A through 5400N. Such ports need not all be arranged on a single face or surface of the enclosure 5701.

The configurations of FIG. 5A, FIG. 5B, FIG. 5C, and FIG. 5D illustrate generally a stacked configuration oriented along a vertical axis. However, other configurations can be used. For example, the substrate 4000 can be rotated 90 degrees so that the stack extends horizontally rather than vertically, or in another configuration (e.g., arranged so that stack cells extend radially outward around the handler enclosure 5100). The stacks can also be angled (neither entirely vertical or horizontal). In addition, or instead, the substrates within the stack can be angled in a direction that is not perpendicular to the stacking axis (e.g. a horizontal stack can be used in which the substrates are stacked at a 30 degree downward facing tilt, so that the substrate surface is faced downward at an angle). Aspects of the examples of FIGS. 5A, 5B, 5C, and 5D can be modified or combined, and examples of FIGS. 5A, 5B, 5C, and 5D are intended to be illustrative. The mechanical configuration, controlled purified gas environment, and particulate control aspects of the thermal-treatment module 5000A of FIG. 5A, 5000B of FIG. 5B, 5000C of FIG. 5C, or 5000D of FIG. 6C can also be used for a holding module so as to provide a controlled (e.g., inert) environment for such holding functions as described above for one or more substrates when stacked in the enclosure 5700. In an example wherein the holding function includes a drying application to dry or otherwise allow an evolution of a liquid ink on the substrates, a controlled environment within the modules 5000A, 5000B, 5000C, or 5000D can include enhanced solvent or organic vapor abatement, and can include a purging capability to facilitate drying.

In the examples of FIGS. 5A, 5B, 5C, and 5D, one or more of the substrates in the thermally-controlled regions can be supported by a tray, frame, or chuck configuration, such as including one or more pins. As in other examples, the one or more pins or other mechanical support features can be located in regions at the perimeter or between display devices on the substrate. Similarly, a vacuum chuck can mechanically support the substrate. Such a vacuum chuck can be outfitted with vacuum ports and a vacuum supply, which can be turned on and off controllably, so as to provide vacuum suction to the backside of substrate during a processing operation to improve the stability of the substrate or the thermal contact between the substrate and the chuck. In an example, instead of vacuum chuck, a non-vacuum chuck is provided and the substrate can be held in place either primarily by gravity and friction, or primarily by mechanical restraint.

Figure 6A:
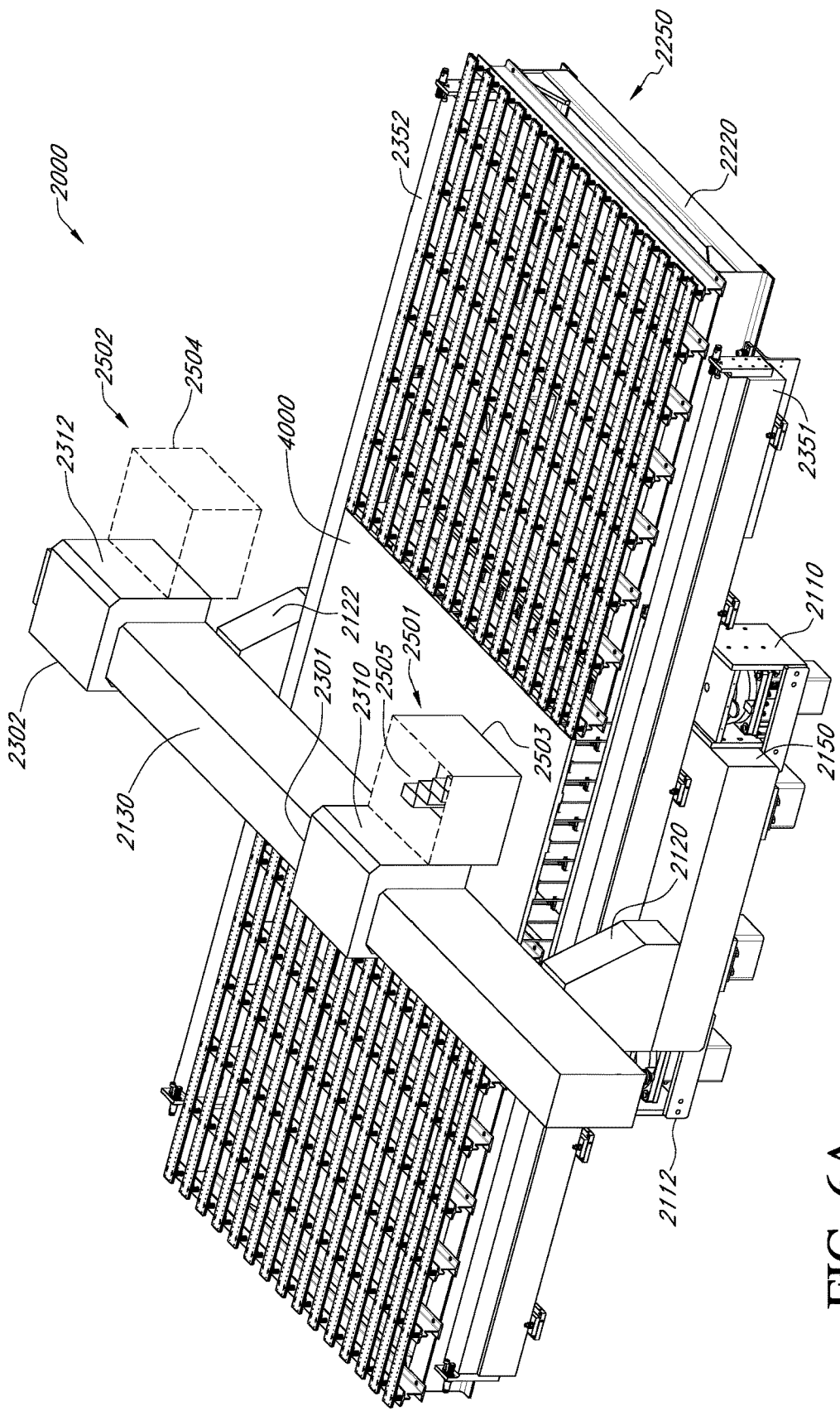
FIG. 6A and FIG. 6B illustrate generally examples of printing systems that can provide floating conveyance of a substrate.

An inkjet printing system, such as an OLED inkjet printing system 2000 of FIG. 6A can include several devices and apparatuses, which allow the reliable placement of ink drops onto specific locations on a substrate. These devices and apparatuses can include, but are not limited to, a printhead assembly, ink delivery system, a motion system for providing relative motion between a printhead assembly and a substrate, substrate support apparatus, substrate loading and unloading system, and printhead management system.

A printhead assembly can include at least one inkjet head, with at least one orifice capable of ejecting droplets of ink at a controlled rate, velocity, and size. The inkjet head is fed by an ink supply system which provides ink to the inkjet head. As shown in FIG. 6A, OLED inkjet printing system 2000 can have a substrate, such as substrate 4000, which can be supported by a substrate support apparatus, such as a chuck, for example, but not limited by, a vacuum chuck, a substrate floatation chuck having pressure ports, and a substrate floatation chuck having vacuum and pressure ports. In an example, a substrate support apparatus can be a substrate floatation table. As will be discussed in more detail subsequently herein, substrate floatation table 2250 of FIG. 10B can be used for supporting substrate 4000, and in conjunction with a Y-axis motion system, can be part of a substrate conveyance system providing for the frictionless conveyance of substrate 4000. A Y-axis motion system of the present teachings can include first Y-axis track 2351 and second Y-axis track 2352, which can include a gripper system for holding a substrate. Y-axis motion can be provided by either a linear air bearing or linear mechanical system. Substrate floatation table 2250 of OLED ink-jet printing system 2000 shown in FIG. 6A can define the travel of substrate 4000 through an enclosure assembly.

Printing involves relative motion between the printhead assembly and the substrate. This is accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. A printhead management system can include several subsystems which allow for such measurement tasks, such as the checking for nozzle firing, as well as the measurement of drop volume, velocity and trajectory from every nozzle in a printhead, and maintenance tasks, such as wiping or blotting the inkjet nozzle surface of excess ink, priming and purging a printhead by ejecting ink from an ink supply through the printhead and into a waste basin, and replacement of printheads. Given the variety of components that can comprise an OLED printing system, various embodiments of OLED printing system can have a variety of footprints and form factors.

With respect to FIG. 6A, printing system base 2150, can include first riser and second riser 2122, upon which bridge 2130 is mounted. For various embodiments of OLED printing system 2000, bridge 2130 can support first X-axis carriage assembly 2301 and second X-axis carriage assembly 2302, which can control the movement of first printhead assembly 2501 and second printhead assembly 2502, respectively across bridge 2130. For various embodiments of printing system 2000, first X-axis carriage assembly 2301 and second X-axis carriage assembly 2302 can utilize a linear air bearing motion system, which are intrinsically low-particle generating. In an example, an X-axis carriage can have a Z-axis moving plate mounted thereupon.

Figure 10A:
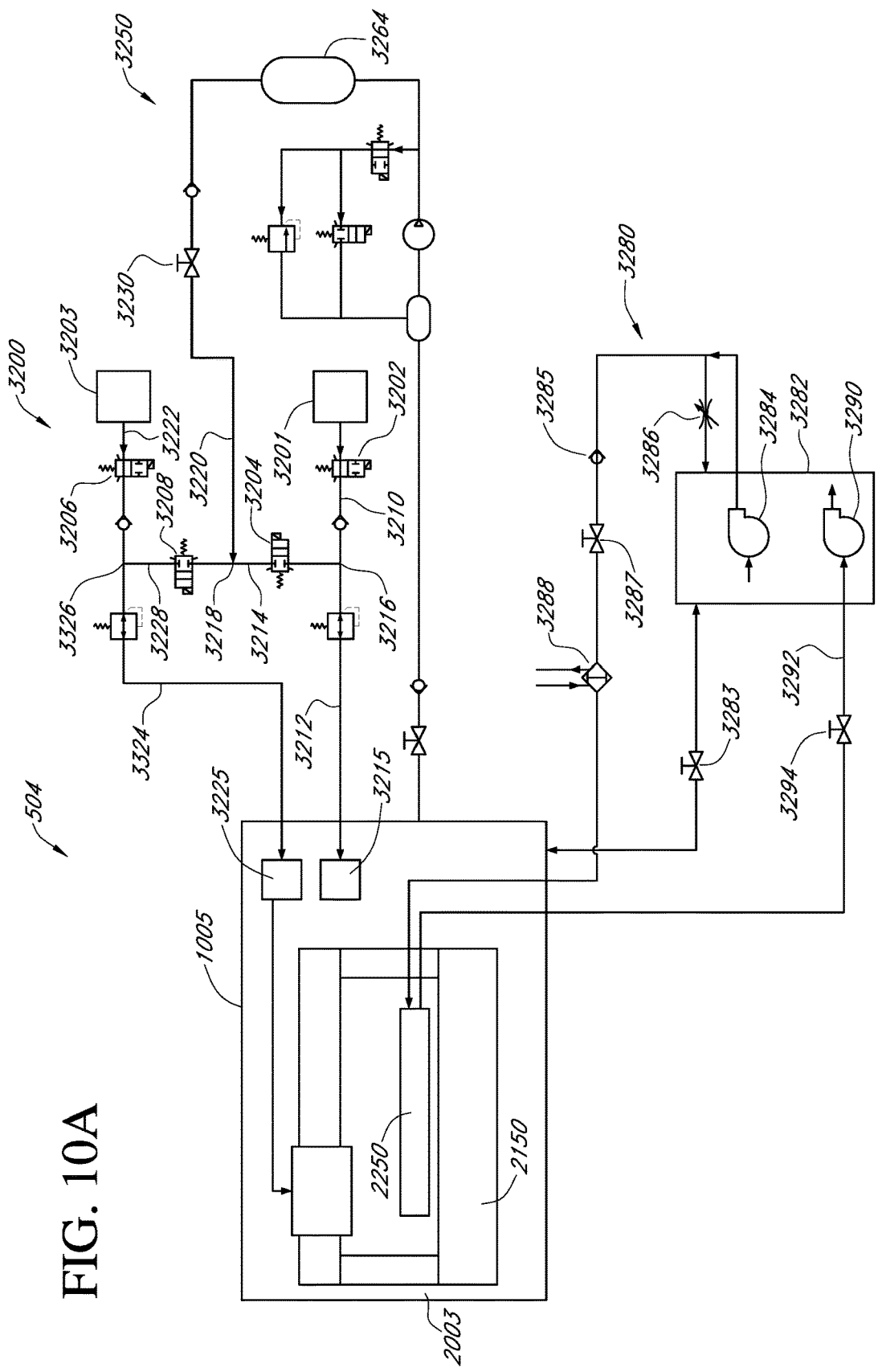
FIG. 10A and FIG. 10B illustrate generally examples of a gas enclosure system for integrating and controlling non-reactive gas and clean dry air (CDA) sources such as can be used to establish the controlled environment referred to in other examples described elsewhere herein, and such as can include a blower loop to provide, for example, pressurized gas and at least partial vacuum for use with a floatation table.
Figure 10B:
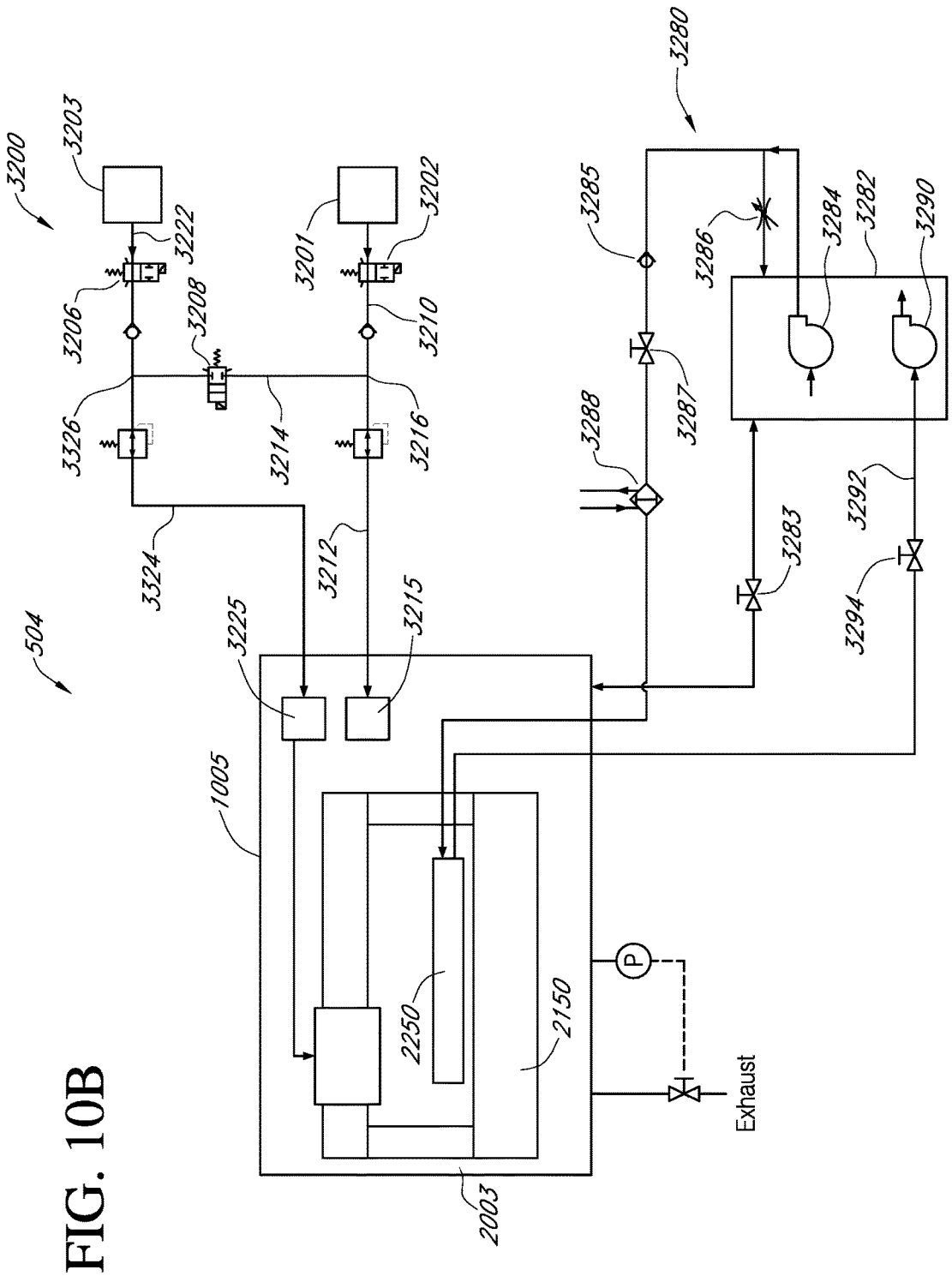

In FIG. 6A, first X-axis carriage assembly 2301 is depicted with first Z-axis moving plate 2310, while second X-axis carriage assembly 2302 is depicted with second Z-axis moving plate 2312. Though FIG. 10B depicts two carriage assemblies and two printhead assemblies, for various embodiments of OLED inkjet printing system 2000, there can be a single carriage assembly and a single printhead assembly. For example, either of first printhead assembly 2501 and second printhead assembly 2502 can be mounted on an X,Z-axis carriage assembly, while a camera system for inspecting features of substrate 4000 can be mounted on a second X,Z-axis carriage assembly. Various embodiments of OLED inkjet printing system 2000 can have a single printhead assembly, for example, either of first printhead assembly 2501 and second printhead assembly 2502 can be mounted on an X,Z-axis carriage assembly. For various embodiments of OLED inkjet printing system 2000, there can be a single printhead assembly, for example, either of first printhead assembly 2501 and second printhead assembly 2502, mounted on an X,Z-axis carriage assembly, while a heat source for curing an encapsulation layer printed on substrate 4000 can be mounted on a second carriage assembly.

In FIG. 6A, first X,Z-axis carriage assembly 2301 can be used to position first printhead assembly 2501, which can be mounted on first Z-axis moving plate 2310, over substrate 4000, which is shown supported on substrate floatation table 2250. Second X,Z-axis carriage assembly 2302 with second Z-axis moving plate 2312 can be similarly configured for controlling the X-Z axis movement of second printhead assembly 2502 relative to substrate 4000. Each printhead assembly, such as first printhead assembly 2501 and second printhead assembly 2502 of FIG. 6A, can have a plurality of printheads mounted in at least one printhead device, as depicted in partial view for first printhead assembly 2501, which depicts a plurality of printhead 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 picoliters (pL) to about 200 pL.

Figure 6B:
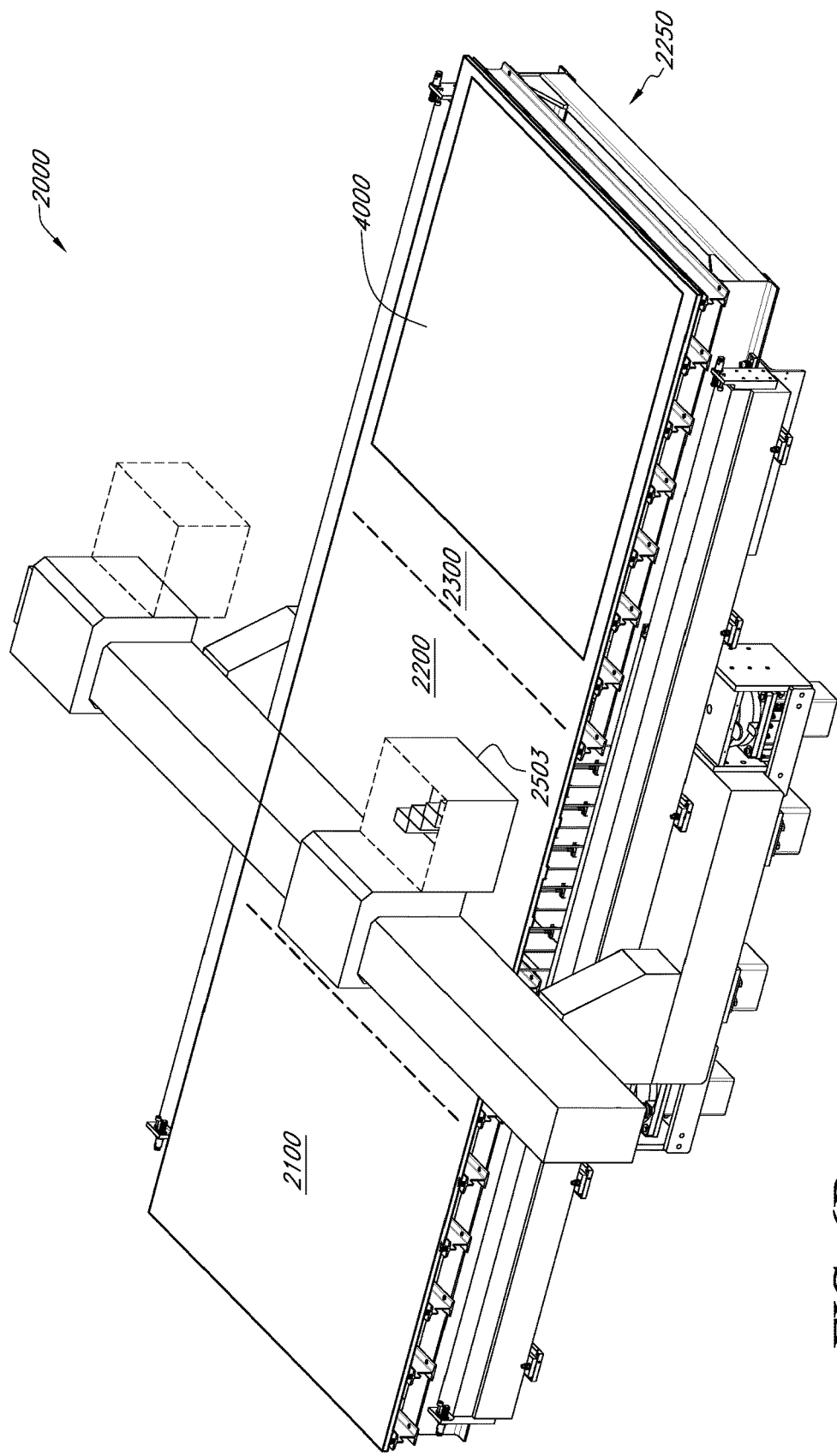

FIG. 6B illustrates generally an example that can include a floating conveyance of a substrate for a printing system 2000. FIG. 6B can include a printing system similar to the system 2000 of FIG. 6A, but instead (or in addition) having a porous medium to provide floatation. In the example of FIG. 6B, a handler or other conveyance can be used to position a substrate 4000 in an input region 2100 of a printing system 2000, such as located on a conveyor. The conveyer can position the substrate 4000 at a specified location within the printing system such as using either mechanical contact (e.g., using an array of pins, a tray, or a support frame configuration), or using gas cushion to controllably float the substrate 4000 (e.g., an "air bearing" table configuration). A printing region 2200 of the printing system 2000 can be used to controllably deposit one or more layers on the substrate 4000 during fabrication. The printing region 2200 can also be coupled to an output region 2300 of the printing system 2000. The conveyer can extend along the input region 2100, the printing region 2200, and the output region 2300 of the printing system 2000, and the substrate 4000 can be repositioned as desired for various deposition tasks, or during a single deposition operation. The controlled environments nearby the input region 2100, the printing region 2200, and the output region 2300 can be commonly-shared.

The printing region 2200 can include one or more print heads, e.g. nozzle printing, thermal jet or ink-jet type, coupled to or otherwise traversing an overhead carriage, such as configured to deposit one or more patterned organic layers on the substrate 4000 in a "face up" configuration of the substrate 4000. Such layers can include one or more of an electron injection or transport layer, a hole injection or transport layer, a blocking layer, or an emission layer, for example. Such materials can provide one or more electrically functional layers.

According to the floatation schemes shown in FIGS. 6A and 6B, in an example where the substrate 4000 is supported exclusively by the gas cushion, a combination of positive gas pressure and vacuum can be applied through the arrangement of ports or using a distributed porous medium. Such a zone having both pressure and vacuum control can effectively provide a fluidic spring between the conveyor and a substrate. A combination of positive pressure and vacuum control can provide a fluidic spring with bidirectional stiffness. The gap that exists between the substrate (e.g., substrate 4000) and a surface can be referred to as the "fly height," and such a height can be controlled or otherwise established by controlling the positive pressure and vacuum port states. In this manner, the substrate orientation can be carefully controlled in, for example, the printing region 2200. In some embodiments, mechanical retaining techniques, such as pins or a frame, can be used to restrict lateral translation of the substrate while the substrate is supported by the gas cushion. Such retaining techniques can include using spring loaded structures, such as to reduce the instantaneous forces incident the sides of the substrate while the substrate is being retained; this can be beneficial as a high force impact between a laterally translating substrate and a retaining means can cause substrate chipping or even catastrophic breakage.

Elsewhere, such as where the fly height need not be controlled precisely, pressure-only floatation zones can be provided, such as along the conveyor in the input or output regions 2100 or 2300, or elsewhere. A "transition" zone can be provided such as where a ratio of pressure to vacuum nozzles increases or decreases gradually. In an illustrative example, there can be an essentially uniform height between a pressure-vacuum zone, a transition zone, and a pressure only zone, so that within tolerances, the three zones can lie essentially in one plane. A fly height of a substrate over pressure-only zones elsewhere can be greater than the fly height of a substrate over a pressure-vacuum zone, such as in order to allow enough height so that a substrate will not collide with a floatation table in the pressure-only zones. In an illustrative example, an OLED panel substrate can have a fly height of between about 150 micrometers ($\mu$) to about 300$\mu$ above pressure-only zones, and then between about 30$\mu$ to about 50$\mu$ above a pressure-vacuum zone. In an illustrative example, one or more portions of the printing system 2000 or other fabrication apparatus can include an "air bearing" assembly provided by NewWay® Air Bearings (Aston, Pa., United States of America).

A porous medium can be used to establish a distributed pressurized gas cushion for floating conveyance or support of the substrate 4000 during one or more of printing, buffering, drying, or thermal treatment. For example, a porous medium "plate" such as coupled to or included as a portion of a conveyor can provide a "distributed" pressure to support the substrate 4000 in a manner similar to the use of individual gas ports. The use of a distributed pressurized gas cushion without using large gas port apertures can in some instances further improve uniformity and reduce or minimize the formation of mura or other visible defects, such as in those instances where the use of relatively large gas ports to create a gas cushion leads to non-uniformity, in spite of the use of a gas cushion.

A porous medium can be obtained such as from Nano TEM Co., Ltd. (Niigata, Japan), such as having physical dimensions specified to occupy an entirety of the substrate 4000, or specified regions of the substrate such as display regions or regions outside display regions. Such a porous medium can include a pore size specified to provide a desired pressurized gas flow over a specified area, while reducing or eliminating mura or other visible defect formation.

While the examples of gas pressurized support of a substrate are discussed in relation to a printing system 2000 in FIGS. 6A and 6B, such techniques can be used in addition to or instead of other support approaches, such as in relation to other examples described herein (in particular the thermal treatment modules 5000, 5000A, 5000B, 5000C, or 5000D as referred to in other examples). More specifically, a floating table can be used to support a substrate during a thermal treatment operation, for example, in a stacked configuration comprising a stack of multiple floating tables, and such a floating platform can provide for enhanced uniformity by reducing thermal non-uniformities arising from other generally-available substrate support approaches, such as approaches including support pins or vacuum chucks, without floatation.

Such enhanced uniformity can help eliminate mura or other visible defect formation arising from non-uniform heating. When utilizing a floating platform as a substrate support, a lateral retention mechanism, such as retaining pins, clamps, or suctions can prevent sliding of the substrate on the platform during the thermal treatment operation, can be provided, and lift pins can also be provided to facilitate the loading and unloading of the substrate from the platform using a substrate handler robot. To enhance efficiency, a floatation support approach can include using a recirculating gas purification system, such as shown and described in relation to one or more of FIG. 10A, 10B, or 10C.

Figure 7A:
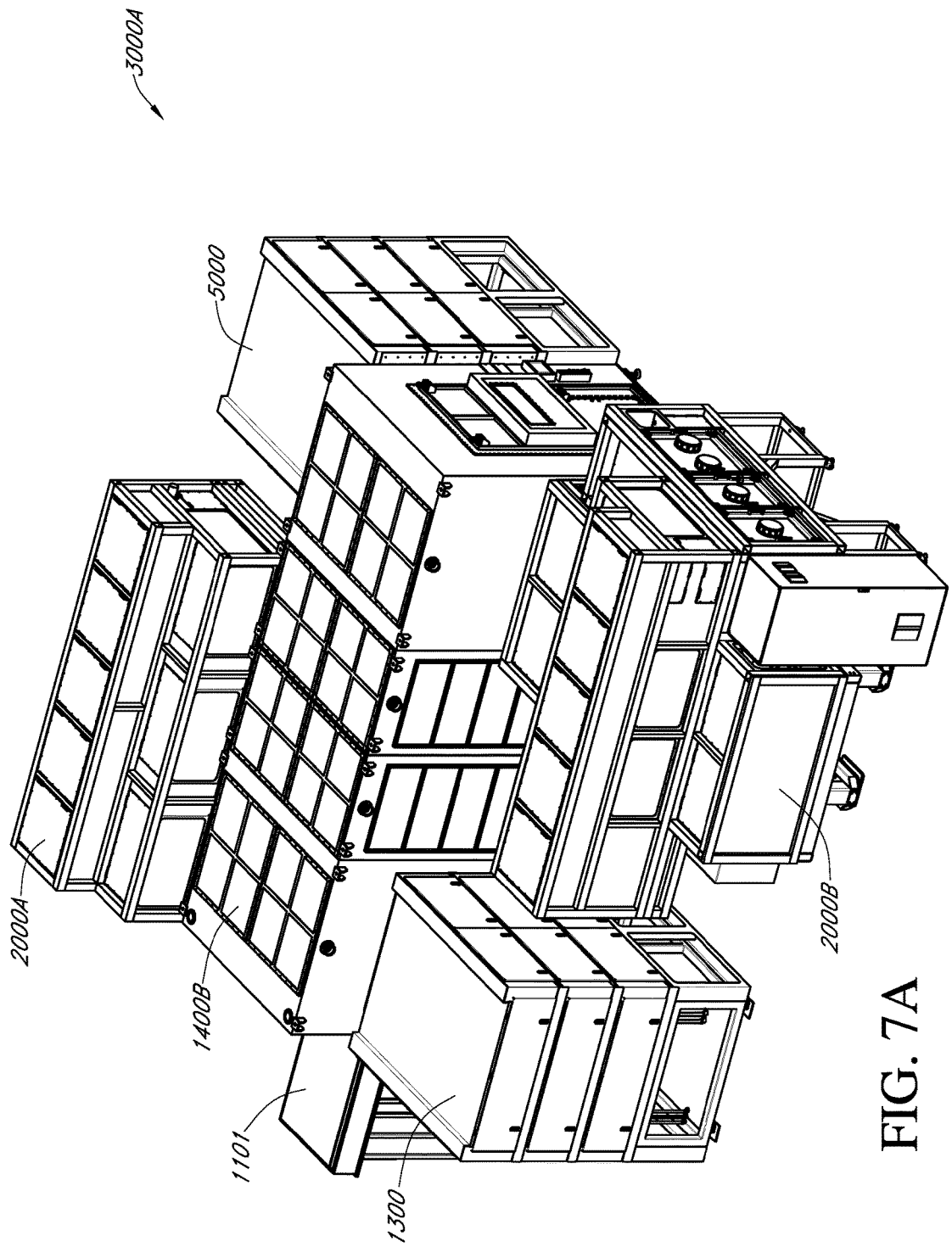
FIG. 7A illustrates generally an isometric view of at least a portion of a system, such as including a printing system and a thermal treatment module, that can be used in manufacturing an electronic device (e.g., an organic light emitting diode (OLED) device).
Figure 7B:
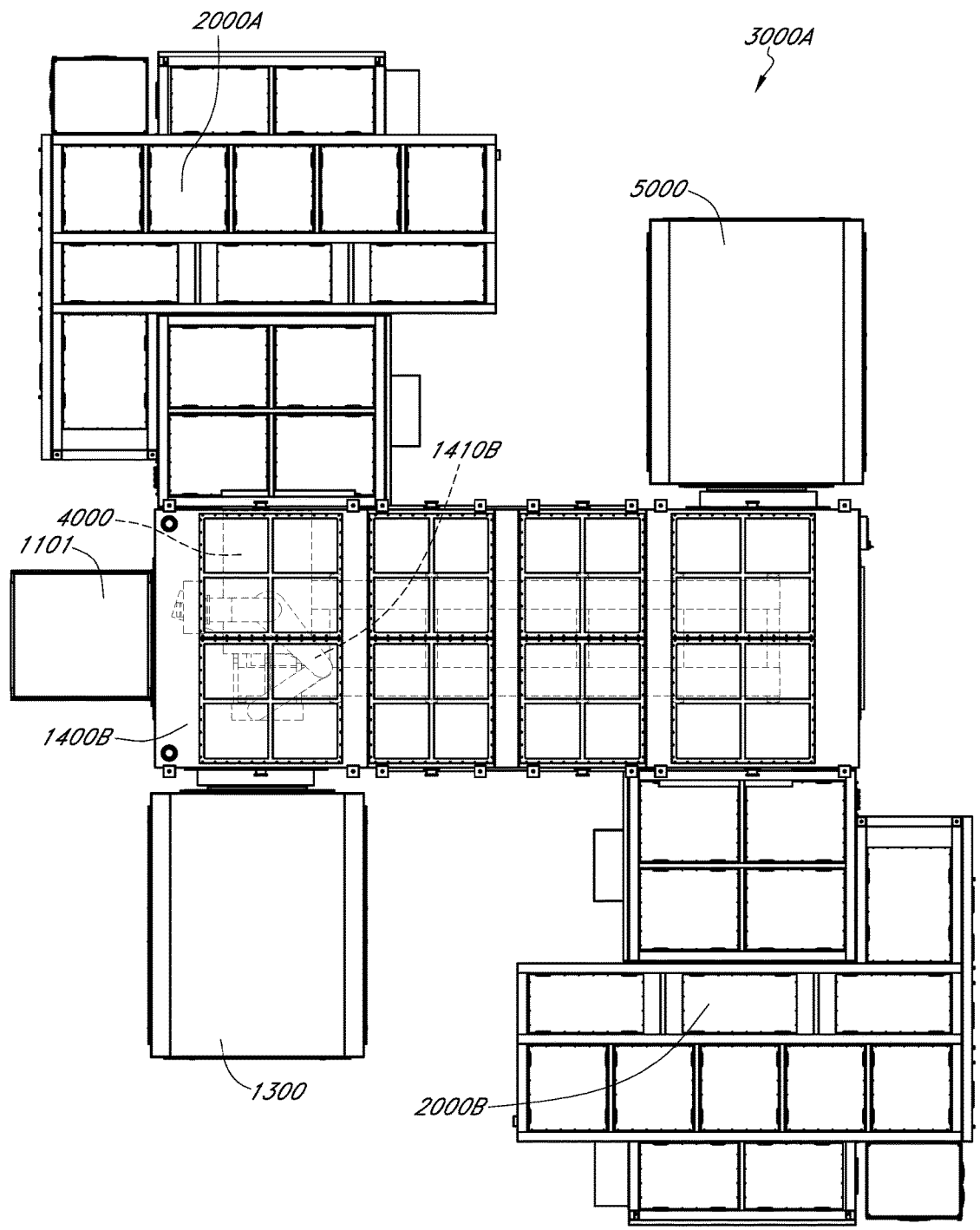
FIG. 7B illustrates generally a plan view of at least a portion of a system, such as can include a printing system and a thermal treatment module, that can be used in manufacturing an electronic device (e.g., an organic light emitting diode (OLED) device).

FIG. 7A illustrates generally an isometric view and FIG. 7B illustrates generally a plan view of at least a portion of a system 3000A, such as including a first printing system 2000A, a second printing system 2000B, and a thermal treatment module 5000, that can be used in manufacturing an electronic device (e.g., an organic light emitting diode (OLED) device).

The system 3000A can include a first printing system 2000A, such as a printing system as described in relation to other examples herein. In order to provide one or more of increased throughput, redundancy, or multiple processing operations, other printing systems can be included, such as a second printing system 2000B. The system 3000A can also include one or more other modules, such as a thermal treatment module 5000, and a processing module 1300. The processing module 1300 can be configured for holding substrates as described above, such as in a stacked configuration. Processing module 1300 could alternatively (or additionally) be configured for vacuum drying one or more substrates, such as in a stacked configuration. In the case that the processing module 1300 functions as a vacuum drying module for more than one substrate at a time, the stacked configuration may comprise multiple drying slots in a single chamber or a stack of isolated vacuum chambers, each having a single drying slot. In yet another configuration, processing module 1300 can be configured for holding substrates and another processing module can be provided attached to transfer module 1400A for vacuum drying one or more substrates. The first and second printers 2000A and 2000B can be used, for example, to deposit the same layers on the substrate or printers 2000A and 2000B can be used to deposit different layers on the substrate.

The system 3000A can include a input or output module 1101 (e.g., a "loading module"), such as can be used as a load-lock or otherwise in a manner that allows transfer of a substrate 4000 into or out of an interior of one or more chambers of the system 3000A in a manner that substantially avoids disruption of a controlled environment maintained within one or more enclosures of the system 3000A. For example, in relation to FIG. 7A and other examples described herein, "substantially avoids disruption" can refer to avoiding raising a concentration of a reactive species by more than 10 parts per million, 100 parts per million, or 1000 parts per million within the one or more enclosures during or after a transfer operation of a substrate 4000 into or out the one or more enclosures. A transfer module 1400B, such as can include a handler 1410B, can be used to manipulate the substrate 4000 before, during, or after various operations. An example of a configuration that can be used for the transfer module 1400B is shown illustratively in FIGS. 12A and 12B. One or more additional handlers can be included, such as to provide a substrate to the input or output module 1101 or receive a substrate from the input or output module 1101.

Figure 7C:
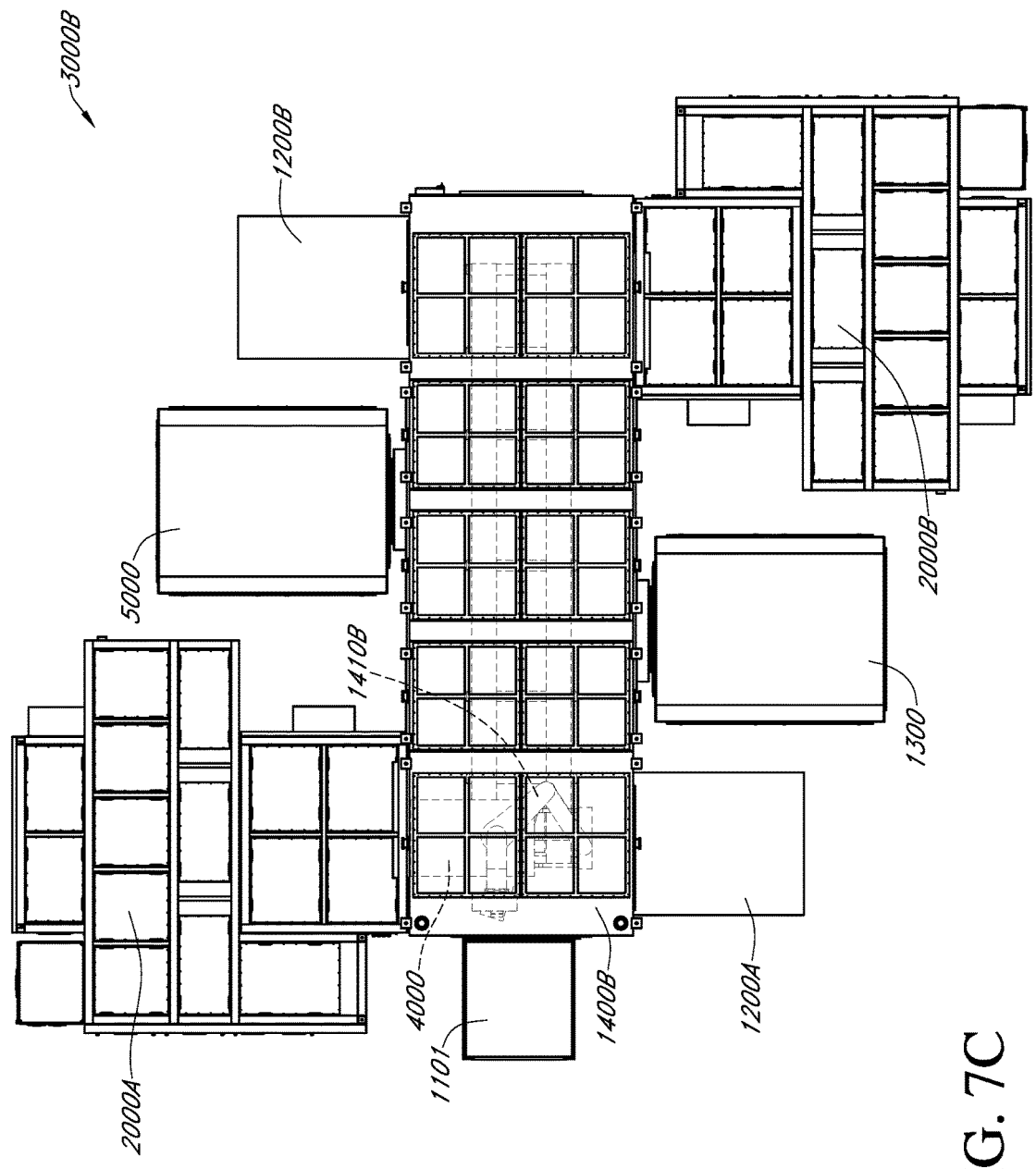
FIG. 7C illustrates generally a further example of a plan view of at least a portion of a system, such as can include a printing system and a thermal treatment module, that can be used in manufacturing an electronic device (e.g., an organic light emitting diode (OLED) device).

FIG. 7C illustrates generally a further example of a plan view of at least a portion of a system 3000B, such as can be used in manufacturing an electronic device (e.g., an organic light emitting diode (OLED) device). In FIG. 7C, first and second printing systems 2000A and 2000B can be arranged similarly to the example of FIGS. 7A, 7B (e.g., for depositing different or similar layers on a substrate). The system 3000B can include a thermal treatment module 5000, along with a processing module 1300, and additional processing modules 1200A and 1200B. For example, the processing module 1300 can include a vacuum drying module, such as configured to accommodate substrates in a stacked configuration, for example, as a stack of independent vacuum drying chambers each having a single drying slot, as a single chamber having multiple drying slots, which are all loaded and dried at once, or a stack of independent vacuum drying chambers each having one or more drying slots, and to provide vacuum pumping capability and enhanced solvent abatement or organic vapor contaminant control. The processing modules 1200A and 1200B can be configured to hold one or more substrates for any of the holding functions described elsewhere. Other arrangements are possible. For example, the examples of FIGS. 7A, 7B, and 7C illustrate generally a configuration that can include two printing systems 2000A and 2000B, but more than two printing systems can be included. Similarly, more than one thermal treatment module or additional (or fewer) processing modules can be included.

Gas circulation and filtration systems, such as described in the example of FIG. 8, 9A, 9B, 10A, 10B, or 10C can contribute to particulate control or can otherwise be included as a portion of a particulate control system such as to provide a controlled processing environment for the systems 3000A or 3000B, or other examples. A system configuration can also be established to inhibit or suppress particle generation proximal to a substrate being processed, such as during a printing process or during other processing. For example, a particle control system can include a gas circulation and filtration system in fluid communication with particle-generating components that have been contained, so that such particle-containing components can be exhausted into the gas circulation and filtration system. Particle-generating components that have been contained can be exhausted into dead spaces that inhibit distribution of the exhausted particles elsewhere within a gas enclosure system. In an example, various components can be intrinsically low-particle generating, thereby preventing particles from accumulating on a substrate during a printing process, or during other processing.

The enclosed configurations shown in examples herein, provide challenges not presented by particle reduction for processes that can be done in ambient atmospheric conditions, such as under open air, high flow laminar flow filtration hoods. Particulate control can be achieved by using various techniques, such as can include one or more of (1) elimination or reduction of space proximal to a substrate where particulate matter can collect; (2) containing and exhausting particle-generating components, such as bundles of cabling, wires and tubing, as well as various apparatuses, assemblies and systems which, for example, use components such as fans or linear motion systems that use friction bearings, within various enclosed regions discussed herein; or (3) using a variety of intrinsically low-particle generating pneumatically operated components, such as can include substrate flotation tables, air bearings, and pneumatically operated robots, or the like. In this manner, a low particle environment can be established, such as meeting International Standards Organization Standard (ISO) 14644-1: 1999, "Cleanrooms and associated controlled environments-Part 1: Classification of air cleanliness," as specified by Class 1 through Class 5.

According to various examples, a substantially low-particle environment can be established, such as providing for an average on-substrate distribution of particles of a particular size range of interest that does not exceed an on-substrate deposition rate specification. An on-substrate deposition rate specification can be set for each of a particle size range of interest of between about 0.1 micrometer (μm) and greater to about 10 μm and greater. For example, an on-substrate particle deposition rate specification can be expressed as a limit of the number of particles deposited per square meter of substrate per minute for each of a target particle size range.

An on-substrate particle deposition rate specification can be readily converted from a limit of the number of particles deposited per square meter of substrate per minute to a limit of the number of particles deposited per substrate per minute for each of a target particle size range. Such a conversion can be determined using a known relationship between substrates, for example, of a specific generation-sized substrate and the corresponding area for that substrate generation. For example, Table 1 below summarizes aspect ratios and areas for some known generation-sized substrates. It should be understood that a slight variation of aspect ratio and hence size may be seen from manufacturer to manufacturer. However, regardless of such variation, a conversion factor for a specific generation-sized substrate and an area in square meters can be obtained any of a variety of generation-sized substrates.

TABLE 1

Correlation between area and substrate size.

| Generation ID | X (mm) | Y (mm) | Area (m$^2$) |
|---|---|---|---|
| Gen 3.0 | 550 | 650 | 0.36 |
| Gen 3.5 | 610 | 720 | 0.44 |
| Gen 3.5 | 620 | 750 | 0.47 |
| Gen 4 | 680 | 880 | 0.60 |
| Gen 4 | 730 | 920 | 0.67 |
| Gen 5 | 1100 | 1250 | 1.38 |
| Gen 5 | 1100 | 1300 | 1.43 |
| Gen 5.5 | 1300 | 1500 | 1.95 |
| Gen 6 | 1500 | 1850 | 2.78 |
| Gen 7.5 | 1950 | 2250 | 4.39 |
| Gen 8 | 2160 | 2400 | 5.18 |
| Gen 8 | 2160 | 2460 | 5.31 |
| Gen 8.5 | 2200 | 2500 | 5.50 |
| Gen 9 | 2400 | 2800 | 6.72 |
| Gen 10 | 2850 | 3050 | 8.69 |

Additionally, an on-substrate particle deposition rate specification expressed as a limit of the number of particles deposited per square meter of substrate per minute can be converted to any of a variety of unit time expressions. An on-substrate particle deposition rate specification normalized to minutes can be readily converted to any other expression of time through know relationships of time, for example, but not limited by, such as second, hour, day, etc. Additionally, units of time specifically relating to processing can be used. For example, a print cycle can be associated with a unit of time. For example, a print cycle can be a duration of time specified over which a substrate is moved into a gas enclosure system for printing and then removed from a gas enclosure system after printing is complete. In another example, a print cycle can be a duration of time specified from the initiation of the alignment of a substrate with respect to a printhead assembly to the delivery of a last ejected drop of ink onto the substrate. A total average cycle time or TACT can be an expression of a unit of time for a particular process cycle or operation. In an illustrative example, TACT for a print cycle can be about 30 s, 60 s, 90 s, 120 s, or 300 s, or can include one or more other durations.

With respect to airborne particulate matter and particle deposition within a system, a substantial number of variables can impact developing a general model that may adequately determine, for example, an approximation of a value for particle fallout rate on a surface, such as a substrate, for any particular manufacturing system. Variables such as the size of particles, the distribution of particles of particular size, surface area of a substrate, and the time of exposure of a substrate within a system can vary depending on various manufacturing systems. For example, the size of particles and the distribution of particles of particular size can be substantially impacted by the source and location of particle-generating components in various manufacturing systems. In an illustrative example, on-substrate deposition of particulate matter per print cycle per square meter of substrate can be between more than about 1 million to more than about 10 million particles for particles in a size range of 0.1 μm and greater. Such determinations suggest that that without various particle control systems described herein, on-substrate deposition of particulate matter per print cycle per square meter of substrate can be between more than about 1000 to about more than about 10,000 particles for particles in a size range of about 2 μm and greater.

According to an illustrative example, an enclosure of the systems or modules described herein can maintain a low-particle environment providing for an average on-substrate particle distribution that meets an on-substrate deposition rate specification of less than or equal to about 100 particles per square meter of substrate per minute for particles greater than or equal to 10 μm in size. According to an illustrative example, an enclosure of the systems or modules described herein can maintain a low-particle environment providing for an average on-substrate particle distribution that meets an on-substrate deposition rate specification of less than or equal to about 100 particles per square meter of substrate per minute for particles greater than or equal to 5 μm in size. According to an illustrative example, an enclosure of the systems or modules described herein can maintain a low-particle environment providing for an average on-substrate particle distribution that meets an on-substrate deposition rate specification of less than or equal to about 100 particles per square meter of substrate per minute for particles greater than or equal to 2 μm in size. According to an illustrative example, an enclosure of the systems or modules described herein can maintain a low-particle environment providing for an average on-substrate particle distribution that meets an on-substrate deposition rate specification of less than or equal to about 100 particles per square meter of substrate per minute for particles greater than or equal to 1 μm in size. According to an illustrative example an enclosure of the systems or modules described herein can maintain a low-particle environment providing for an average on-substrate particle distribution that meets an on-substrate deposition rate specification of less than or equal to about 1000 particles per square meter of substrate per minute for particles greater than or equal to 0.5 μm in size. According to an illustrative example, an enclosure of the systems or modules described herein can maintain a low-particle environment providing for an average on-substrate particle distribution that meets an on-substrate deposition rate specification of less than or equal to about 1000 particles per square meter of substrate per minute for particles greater than or equal to 0.3 μm in size. According to an illustrative example, an enclosure of the systems or modules described herein can maintain a low-particle environment providing for an average on-substrate particle distribution that meets an on-substrate deposition rate specification of less than or equal to about 1000 particles per square meter of substrate per minute for particles greater than or equal to 0.1 μm in size.

As in other examples shown and described herein, one or more of the modules shown in the systems 1000A, 1000B, 1000C, 3000A, 3000B, 4001A, 4001B, 4001C, 4001D, or in other examples can include shared or dedicated gas purification and monitoring facilities, temperature control facilities, or particulate control facilities. For example, each module can include one or more gas purification loops, fan filter units, or temperature controllers. A controlled environment in a respective module can be contiguous (e.g., fluidically coupled) to an adjacent module, or the modules can include controlled environments that can be isolated from one another, such as for enhanced control of gas purity, temperature, particulate levels, or maintenance of a particular module.

For redundancy or maintenance, such as systems can include valving or gates such as to isolate an environment in one or more modules from one or more other modules, such as to facilitate maintenance of temperature control, gas purification, solvent abatement, or particulate control systems without requiring dumping or purging of the controlled environment contained in other modules, or without substantially altering an environment contained in other modules.

An environment within or surrounding the fabrication systems discussed elsewhere in this document herein can include illumination selected to avoid or suppress degradation of the materials used in fabrication or the devices being fabricated. Also, various examples described in this document can refer to gas-filled enclosures, such as providing a controlled environment having one or more of a specified temperature, impurity level, or particulate level.

According to various examples, different light sources can be used in lighting elements to illuminate interior portions of the systems shown and described herein or to illuminate other regions, such as for visualization of portions of the system by operators or machine vision systems. A number or a grouping of lighting elements can be selected in a variety of manners, for use within or surrounding the systems shown and described elsewhere herein. For example, one or more lighting elements can be mounted flat, or in an adjustable manner to provide a variety of lighting positions or illumination angles. The placement of lighting elements need not be limited to a ceiling location, and such lighting elements can be located on other interior or exterior surfaces of the systems shown and described herein.

The lighting elements can comprise any number, type, or combination of lights, for example, halogen lights, white lights, incandescent lights, arc lamps, or light emitting diodes or devices (LEDs). In an illustrative example, a lighting element can include from 1 LED to about 100 LEDs, from about 10 LEDs to about 50 LEDs, or greater than 100 LEDs. LED or other lighting devices can emit any color or combination of colors in the visible color spectrum, outside the visible color spectrum, or a combination thereof.

Some materials that can be used in OLED device fabrication, such as in a printing system, can be sensitive to some wavelengths of light. Accordingly, a wavelength of light for lighting elements installed in or used to illuminate an OLED fabrication system can be selected to suppress or eliminate material degradation during processing. For example, a 4× cool white LED can be used, as can a 4× yellow LED, or any combination thereof. An example of a 4× cool white LED can include part number LF1B-D4S-2THWW4 available from IDEC Corporation of Sunnyvale, Calif. An example of a 4× yellow LED can include part number LF1B-D4S-2SHY6, also available from IDEC Corporation. LEDs or other lighting elements can be positioned or hung from any position on any interior portion of a ceiling frame or on another surface of an OLED fabrication system. Lighting elements are not limited to LEDs, and other types of lighting elements or combinations of lighting elements can be used.

Figure 8:
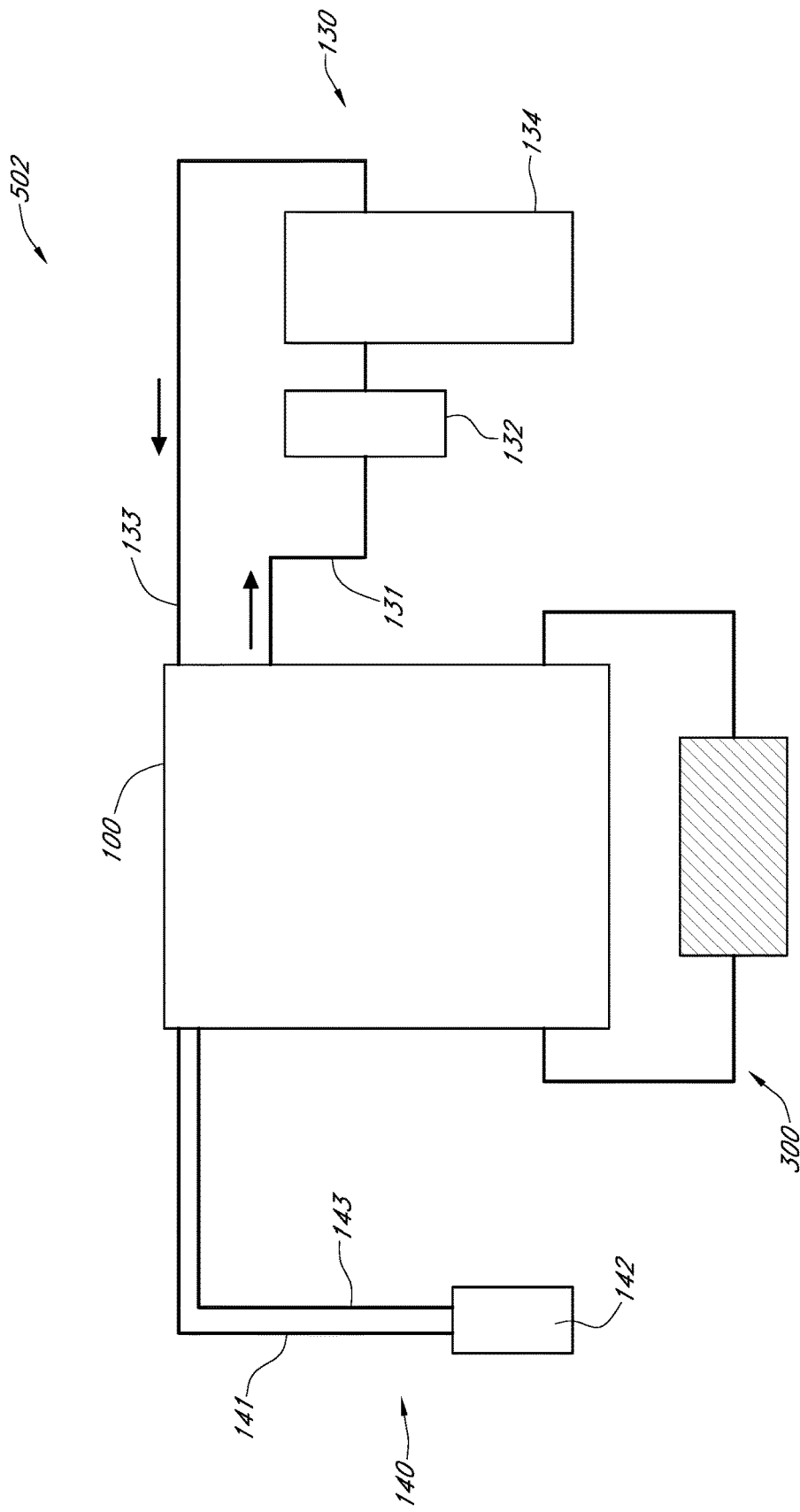
FIG. 8 illustrates generally a schematic representation of a gas purification scheme that can be used in relation to portions or entireties of one or more other examples described herein, such as to establish or maintain an controlled environment in an enclosure housing fabrication equipment used in manufacturing an electronic device (e.g., an organic light emitting diode (OLED) device).

FIG. 8 illustrates generally a schematic representation of a gas purification scheme that can be used in relation to portions or entireties of one or more other examples described herein, such as to establish or maintain an controlled environment in an enclosure housing fabrication equipment used in manufacturing an electronic device (e.g., an organic light emitting diode (OLED) device). For example, a gas enclosure system 502 can include a gas enclosure assembly 100 (e.g., an enclosure having a controlled environment), a gas purification loop 130 in fluid communication with the gas enclosure assembly 100, and a thermal regulation system 140 (e.g., as can be referred to as a temperature controller in other examples herein).

The system 502 can include a pressurized gas recirculation system 300, which can supply gas for operating various devices, such as a substrate flotation table or other pressurized-gas devices, such as for an OLED printing system. The pressurized gas recirculation system 300 can include or use a compressor, a blower, or both. Additionally, the gas enclosure system 502 can have a circulation and filtration system internal to gas enclosure system 502 (e.g., one or more fan filter units (FFUs) as described in other examples herein).

One or more ducts or baffles can separate non-reactive gas circulated through the gas purification loop 130 from the non-reactive gas that is otherwise filtered and circulated internally for various embodiments of a gas enclosure assembly. For example, the gas purification loop 130 can include an outlet line 131 from the gas enclosure assembly 100. A solvent removal component 132 can be provided, for solvent abatement, and gas to be purified can be routed from the solvent removal component 132 to a gas purification system 134. Gas purified of solvent and other reactive gas species, such as one or more of ozone, oxygen, and water vapor, can be circulated back to the gas enclosure assembly 100, such as through an inlet line 133.

The gas purification loop 130 can include appropriate conduits and connections such as to interface with monitoring or control devices. For example, ozone, oxygen, water vapor, or solvent vapor sensors can be included. A gas circulating unit, such as a fan, blower, or other arrangement, can be separately provided or integrated, for example, in gas purification system 134, such as to circulate gas through the gas purification loop 130. In the illustration of FIG. 8, the solvent removal component 132 and gas purification system 134 are shown as separate units. However, the solvent removal component 132 and gas purification system 134 can be housed together as a single unit.

The gas purification loop 130 of FIG. 8 can have solvent removal component 132 placed upstream of gas purification system 134, so that gas circulated from gas enclosure assembly 100 can pass through solvent removal component 132, such as via an outlet line 131. In an example, the solvent removal component 132 can include a solvent trapping system based on adsorbing solvent vapor from a gas passing through the solvent removal component 132. For example, a bed or beds of a sorbent, such as activated charcoal, molecular sieves, or the like, can effectively remove a wide variety of organic solvent vapors. In another example, a cold trap technology can be used to remove solvent vapors as a portion of the solvent removal component 132. Sensors, such as ozone, oxygen, water vapor and solvent vapor sensors, can be used to monitor the removal of such species from gas continuously circulating through a gas enclosure system, such as gas enclosure system 502. For example, Information obtained from such sensors or other devices can indicate when sorbent, such as activated carbon, molecular sieves, or the like, have reached capacity or have otherwise become less effective, so that the bed or beds of sorbent can be regenerated or replaced, for example.

Regeneration of a molecular sieve can involve heating the molecular sieve, contacting the molecular sieve with a forming gas, a combination thereof, or the like. For example, molecular sieves configured to trap various species, including ozone, oxygen, water vapor, or solvents, can be regenerated by heating and exposure to a forming gas. In an illustrative example, such a forming gas can include hydrogen, for example, a forming gas comprising about 96% nitrogen and about 4% hydrogen, with said percentages being by volume or by weight. Physical regeneration of activated charcoal can be done using a procedure of heating under a controlled environment.

A portion of the gas purification system 134 of the gas purification loop 130 can include systems available, for example, from MBRAUN Inc., of Statham, N.H., or Innovative Technology of Amesbury, Mass. The gas purification system 134 can be used to purify one or more gases in gas enclosure system 502, for example, to purify the entire gas atmosphere within a gas enclosure assembly. As mention above, in order to circulate gas through gas purification loop 130, the gas purification system 134 can have a gas circulating unit, such as a fan or blower, for example. A gas purification system can be selected or configured depending on the volume of the enclosure, which can define a volumetric flow rate for moving a non-reactive gas through a gas purification system. In an illustrative example, a gas enclosure system having a gas enclosure assembly can include a volume of about 4 cubic meters and a gas purification system that can move about 84 cubic meters per hour can be used. In another illustrative example, a gas enclosure system having a gas enclosure assembly can include a volume of about 10 cubic meters and a gas purification system that can move about 155 cubic meters per hour can be used. In yet another illustrative example, a gas enclosure assembly having a volume of between about 52 to about 114 cubic meters, more than one gas purification system can be used.

Gas filters, dryers, or other purifying devices can be included in the gas purification system 134. For example, a gas purification system 134 can include two or more purifying devices, such as in a parallel configuration or otherwise arranged such that one of the devices can be taken off line for maintenance and one or more other devices can be used to continue system operation without interruption. For example, the gas purification system 134 can comprise one or more molecular sieves, such as at least a first molecular sieve and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously mentioned, molecular sieves can be regenerated and reused.

The thermal regulation system 140 of FIG. 8 can include at least one chiller 142, which can have a fluid outlet line 141 for circulating a coolant into a gas enclosure assembly, and fluid inlet line 143 for returning the coolant to the chiller. An at least one fluid chiller 142 can be provided for cooling the gas atmosphere within gas enclosure system 502. For example, the fluid chiller 142 can deliver cooled fluid to heat exchangers within the enclosure, where gas can be passed over a filtration system internal the enclosure. At least one fluid chiller can also be provided with gas enclosure system 502 to cool heat evolving from an apparatus enclosed within gas enclosure system 502. In an illustrative example, a fluid chiller can also be provided for gas enclosure system 502 to cool heat evolving from an OLED printing system. The thermal regulation system 140 can include heat-exchange or Peltier devices and can have various cooling capacities. For example, a chiller can provide a cooling capacity of from between about 2 kilowatts (kW) to about 20 kW of capacity. According to various examples, the gas enclosure system 502 can have a plurality of fluid chillers that can chill one or more fluids. A fluid chiller can use various fluids as a heat transfer medium, for example, such as water, anti-freeze, a refrigerant, or combination thereof. Leak-free, locking connections can be used in connecting the associated conduits and system components.

While the examples above mentioning cooling capacities and chilling applications, the examples above can also be applied to applications where including buffering of substrates in a controlled environment, or for applications where circulating gas can be maintained at a temperature similar to other portions of the system, such as to avoid unwanted heat transfer from substrates being fabricated or to avoid disruption of temperature uniformity across a substrate or between substrates.

Figure 9A:
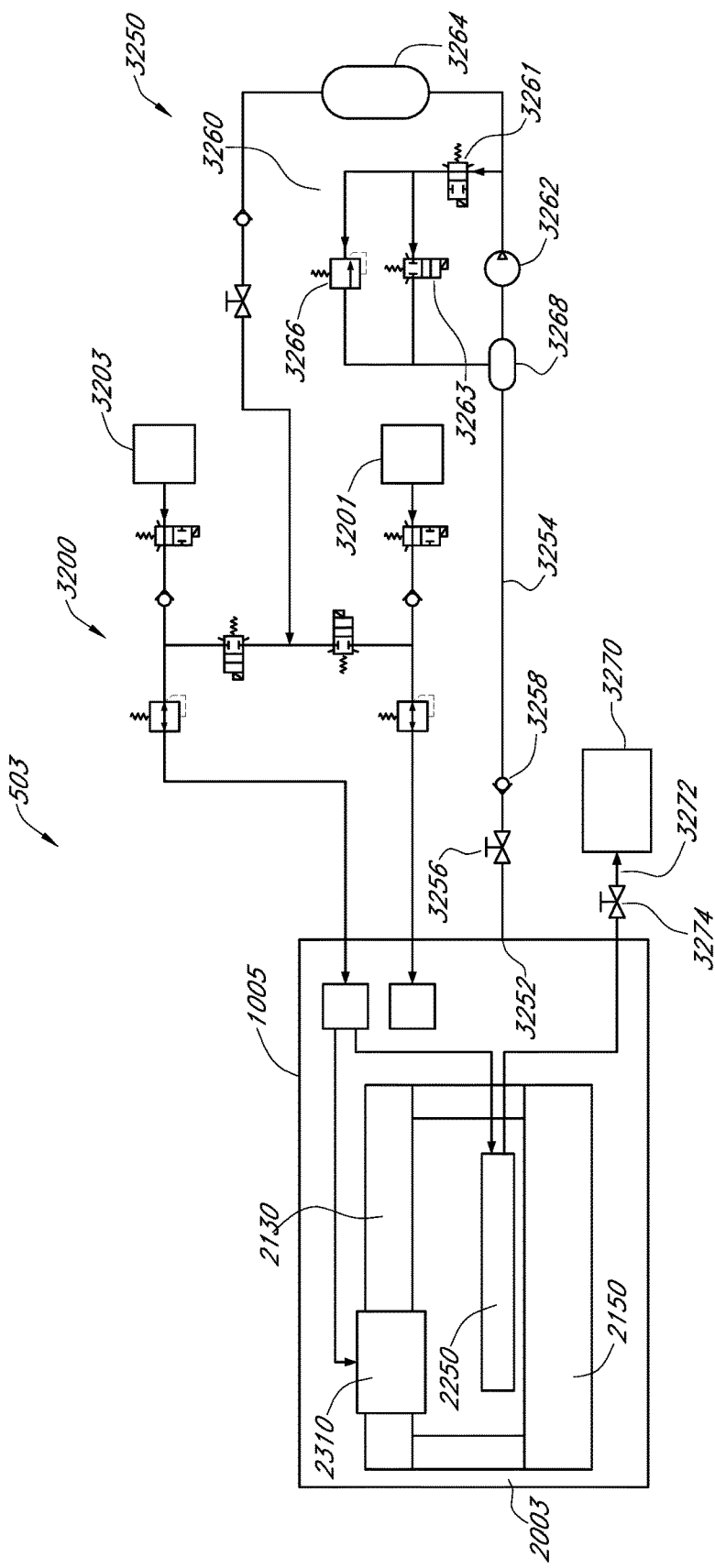
FIG. 9A and FIG. 9B illustrate generally examples of a gas enclosure system for integrating and controlling non-reactive gas and clean dry air (CDA) sources such as can be used to establish the controlled environment referred to in other examples described elsewhere herein, and such as can include a supply of pressurized gas for use with a floatation table.
Figure 9B:
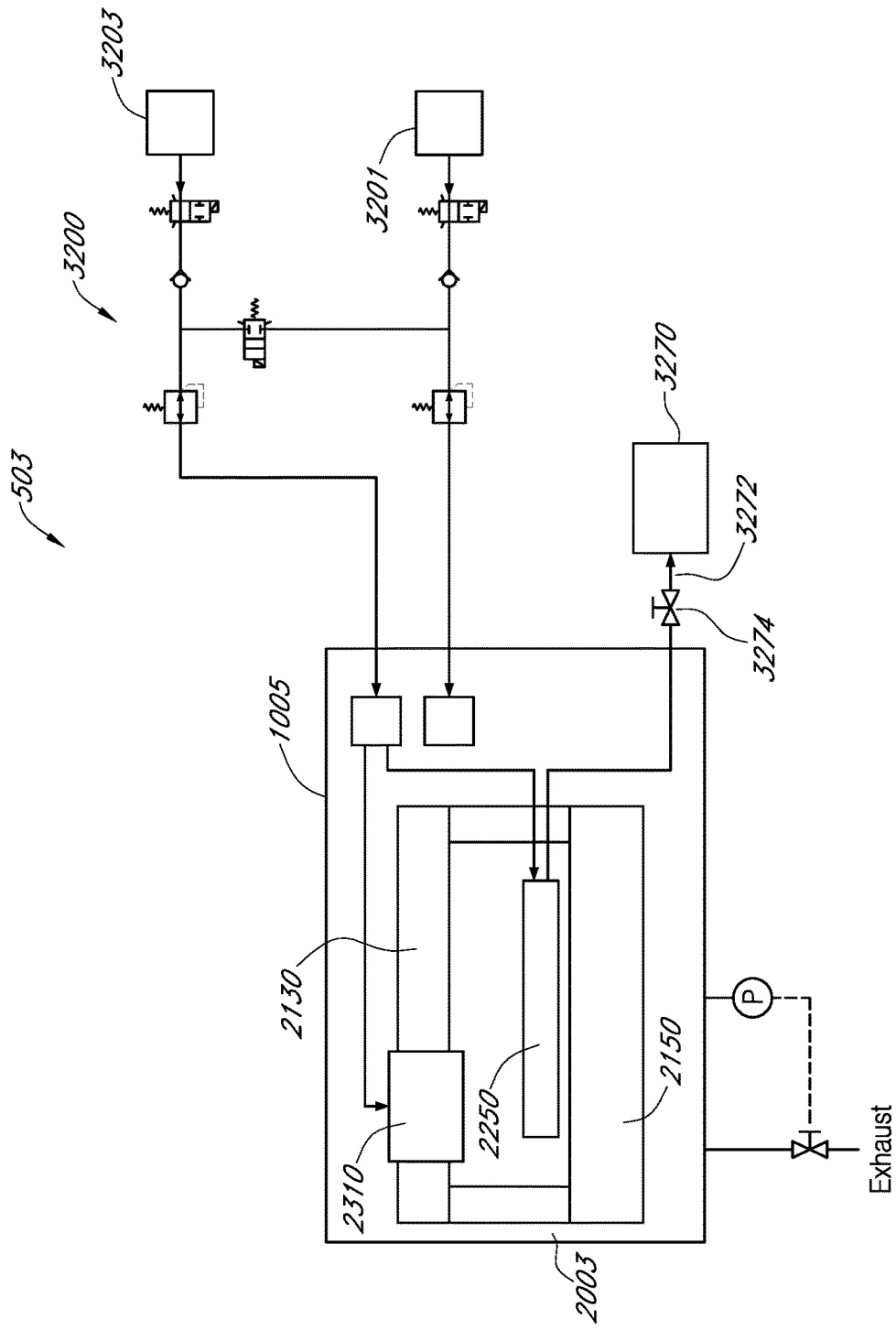
Figure 10C:
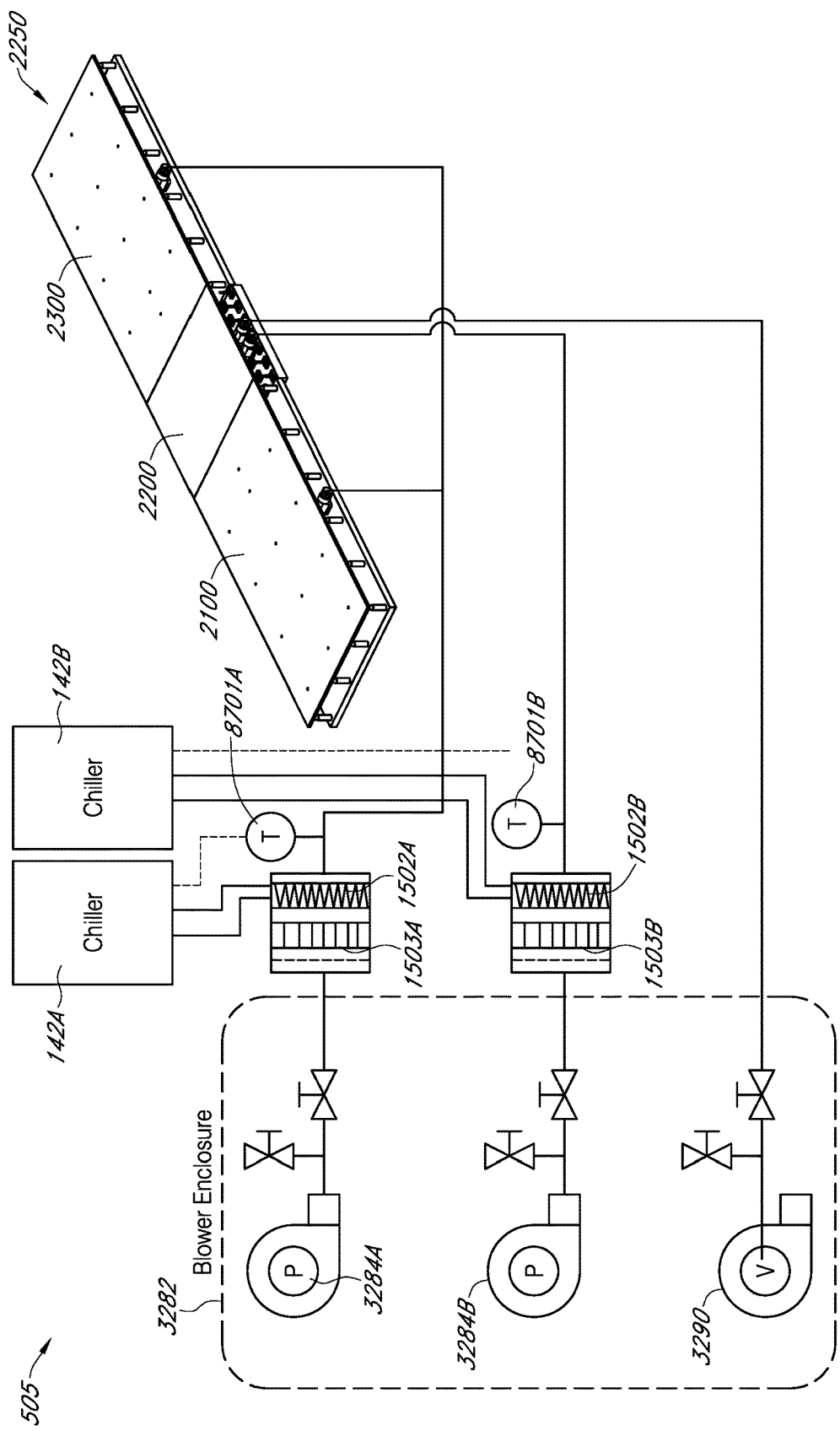
FIG. 10C illustrates generally a further example of a system for integrating and controlling one or more gas or air sources, such as to establish floatation control zones included as a portion of a floatation conveyance system.

FIGS. 9A and 9B illustrate generally examples of a gas enclosure system for integrating and controlling non-reactive gas and clean dry air (CDA) sources such as can be used to establish the controlled environment referred to in other examples described elsewhere herein, and such as can include a supply of pressurized gas for use with a floatation table. FIGS. 10A and 10B illustrate generally examples of a gas enclosure system for integrating and controlling non-reactive gas and clean dry air (CDA) sources such as can be used to establish the controlled environment referred to in other examples described elsewhere herein, and such as can include a blower loop to provide, for example, pressurized gas and at least partial vacuum for use with a floatation table. FIG. 10C illustrates generally a further example of a system for integrating and controlling one or more gas or air sources, such as to establish floatation control zones included as a portion of a floatation conveyance system.

Various examples described herein include enclosed modules that can be environmentally-controlled. Enclosure assemblies and corresponding support equipment can be referred to as a "gas enclosure system" and such enclosure assemblies can be constructed in a contoured fashion that reduces or minimizes an internal volume of a gas enclosure assembly, and at the same time provides a working volume for accommodating various footprints of OLED fabrication system components, such as the deposition (e.g., printing), holding, loading, or treatment modules described herein. For example, a contoured gas enclosure assembly according to the present teachings can have a gas enclosure volume of between about 6 $m^3$ to about 95 $m^3$ for various examples of a gas enclosure assembly of the present teachings covering, for example, substrate sizes from Gen 3.5 to Gen 10. Various examples of a contoured gas enclosure assembly according to the present teachings can have a gas enclosure volume of, for example, but not limited by, of between about 15 $m^3$ to about 30 $m^3$, which might be useful for OLED printing of, for example, Gen 5.5 to Gen 8.5 substrate sizes or other substrate sizes. Various examples of an auxiliary enclosure can be constructed as a section of gas enclosure assembly and readily integrated with gas circulation and filtration, as well as purification components to form a gas enclosure system that can sustain a controlled, substantially low-particle environment for processes requiring such an environment.

As shown in FIG. 9A and FIG. 10A, various examples of a gas enclosure system can include a pressurized non-reactive gas recirculation system. Various examples of a pressurized gas recirculation loop can utilize a compressor, a blower and combinations thereof. According to the present teachings, several engineering challenges were addressed in order to provide for various examples of a pressurized gas recirculation system in a gas enclosure system. First, under typical operation of a gas enclosure system without a pressurized non-reactive gas recirculation system, a gas enclosure system can be maintained at a slightly positive internal pressure (e.g., above atmospheric pressure) relative to an external pressure in order to safeguard against outside gas or air from entering the interior should any leaks develop in a gas enclosure system. For example, under typical operation, for various examples of a gas enclosure system of the present teachings, the interior of a gas enclosure system can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure.

Maintaining a pressurized gas recirculation system within a gas enclosure system can be challenging, as it presents a dynamic and ongoing balancing act regarding maintaining a slight positive internal pressure of a gas enclosure system, while at the same time continuously introducing pressurized gas into a gas enclosure system. Further, variable demand of various devices and apparatuses can create an irregular pressure profile for various gas enclosure assemblies and systems of the present teachings. Maintaining a dynamic pressure balance for a gas enclosure system held at a slight positive pressure relative to the external environment under such conditions can provide for the integrity of an ongoing OLED fabrication process. For various examples of a gas enclosure system, a pressurized gas recirculation system according to the present teachings can include various examples of a pressurized gas loop that can utilize at least one of a compressor, an accumulator, and a blower, and combinations thereof. Various examples of a pressurized gas recirculation system that include various examples of a pressurized gas loop can have a specially designed pressure-controlled bypass loop that can provide internal pressure of a non-reactive gas in a gas enclosure system of the present teachings at a stable, defined value. In various examples of a gas enclosure system, a pressurized gas recirculation system can be configured to re-circulate pressurized gas via a pressure-controlled bypass loop when a pressure of a gas in an accumulator of a pressurized gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure system of the present teachings having a pressurized gas recirculation system with various examples of a specially designed pressure-controlled bypass loop can maintain a balance of having a pressurized gas recirculation system in an hermetically sealed gas enclosure.

According to the present teachings, various devices and apparatuses can be disposed in the interior of a gas enclosure system and in fluid communication with various examples of a pressurized gas recirculation system. For various examples of a gas enclosure and system of the present teachings, the use of various pneumatically operated devices and apparatuses can provide low-particle generating performance, as well as being low maintenance. Exemplary devices and apparatuses that can be disposed in the interior of a gas enclosure system and in fluid communication with various pressurized gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating an OLED printing system in accordance with various examples of a gas enclosure system of the present teachings. For example, a substrate floatation table utilizing air-bearing technology can be used to transport a substrate into position in a printhead chamber, as well as to support a substrate during an OLED printing process.

For example, as shown in FIGS. 9A, 9B, 10A, and 10B, various examples of gas enclosure system 503 and gas enclosure system 504 can have external gas loop 3200 for integrating and controlling a non-reactive gas source 3201 and clean dry air (CDA) source 3203 for use in various aspects of operation of gas enclosure system 503 and gas enclosure system 504. Gas enclosure system 503 and gas enclosure system 504 can also include various examples of an internal particle filtration and gas circulation system, as well as various examples of an external gas purification system, as previously described. Such examples of a gas enclosure system can include a gas purification system for purifying various reactive species from a gas. Some commonly used non-limiting examples of a non-reactive gas can include nitrogen, any of the noble gases, and any combination thereof. Various examples of a gas purification system according to the present teachings can maintain levels for each species of various reactive species, including various reactive atmospheric gases, such as water vapor, oxygen, ozone, as well as organic solvent vapors at 1000 ppm or lower, for example, at 100 ppm or lower, at 10 ppm or lower, at 1.0 ppm or lower, or at 0.1 ppm or lower. In addition to external loop 3200 for integrating and controlling gas source 3201 and CDA source 3203, gas enclosure system 503 and gas enclosure system 504 can have compressor loop 3250, which can supply gas for operating various devices and apparatuses that can be disposed in the interior of gas enclosure system 503 and gas enclosure system 504. A vacuum system 3270 can be also be provided, such as in communication with gas enclosure assembly 1005 through line 3272 when valve 3274 is in an open position.

Compressor loop 3250 of FIG. 9A can include compressor 3262, first accumulator 3264 and second accumulator 3268, which are configured to be in fluid communication. Compressor 3262 can be configured to compress gas withdrawn from gas enclosure assembly 1005 to a desired pressure. An inlet side of compressor loop 3250 can be in fluid communication with gas enclosure assembly 1005 via gas enclosure assembly outlet 3252 through line 3254, having valve 3256 and check valve 3258. Compressor loop 3250 can be in fluid communication with gas enclosure assembly 1005 on an outlet side of compressor loop 3250 via external gas loop 3200. Accumulator 3264 can be disposed between compressor 3262 and the junction of compressor loop 3250 with external gas loop 3200 and can be configured to generate a pressure of 5 psig or higher. Second accumulator 3268 can be in compressor loop 3250 for providing dampening fluctuations due to compressor piston cycling at about 60 Hz. For various examples of compressor loop 3250, first accumulator 3264 can have a capacity of between about 80 gallons to about 160 gallons, while second accumulator can have a capacity of between about 30 gallons to about 60 gallons. According to various examples of gas enclosure system 503, compressor 3262 can be a zero ingress compressor. Various types of zero ingress compressors can operate without leaking atmospheric gases into various examples of a gas enclosure system of the present teachings. Various examples of a zero ingress compressor can be run continuously, for example, during an OLED fabrication process utilizing the use of various devices and apparatuses requiring compressed gas.

Accumulator 3264 can be configured to receive and accumulate compressed gas from compressor 3262. Accumulator 3264 can supply the compressed gas as needed in gas enclosure assembly 1005. For example, accumulator 3264 can provide gas to maintain pressure for various components of gas enclosure assembly 1005, such as, but not limited by, one or more of a pneumatic robot, a substrate floatation table, an air bearing, an air bushing, a compressed gas tool, a pneumatic actuator, and combinations thereof. As shown in FIG. 9A for gas enclosure system 503, gas enclosure assembly 1005 can have an OLED printing system 2000 enclosed therein. As schematically depicted in FIG. 9A, printing system 2000 can be supported by printing system base 2100, which can be a granite stage. Printing system base 2100 can support a substrate support apparatus, such as a chuck, for example, but not limited by, a vacuum chuck, a substrate floatation chuck having pressure ports, and a substrate floatation chuck having vacuum and pressure ports. In various examples of the present teachings, a substrate support apparatus can be a substrate floatation table, such as substrate floatation table printing region 2200. Substrate floatation table printing region 2200 can be used for the frictionless support of a substrate. In addition to a low-particle generating floatation table, for frictionless Y-axis conveyance of a substrate, printing system 2000 can have a Y-axis motion system utilizing air bushings.

Additionally, printing system 2000 can have at least one X,Z-axis carriage assembly with motion control provided by a low-particle generating X-axis air bearing assembly. Various components of a low-particle generating motion system, such as an X-axis air bearing assembly, can be used in place of, for example, various particle-generating linear mechanical bearing systems. For various examples of a gas enclosure and system of the present teachings, the use of a variety of pneumatically operated devices and apparatuses can provide low-particle generating performance, as well as being low maintenance. Compressor loop 3250 can be configured to continuously supply pressurized gas to various devices and apparatuses of gas enclosure system 503. In addition to a supply of pressurized gas, substrate floatation table printing region 2200 of inkjet printing system 2000, which utilizes air bearing technology, also utilizes vacuum system 3270, which is in communication with gas enclosure assembly 1005 through line 3272 when valve 3274 is in an open position.

A pressurized gas recirculation system according to the present teachings can have pressure-controlled bypass loop 3260 as shown in FIG. 9A for compressor loop 3250, which acts to compensate for variable demand of pressurized gas during use, thereby providing dynamic balance for various examples of a gas enclosure system of the present teachings. For various examples of a gas enclosure system according to the present teachings, a bypass loop can maintain a constant pressure in accumulator 3264 without disrupting or changing the pressure in enclosure 1005. Bypass loop 3260 can have first bypass inlet valve 3261 on an inlet side of bypass loop, which is closed unless bypass loop 3260 is used. Bypass loop 3260 can also have back pressure regulator 3266, which can be used when second valve 3263 is closed. Bypass loop 3260 can have second accumulator 3268 disposed at an outlet side of bypass loop 3260. For examples of compressor loop 3250 utilizing a zero ingress compressor, bypass loop 3260 can compensate for small excursions of pressure that can occur over time during use of a gas enclosure system. Bypass loop 3260 can be in fluid communication with compressor loop 3250 on an inlet side of bypass loop 3260 when bypass inlet valve 3261 is in an opened position. When bypass inlet valve 3261 is opened, gas shunted through bypass loop 3260 can be recirculated to the compressor if gas from compressor loop 3250 is not in demand within the interior of gas enclosure assembly 1005. Compressor loop 3250 is configured to shunt gas through bypass loop 3260 when a pressure of the gas in accumulator 3264 exceeds a pre-set threshold pressure. A pre-set threshold pressure for accumulator 3264 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various examples of compressor loop 3250 can utilize a variety of compressors other than a zero ingress compressor, such as a variable speed compressor or a compressor that can be controlled to be in either an on or off state. As previously discussed herein, a zero ingress compressor ensures that no atmospheric reactive species can be introduced into a gas enclosure system. As such, any compressor configuration preventing atmospheric reactive species from being introduced into a gas enclosure system can be utilized for compressor loop 3250. According to various examples, compressor 3262 of gas enclosure system 503 can be housed in, for example, but not limited by, an hermetically-sealed housing. The housing interior can be configured in fluid communication with a source of gas, for example, the same gas that forms the gas atmosphere for gas enclosure assembly 1005. For various examples of compressor loop 3250, compressor 3262 can be controlled at a constant speed to maintain a constant pressure. In other examples of compressor loop 3250 not utilizing a zero ingress compressor, compressor 3262 can be turned off when a maximum threshold pressure is reached, and turned on when a minimum threshold pressure is reached.

In FIG. 10A for gas enclosure system 504, blower loop 3280 utilizing vacuum blower 3290 is shown for the operation of substrate floatation table printing region 2200 of inkjet printing system 2000, which are housed in gas enclosure assembly 1005. As previously discussed herein for compressor loop 3250, blower loop 3280 can be configured to continuously supply pressurized gas to a substrate floatation table printing region 2200 of printing system 2000.

Various examples of a gas enclosure system that can utilize a pressurized gas recirculation system can have various loops utilizing a variety of pressurized gas sources, such as at least one of a compressor, a blower, and combinations thereof. In FIG. 10A for gas enclosure system 504, compressor loop 3250 can be in fluid communication with external gas loop 3200, which can be used for the supply of gas for high consumption manifold 3225, as well as low consumption manifold 3215. For various examples of a gas enclosure system according to the present teachings as shown in FIG. 10A for gas enclosure system 504, high consumption manifold 3225 can be used to supply gas to various devices and apparatuses, such as, but not limited by, one or more of a substrate floatation table, a pneumatic robot, an air bearing, an air bushing, and a compressed gas tool, and combinations thereof. For various examples of a gas enclosure system according to the present teachings, low consumption 3215 can be used to supply gas to various apparatuses and devises, such as, but not limited by, one or more of an isolator, and a pneumatic actuator, and combinations thereof.

For various examples of gas enclosure system 504 of FIGS. 10A and 10B, a blower loop 3280 can be utilized to supply pressurized gas to various examples of substrate floatation table printing region 2200. In addition to a supply of pressurized gas, substrate floatation table printing region 2200 of OLED inkjet printing system 2000, which utilizes air bearing technology, also utilizes blower vacuum 3290, which is in communication with gas enclosure assembly 1005 through line 3292 when valve 3294 is in an open position. Housing 3282 of blower loop 3280 can maintain first blower 3284 for supplying a pressurized source of gas to substrate floatation table printing region 2200, and second blower 3290, acting as a vacuum source for substrate floatation table printing region 2200, which is housed in a gas environment in gas enclosure assembly 1005. Attributes that can make blowers suitable for use as a source of either pressurized gas or vacuum for various examples a substrate floatation table include, for example, but not limited by, that they have high reliability; making them low maintenance, have variable speed control, and have a wide range of flow volumes; various examples capable of providing a volume flow of between about 100 m$^3$/h to about 2,500 m$^3$/h. Various examples of blower loop 3280 additionally can have first isolation valve 3283 at an inlet end of blower loop 3280, as well as check valve 3285 and a second isolation valve 3287 at an outlet end of blower loop 3280. Various examples of blower loop 3280 can have adjustable valve 3286, which can be, for example, but not limited by, a gate, butterfly, needle or ball valve, as well as heat exchanger 3288 for maintaining gas from blower loop 3280 to substrate floatation table printing region 2200 at a defined temperature.

FIG. 10A depicts external gas loop 3200, also shown in FIG. 9A, for integrating and controlling gas source 3201 and clean dry air (CDA) source 3203 for use in various aspects of operation of gas enclosure system 503 of FIG. 9A and gas enclosure system 504 of FIG. 10A. External gas loop 3200 of FIG. 9A and FIG. 10A can include at least four mechanical valves. These valves include first mechanical valve 3202, second mechanical valve 3204, third mechanical valve 3206, and fourth mechanical valve 3208. These various valves are located at positions in various flow lines that allow control of both a non-reactive gas and an air source such as clean dry air (CDA). According to the present teachings, a non-reactive gas can be any gas that does not undergo a chemical reaction under a defined set of conditions. Some commonly used non-limiting examples of non-reactive gas can include nitrogen, any of the noble gases, and any combination thereof. From a house gas source 3201, a house gas line 3210 extends. House gas line 3210 continues to extend linearly as low consumption manifold line 3212, which is in fluid communication with low consumption manifold 3215. A cross-line first section 3214 extends from a first flow juncture 3216, which is located at the intersection of house gas line 3210, low consumption manifold line 3212, and cross-line first section 3214. Cross-line first section 3214 extends to a second flow juncture 3218. A compressor gas line 3220 extends from accumulator 3264 of compressor loop 3250 and terminates at second flow juncture 3218. A CDA line 3222 extends from a CDA source 3203 and continues as high consumption manifold line 3224, which is in fluid communication with high consumption manifold 3225. A third flow juncture 3226 is positioned at the intersection of a cross-line second section 3228, clean dry air line 3222, and high consumption manifold line 3224. Cross-line second section 3228 extends from second flow juncture 3218 to third flow juncture 3226. Various components that are high consumption can be supplied CDA during maintenance, by means high consumption manifold 3225. Isolating the compressor using valves 3204, 3208, and 3230 can prevent reactive species, such as ozone, oxygen, and water vapor from contaminating a gas within the compressor and accumulator.

By contrast with FIGS. 9A and 10A, FIGS. 9B and 10B illustrate generally a configuration wherein a pressure of gas inside the gas enclosure assembly 1005 can be maintained within a desired or specified range, such as using a valve coupled to a pressure monitor, P, where the valve allows gas to be exhausted to another enclosure, system, or a region surrounding the gas enclosure assembly 1005 using information obtained from the pressure monitor. Such gas can be recovered and re-processed as in other examples described herein. As mentioned above, such regulation can assist in maintaining a slight positive internal pressure of a gas enclosure system, because pressurized gas is also contemporaneously introduced into the gas enclosure system. Variable demand of various devices and apparatuses can create an irregular pressure profile for various gas enclosure assemblies and systems of the present teachings. Accordingly, the approach shown in FIGS. 9B and 10B can be used in addition or instead of other approaches described herein such as to assist in maintaining a dynamic pressure balance for a gas enclosure system held at a slight positive pressure relative to the environment surrounding the enclosure.

FIG. 10C illustrates generally a further example of a system 505 for integrating and controlling one or more gas or air sources, such as to establish floatation control zones included as a portion of a floatation conveyance system. Similar to the examples of FIGS. 10A and 10B, FIG. 10C illustrates generally a floatation table printing region 2200. Additionally shown in the illustrative example of FIG. 10C are an input region 2100 and an output region 2300. The regions 2100, 2200, 2300 are referred to as input, printing, and output for illustration only. Such regions can be used for other processing steps, such as conveyance of a substrate, or support of a substrate such as during one or more of holding, drying, or thermal treatment of the substrate in one or more other modules. In the illustration of FIG. 10C, a first blower 3284A is configured to provide pressurized gas in one or more of the input or output regions 2100 or 2300 of a floatation table apparatus. Such pressurized gas can be temperature controlled such as using a first chiller 142A coupled to a first heat exchanger 1502A. Such pressurized gas can be filtered using a first filter 1503A. A temperature monitor 8701A can be coupled to the first chiller 142 (or other temperature controller).

Similarly, a second blower 3284B can be coupled to the printing region 2200 of the floatation table. A separate chiller 142B can be coupled to a loop including a second heat exchanger 1502B and a second filter 1503B. A second temperature monitor 8701B can be used to provide independent regulation of the temperature of pressurized gas provided by the second blower 3284B. In this illustrative example, the input and output regions 2100 and 2300 are supplied with positive pressure, but the printing region 2200 can include use of a combination of positive pressure and vacuum control to provide precise control over the substrate position. For example, using such a combination of positive pressure and vacuum control, the substrate can be exclusively controlled using the floating gas cushion provided by the system 504 in the zone defined by the printing region 2200. The vacuum can be established by a third blower 3290, such as also provided at least a portion of the make-up gas for the first and second blowers 3284A or 3284B within the blower housing 3282.

Figure 11A:
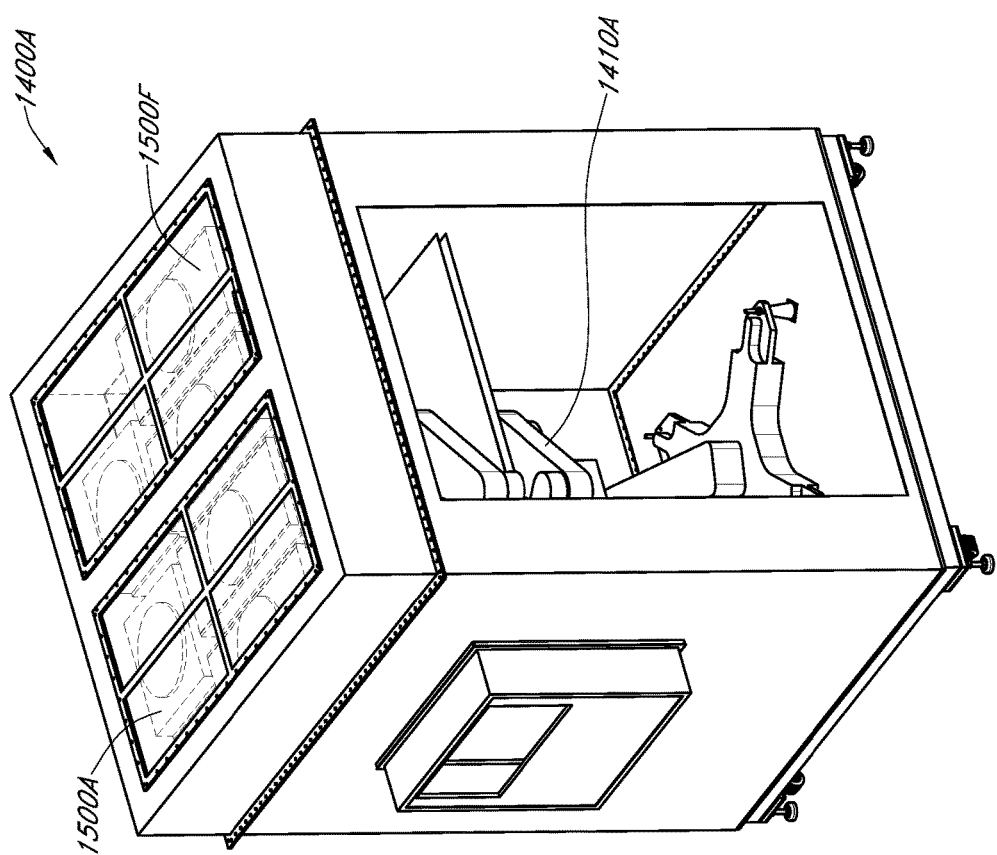
FIG. 11A, FIG. 11B, and FIG. 11C illustrate generally views of at least a portion of a system, such as including a transfer module, that can be used in manufacturing an electronic device (e.g., an organic light emitting diode (OLED) device).
Figure 11B:
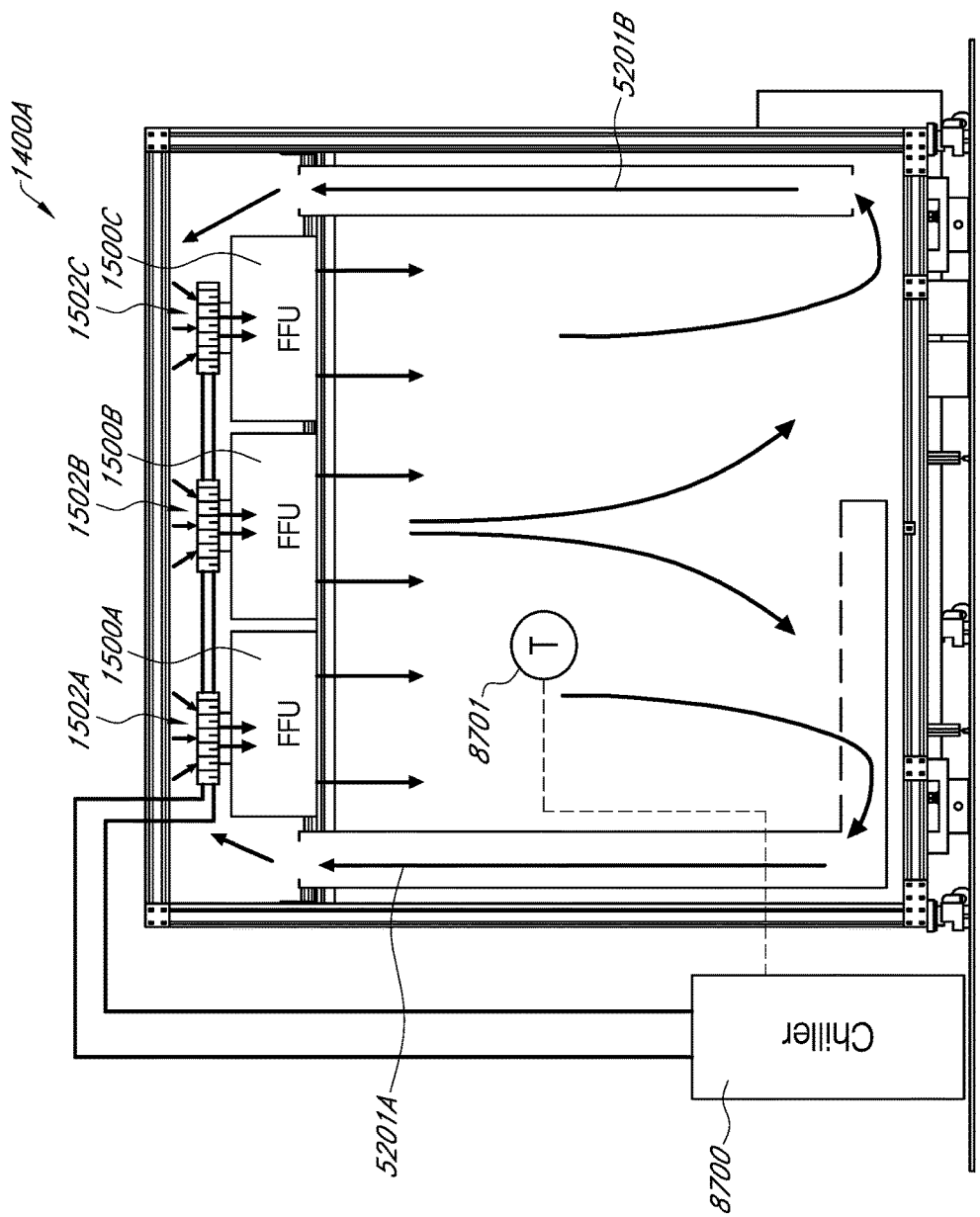
Figure 11C:
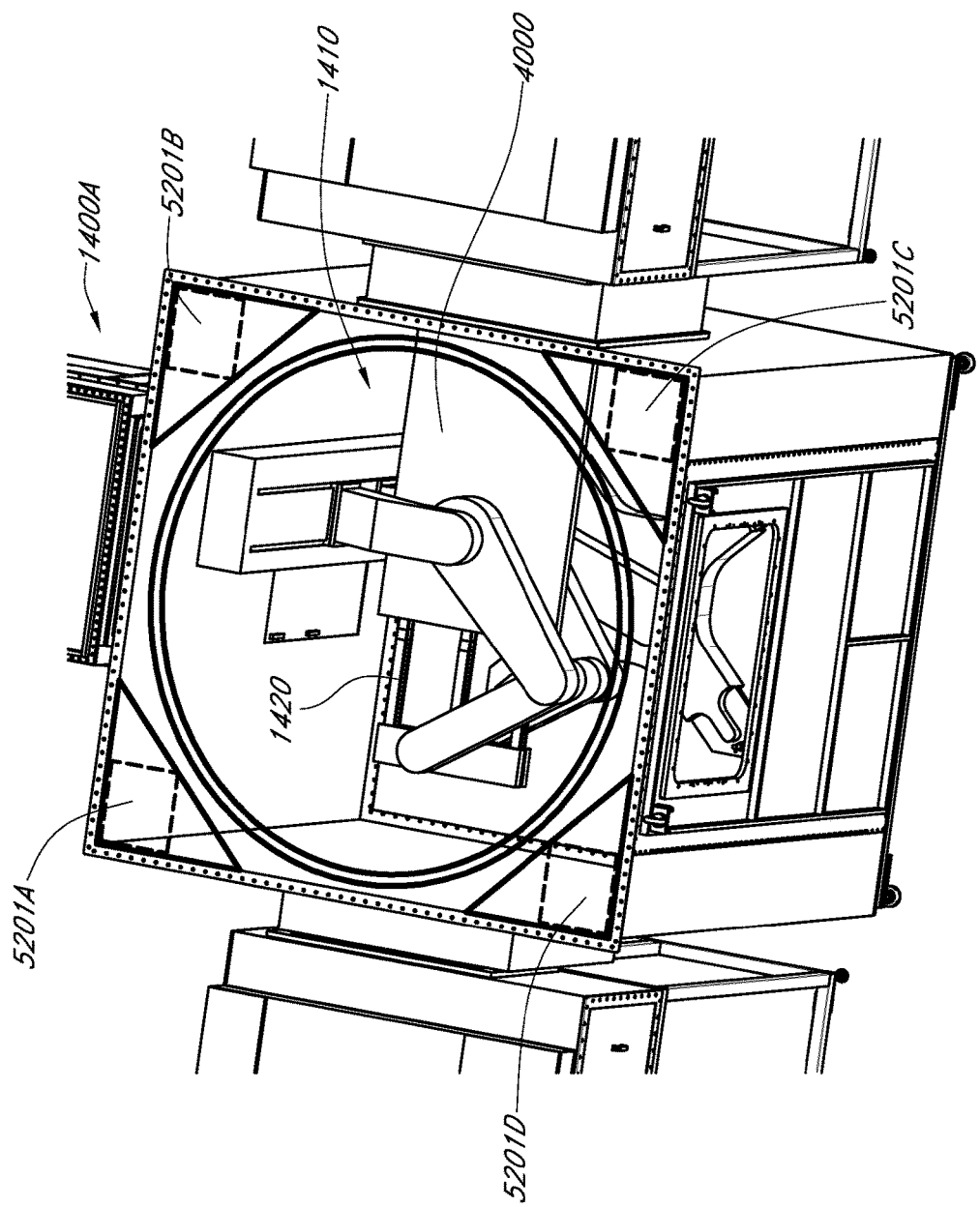

FIG. 11A, FIG. 11B, and FIG. 11C illustrate generally views of at least a portion of a system, such as including a transfer module, that can be used in manufacturing an electronic device (e.g., an organic light emitting diode (OLED) device).

The controlled environment within various enclosures of the system 1000 can include a controlled particulate level. Particulates can be reduced or minimized such as by using air circulation units and filters, such as can be referred to as fan filter units (FFUs). An array of FFUs can be located along a path traversed by the substrate during processing. The FFUs need not provide a down-flow direction of air flow. For example, an FFU or ductwork can be positioned to provide a substantially laminar flow in a lateral direction across a surface of the substrate. Such laminar flow in the lateral direction can enhance or otherwise provide particulate control.

In the example of FIGS. 11A through 11C, one or more fan filter units (FFUs), such as FFUs 1500A through 1500F can be used to assist in maintaining an environment within the transfer module 1400A having a controlled level of particulates or contaminants. Ducting such as first and second ducts 5201A or 5201B can be used, such as to provide a return air pathway as shown in the down-flow examples of FIGS. 11B and 11C. A controlled temperature can be maintained at least in part using a temperature controller 8700, such as coupled to one or more heat exchangers 1502. One or more temperature monitors, such as a temperature monitor 8701, can be placed in specified locations (e.g., on or nearby a substrate, such, or end effector) to provide feedback to assist in maintaining a substrate or a region nearby a substrate within a specified range of temperatures. In an example, as discussed below, the temperature monitor can be a non-contact sensor, such as an infrared temperature monitor configured to provide information indicative of a surface temperature sampled by the sensor. Other configurations are possible, such as can include placing the heat exchanger within or nearby a return air duct in a lower portion of the chamber as shown illustratively in FIG. 13B.

In FIG. 11C, a circle denotes generally an outer dimensional limit of sweep of the handler 1410, and the regions indicated in the corners can be used as ducts 5201A, 5201B, 5201C, or 5201D, such as to provide a return pathway for a purified gas (e.g., nitrogen) to be captured from the bottom of the transfer module 1400A and then recirculated or scrubbed, such as for reinjection through one or more FFUs 1500A through 1500F located at the top of the transfer module 1400A.

FIG. 12A illustrates generally a portion of a system, such as including a transfer module 1400B coupled to other chambers or modules, that can be used in manufacturing an electronic device (e.g., an organic light emitting diode (OLED) device). As in the example of FIG. 11A, the transfer module 1400B can include one or more fan filter units (FFUs), such as 1500A through 1500N (e.g., 14 FFUs).

Figure 12B:
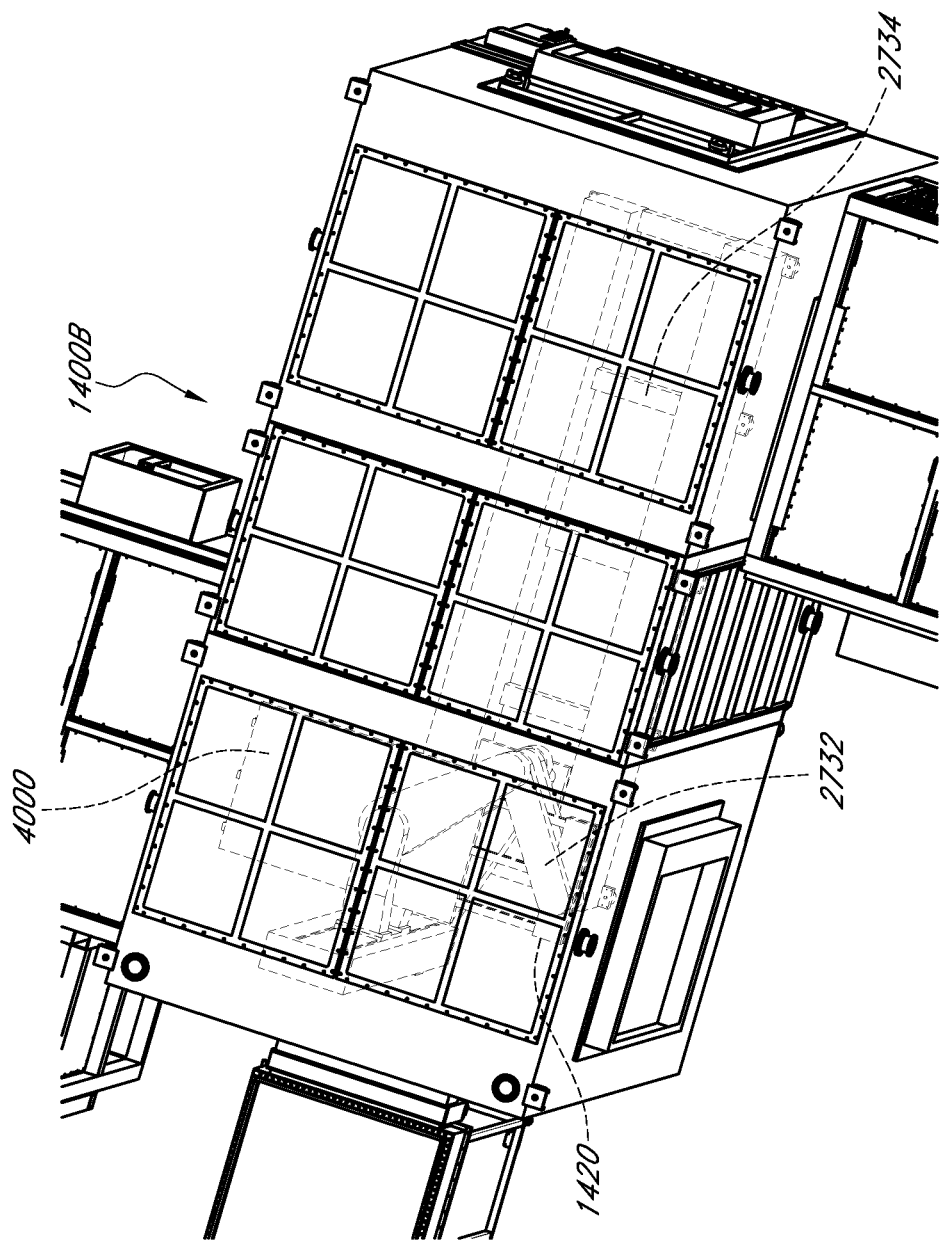
FIG. 12B illustrates generally a handler configuration that can be used, such as for manipulating a substrate within the module shown in FIG. 12A.

FIG. 12B illustrates generally a handler 2732 configuration that can be used, such as for manipulating a substrate 4000 within the module 1400B shown in FIG. 11A. By contrast with the handler 1410A of the transfer module 1400A of FIG. 11A, the hander 1410B of FIG. 12B illustrates generally that a track 2734 or rail configuration can be used, such as to provide linear translation of the handler 2732 in an axis. In this manner, a broad range of other chambers or modules can be coupled to the transfer module 1400B, such as in a clustered configuration, without requiring that each other module or chamber be coupled in a manner radiating out from a single point. As in the example of FIG. 11C, one or more ducts can be located in portions of the transfer module 1400B in a region outside the race-track shaped range of motion of the handler 1410B. For example, such locations can be used to provide return ducts to bring a gas (e.g., nitrogen) from a lower portion of the transfer module 1400B upwards to a plenum above the FFU array as shown in other examples.

Figure 13A:
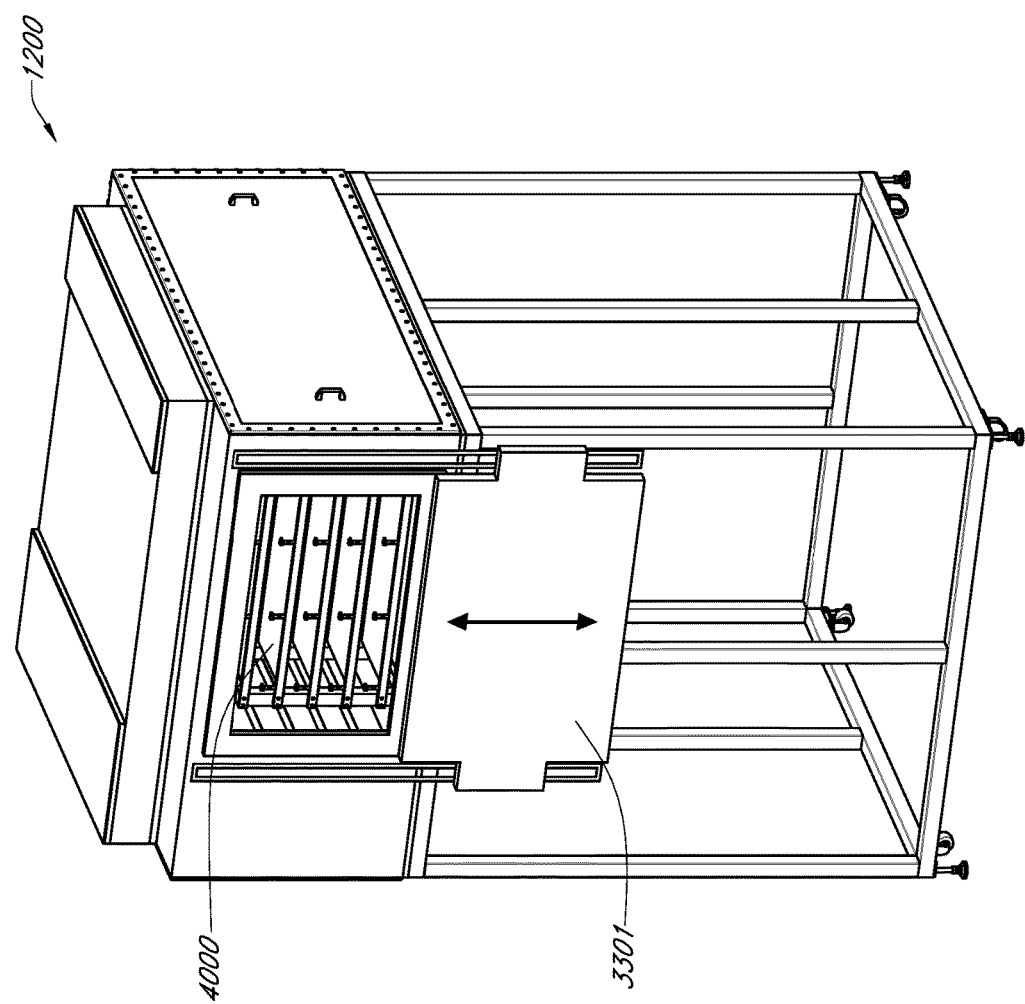
FIG. 13A and FIG. 13B illustrate generally views of a portion of a system, such as can include a stacked configuration of substrate buffering, cooling, drying or other processing areas that can be used in manufacturing an electronic device (e.g., an organic light emitting diode (OLED) device).
Figure 13B:
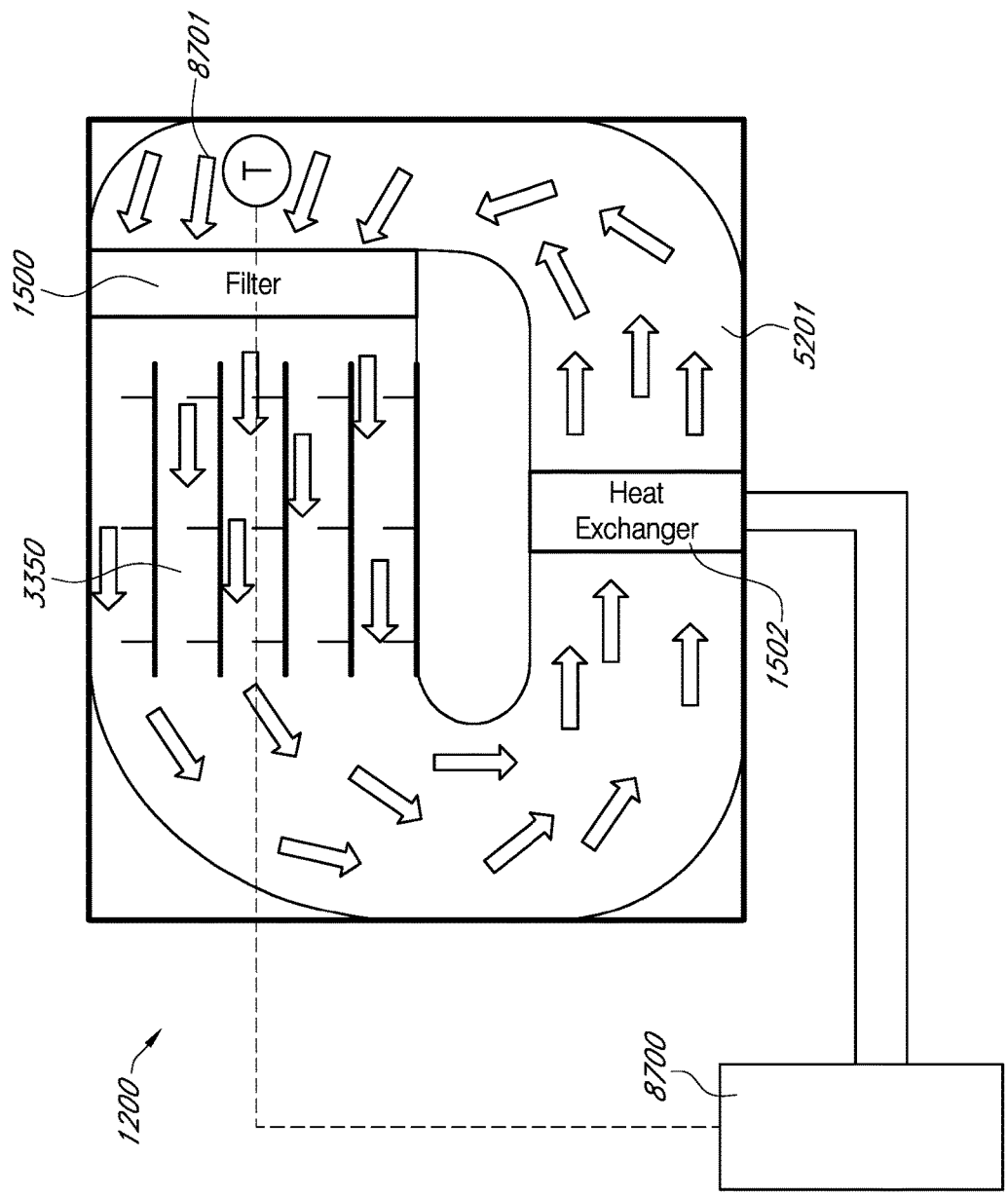

FIG. 13A and FIG. 13B illustrate generally views of a portion of a system, such as can include a processing module 1200 having a stacked configuration of areas to accommodate respective substrates. The module 1200 can be coupled to other modules as described elsewhere herein. For example, the module 1200 can be used for holding substrates between operations performed using other modules as described above, including drying the substrate, queuing the substrate until the subsequent processing module is ready to receive it, settling or flowing a liquid on the substrate, or cooling the substrate. A port of the processing module 1200 can include one or more doors or hatches, such as a door 3301. For example, such doors can be mechanically or electrically interlocked so that a door accessible to an exterior of a fabrication system is unable to be opened unless a corresponding door elsewhere on or within the system is closed. For example, the door 3301 can be used to perform maintenance, while the processing module 1200 is otherwise isolated from an inert environment, or a particulate or contaminant-controlled environment in other enclosed portions of a fabrication system.

As mentioned above, such a particulate or contaminant-controlled environment can be maintained at least in part using one or more FFUs 1500. In the example of FIG. 13B, a cross-flow configuration is used, such as to maintain a substantially laminar flow of gas (e.g., a non-reactive gas) across each of one or more cells 3350 that can include a substrate. A heat exchanger 1502 can, but need not be located nearby or as a portion of the FFU 1500. For example, the heat exchanger 1502 can be located below a substrate handling area, such as included within or as a portion of a return duct 5201. A temperature can be controlled by a temperature controller 8700, such as coupled to a temperature monitor 8701. The curved profile of portions of the duct 5201 can be specified at least in part using a computational fluid dynamics technique, such as to maintain specified flow characteristics (e.g., laminar flow) within the processing module 1200.

Various Notes & Examples

Example 1 can include or use subject matter (such as an apparatus, a method, a means for performing acts, or a device readable medium including instructions that, when performed by the device, can cause the device to perform acts), such as can include or use an electronic device fabrication system comprising a first printing system configured to deposit a first patterned organic layer on a substrate, the patterned layer comprising at least a portion of a light-emitting device being fabricated upon the substrate, the first printing system located in a first processing environment, the first processing environment comprising a controlled environment established to remain below specified limits of particulate contamination level, water vapor content, and ozone content, an enclosed thermal treatment module including a stacked configuration of thermally-controlled regions, the thermally-controlled regions offset from each other and each configured to accommodate a substrate including providing one or more of a specified substrate temperature or a specified substrate temperature uniformity, the enclosed thermal treatment module providing a controlled second processing environment, the second processing environment comprising a controlled environment established to remain below specified limits of particulate contamination level, water vapor content, oxygen content, and ozone content, and a substrate transfer module configured to receive the substrate from the first printing system and configured to provide the substrate to the second processing environment within the enclosed thermal treatment module. In Example 1, the oxygen content of the first processing environment during the printing of the substrate in the first printing system is at least 100 times greater than the oxygen content of the second processing environment during the thermal treating of the substrate in the thermal treatment module.

Example 2 can include, or can optionally be combined with the subject matter of Example 1, to optionally include an enclosed substrate cooling module including one or more substrate holding regions, each configured to accommodate the substrate, the substrate cooling module configured to hold the substrate for a duration specified to include cooling the substrate until the substrate is below a specified threshold temperature, the enclosed cooling module configured to establish a third processing environment, the third processing environment comprising a controlled environment established to remain below specified limits of particulate contamination level, water vapor content, oxygen content, and ozone content.

Example 3 can include, or can optionally be combined with the subject matter of Example 2 to optionally include a substrate transfer module configured to receive the substrate from the second processing environment within the enclosed thermal treatment module and configured to provide the substrate to the third processing environment within the enclosed cooling module.

Example 4 can include, or can optionally be combined with the subject matter of one or any combination of Examples 2 or 3 to optionally include an oxygen content of the first processing environment during the printing of the substrate in the printing module of at least 100 times greater than the oxygen content of the third processing environment during the cooling of the substrate in the cooling module.

Example 5 can include, or can optionally be combined with the subject matter of one or any combination of Examples 2 through 4 to optionally include a specified threshold temperature of 100 C.

Example 6 can include, or can optionally be combined with the subject matter of one or any combination of Examples 2 or 5 to optionally include a cooling module comprising multiple substrate cooling regions in a stacked configuration, each station offset from each other.

Example 7 can include, or can optionally be combined with the subject matter of one or any combination of Examples 2 or 6 to optionally include second and third processing environment that are substantially the same.

Example 8 can include, or can optionally be combined with the subject matter of one or any combination of Examples 1 or 7 to optionally include a first processing environment comprising clean dry air controlled to maintain a water content below 100 ppm and an ozone content below 100 ppm.

Example 9 can include, or can optionally be combined with the subject matter of one or any combination of Examples 1 or 8 to optionally include a second processing environment comprising a purified non-reactive gas specified for minimal or no reactivity with a species deposited on the substrate.

Example 10 can include, or can optionally be combined with the subject matter of Example 9 to optionally include a second processing environment includes nitrogen above atmospheric pressure.

Example 11 can include, or can optionally be combined with the subject matter of one or any combination of Examples 1 through 10 to optionally include a second processing environment established to maintain an environment having less than 1000 parts-per-million of oxygen and less than 100 parts-per-million of water vapor and less than 100 parts-per-million of ozone.

Example 12 can include, or can optionally be combined with the subject matter of one or any combination of Examples 1 through 11 to optionally include a first processing environment having an environment exceeding 100,000 parts-per-million of oxygen.

Example 13 can include, or can optionally be combined with the subject matter of one or any combination of Examples 1 through 12 to optionally include a first handler configured to transfer the substrate from the printing system.

Example 14 can include, or can optionally be combined with the subject matter of Example 13 to optionally include a second handler located in an environment different from a first handler, the second handler configured to transfer the substrate to the thermal treatment module.

Example 15 can include, or can optionally be combined with the subject matter of one or any combination of Examples 1 through 14 to optionally include a second handler configured to place the substrate in the specified one of the thermally-controlled regions.

Example 16 can include, or can optionally be combined with the subject matter of one or any combination of Examples 1 through 15 to optionally include a substrate transfer module comprising at least one chamber separate from the first printing system and the enclosed thermal treatment module.

Example 17 can include, or can optionally be combined with the subject matter of one or any combination of Examples 1 through 16 to optionally include a first printing system that is enclosed, where the substrate transfer module is located between the enclosed first printing system and the enclosed thermal treatment module.

Example 18 can include, or can optionally be combined with the subject matter of one or any combination of Examples 1 through 17 to optionally include an enclosed thermal treatment module configured to provide access to different ones of the thermally controlled regions for substrate loading and unloading using a movable platform, the movable platform configured to move the thermally-controlled regions in at least one axis.

Example 19 can include, or can optionally be combined with the subject matter of one or any combination of Examples 1 through 18 to optionally include a printing system comprising an inkjet printing system.

Example 20 can include, or can optionally be combined with the subject matter of one or any combination of Examples 1 through 19 to optionally include a substrate transfer module comprising an enclosed interior module configured to receive a substrate from the first processing environment and provide a substrate to the second processing environment through which the substrate passes in the process of transferring the substrate from the printer to the thermal treatment module.

Example 21 can include, or can optionally be combined with the subject matter of one or any combination of Examples 1 through 20 to optionally include a substrate transfer module configured to transfer the substrate from the printer to the thermal treatment module while maintaining the specified limits of particulate contamination level, water vapor content, oxygen content, and ozone content of the second processing environment within the enclosed thermal treatment module.

Example 22 can include, or can optionally be combined with the subject matter of one or any combination of Examples 1 through 21 to optionally include a substrate transfer module configured to provide the substrate to the enclosed thermal treatment module including providing the substrate to an environment at or above atmospheric pressure without raising the concentration of oxygen within the thermal treatment module to a level of more than 1000 parts per million.

Example 23 can include, or can optionally be combined with the subject matter of one or any combination of Examples 1 through 22 to optionally include a substrate handler configured to move the substrate within the enclosed thermal treatment module.

Example 24 can include, or can optionally be combined with the subject matter of one or any combination of Examples 1 through 23 to optionally include thermally-controlled regions each configured to provide a specified substrate temperature.

Example 25 can include, or can optionally be combined with the subject matter of one or any combination of Examples 1 through 24 to optionally include thermally-controlled regions each configured to provide a specified substrate temperature uniformity.

Example 26 can include, or can optionally be combined with the subject matter of one or any combination of Examples 1 through 25 to optionally include a drying module configured to receive the substrate after deposition of the first patterned organic layer, and configured to dry the ink comprising the first patterned organic layer that was deposited during a printing operation.

Example 27 can include, or can optionally be combined with the subject matter of one or any combination of Examples 1 through 26 to optionally include a drying module configured to one or more of at least partially evacuate or purge an atmosphere within the drying module to facilitate a drying operation.

Example 28 can include, or can optionally be combined with the subject matter of one or any combination of Examples 1 through 27 to include, subject matter (such as an apparatus, a method, a means for performing acts, or a machine readable medium including instructions that, when performed by the machine, that can cause the machine to perform acts), such as can include or use an electronic device fabrication system, comprising two or more printing systems each configured to deposit a patterned organic layer on a substrate, the patterned layer comprising at least a portion of a light-emitting device being fabricated upon the substrate, the two or more printing systems located in a first processing environment, the first processing environment comprising a controlled environment established to remain below specified limits of particulate contamination level, water vapor content, and ozone content. In Example 28, an enclosed thermal treatment module includes a stacked configuration of thermally-controlled regions, the thermally-controlled regions offset from each other and each configured to accommodate a substrate including providing one or more of a specified substrate temperature or a specified substrate temperature uniformity, the enclosed thermal treatment module providing a controlled second processing environment, the second processing environment comprising a controlled environment established to remain below specified limits of particulate contamination level, water vapor content, oxygen content, and ozone content. In Example 28, a substrate transfer module is configured to receive the substrate from the two or more printing systems and configured to provide the substrate to the second processing environment within the enclosed thermal treatment module. In Example 28, the oxygen content of the first processing environment during the printing of the substrate in at least one of the two or more printing systems is at least 100 times greater than the oxygen content of the second processing environment during the thermal treating of the substrate in the thermal treatment module.

Example 29 can include, or can optionally be combined with the subject matter of one or any combination of Examples 1 through 28 to optionally include each of two or more printing systems configured to deposit a different patterned organic layer on the substrate, where the enclosed thermal treatment module is configured to provide a thermal treatment to the substrate between or after deposition of the different patterned organic layers.

Example 30 can include, or can optionally be combined with the subject matter of one or any combination of Examples 1 through 29 to optionally include a second processing environment including an environment having less than 10 parts-per-million of oxygen.

Example 31 can include, or can optionally be combined with the subject matter of one or any combination of Examples 1 through 30 to include, subject matter (such as an apparatus, a method, a means for performing acts, or a machine readable medium including instructions that, when performed by the machine, that can cause the machine to perform acts), such as can include or use an electronic device fabrication system, comprising a first printing system configured to deposit a first patterned organic layer on a substrate, the patterned layer comprising at least a portion of a light-emitting device being fabricated upon the substrate, a thermal treatment module including a stacked configuration of thermally-controlled regions, the thermally-controlled regions offset from each other and each configured to accommodate the substrate including providing one or more of a specified substrate temperature or a specified substrate temperature uniformity, the thermal treatment module configured to receive the substrate from the first printing system in a specified one of the thermally-controlled regions, a substrate cooling module including one or more substrate holding regions, each configured to accommodate the substrate, the substrate cooling module configured to hold the substrate for a duration specified to include cooling the substrate until the substrate is below a specified threshold temperature. In Example 30, the first printing system, thermal treatment module, and substrate cooling module are enclosed and configured to provide a controlled environment established to remain below specified limits of particulate contamination level, water vapor content, oxygen content, and ozone content. In Example 30, the system comprises a substrate transfer module configured to receive the substrate from an environment different from the controlled processing environment, and configured to provide the substrate to an enclosed region defined by the first printing system or the thermal treatment module or the cooling module.

Example 32 can include, or can optionally be combined with the subject matter of Example 31 to optionally include a substrate transfer module configured to receive the substrate from the enclosed thermal treatment module and configured to provide the substrate to the enclosed cooling module.

Example 33 can include, or can optionally be combined with the subject matter of one or any combination of Examples 31 or 32 to optionally include an oxygen content that is at least 100 times greater in an environment from which the substrate is transferred as compared to the oxygen content of the controlled processing environment during the cooling of the substrate in the cooling module.

Example 34 can include, or can optionally be combined with the subject matter of one or any combination of Examples 31 through 33 to optionally include a specified threshold temperature of 100 C.

Example 35 can include, or can optionally be combined with the subject matter of one or any combination of Examples 31 through 34 to optionally include a cooling module comprising multiple substrate cooling regions in a stacked configuration, each station offset from each other.

Example 36 can include, or can optionally be combined with the subject matter of one or any combination of Examples 31 through 35 to optionally include a processing environment outside the cooling module, the printing system, and the thermal treatment module comprising clean dry air controlled to maintain a water content below 100 ppm and an ozone content below 100 ppm.

Example 37 can include, or can optionally be combined with the subject matter of one or any combination of Examples 31 through 36 to optionally include a controlled processing environment comprising a purified non-reactive gas specified for minimal or no reactivity with a species deposited on the substrate.

Example 38 can include, or can optionally be combined with the subject matter of Example 37 to optionally include a controlled processing environment having nitrogen above atmospheric pressure.

Example 39 can include, or can optionally be combined with the subject matter of one or any combination of Examples 31 through 38 to optionally include a controlled processing environment established to maintain an environment having less than 1000 parts-per-million of oxygen and less than 100 parts-per-million of water vapor and less than 100 parts-per-million of ozone.

Example 40 can include, or can optionally be combined with the subject matter of one or any combination of Examples 31 through 39 to optionally include a processing environment outside the cooling module, the printing system, and the thermal treatment module comprises an environment exceeding 100,000 parts-per-million of oxygen.

Example 41 can include, or can optionally be combined with the subject matter of one or any combination of Examples 31 through 40 to optionally include a first handler configured to transfer the substrate from the printing system.

Example 42 can include, or can optionally be combined with the subject matter of Example 41 to optionally include a second handler configured to place the substrate in the specified one of the thermally-controlled regions.

Example 43 can include, or can optionally be combined with the subject matter of one or any combination of Examples 31 through 42 to optionally include a thermal treatment module configured to deposit the substrate in the specified one of the thermally-controlled regions using a movable platform, the movable platform configured to move the thermally-controlled regions in at least one axis.

Example 44 can include, or can optionally be combined with the subject matter of one or any combination of Examples 31 through 43 to optionally include a printing system comprising an inkjet printing system.

Example 45 can include, or can optionally be combined with the subject matter of one or any combination of Examples 31 through 44 to optionally include a first loading module including a chamber separate from the first printing system and the enclosed thermal treatment module.

Example 46 can include, or can optionally be combined with the subject matter of one or any combination of Examples 31 through 45 to optionally include a first loading module configured to provide the substrate to an enclosed region of the system via the first loading module including providing the substrate to an environment at or above atmospheric pressure without raising a concentration of oxygen within the thermal treatment module to a level of more than 1000 parts per million.

Example 47 can include, or can optionally be combined with the subject matter of one or any combination of Examples 31 through 46 to optionally include thermally-controlled regions each configured to provide a specified substrate temperature.

Example 48 can include, or can optionally be combined with the subject matter of one or any combination of Examples 31 through 47 to optionally include thermally-controlled regions each configured to provide a specified substrate temperature uniformity.

Example 49 can include, or can optionally be combined with the subject matter of one or any combination of Examples 31 through 48 to optionally include two or more printing systems configured to deposit patterned organic layers on the substrate.

Example 50 can include, or can optionally be combined with the subject matter of one or any combination of Examples 31 through 49 to optionally include two or more printing systems configured to deposit a different patterned organic layer on the substrate, where the thermal treatment module is configured to provide a thermal treatment to the substrate between or after deposition of the different patterned organic layers.

Example 51 can include, or can optionally be combined with the subject matter of one or any combination of Examples 31 through 50 to optionally include a drying module configured to receive the substrate after deposition of the first patterned organic layer, and configured to dry the ink comprising the first patterned organic layer that was deposited during a printing operation.

Example 52 can include, or can optionally be combined with the subject matter of one or any combination of Examples 31 through 51 to optionally include a drying module configured to one or more of at least partially evacuate or purge an atmosphere within the drying module to facilitate a drying operation.

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic device fabrication system, comprising:
a printing system configured to deposit an organic material on a substrate in a first processing environment, the printing system located in an enclosure capable of maintaining the first processing environment, the first processing environment having a particulate contamination level, a water vapor content, and an ozone content below first specified limits;
a thermal treatment module configured to thermally treat the organic material deposited on the substrate in a second processing environment so as to form a patterned organic layer on the substrate, the patterned organic layer comprising at least a portion of a light-emitting device being fabricated upon the substrate, wherein the thermal treatment module comprises a chamber housing a stacked configuration of thermally-controlled regions, each of the thermally-controlled regions configured to accommodate a substrate, the thermal treatment module capable of maintaining the second processing environment in the chamber, wherein the second processing environment has a particulate contamination level, a water vapor content, an oxygen content, and an ozone content below second specified limits;
a temperature controller operably coupled to independently control temperatures of at least two of the thermally-controlled regions; and
a substrate transfer module configured to receive the substrate from the printing system and configured to provide the substrate to the second processing environment within the chamber of the thermal treatment module;
wherein a level of an oxygen content of the first processing environment in the enclosure that houses the printing system is at least 100 times greater than a level of the oxygen content of the second processing environment in the chamber of the thermal treatment module.

2. The electronic device fabrication system of claim 1, comprising a substrate cooling module comprising a chamber housing one or more substrate holding regions, each substrate holding region configured to accommodate a substrate, the substrate cooling module configured to hold the substrate until the substrate is below a specified threshold temperature;
wherein the substrate cooling module is capable of maintaining a third processing environment, the third processing environment having a particulate contamination level, a water vapor content, an oxygen content, and an ozone content below third specified limits.

3. The electronic device fabrication system of claim 2, wherein the substrate transfer module is configured to receive the substrate from the second processing environment within the chamber of the thermal treatment module and configured to provide the substrate to the third processing environment within the chamber of the substrate cooling module.

4. The electronic device fabrication system of claim 2, further comprising a gas controller operably coupled to maintain the oxygen content of the third processing environment at a level that is at least 100 times less than a level of the oxygen content of the first processing environment.

5. The electronic device fabrication system of claim 2, wherein the specified threshold temperature is 100 C.

6. The electronic device fabrication system of claim 2, wherein the chamber of the substrate cooling module houses multiple substrate cooling stations in a stacked configuration, each substrate cooling station offset from each other.

7. The electronic device fabrication system of claim 2, wherein the second processing environment and the third processing environment are substantially the same.

8. The electronic device fabrication system of claim 1, further comprising a gas controller operably coupled to provide the first processing environment with clean dry air controlled to maintain the water vapor content below 100 ppm and the ozone content below 100 ppm.

9. The electronic device fabrication system of claim 1, further comprising a gas controller operably coupled to provide the second processing environment with a purified non-reactive gas specified for minimal or no reactivity with a species deposited on the substrate.

10. The electronic device fabrication system of claim 9, further comprising a gas controller operably coupled to provide the second processing environment with nitrogen above atmospheric pressure.

11. The electronic device fabrication system of claim 1, further comprising a gas controller operably coupled to establish the second processing environment to have less than 1000 parts-per-million of oxygen, less than 100 parts-per-million of water vapor, and less than 100 parts-per-million of ozone.

12. The electronic device fabrication system of claim 1, further comprising a gas controller operably coupled to establish the first processing environment having an oxygen content of more than 1,000 parts-per-million.

13. The electronic device fabrication system of claim 1, comprising a first handler configured to transfer the substrate from the printing system.

14. The electronic device fabrication system of claim 13, comprising a second handler located in an environment different from an environment in which the first handler is located, the second handler configured to transfer the substrate to the thermal treatment module.

15. The electronic device fabrication system of claim 14, wherein the second handler is configured to place the substrate in a specified one of the thermally-controlled regions.

16. The electronic device fabrication system of claim 1, wherein the substrate transfer module comprises at least one chamber separate from each of the printing system and the chamber of the thermal treatment module.

17. The electronic device fabrication system of claim 1, wherein the printing system is enclosed; and
wherein the substrate transfer module is located between the printing system and the chamber of the thermal treatment module.

18. The electronic device fabrication system of claim 1, wherein the chamber of the thermal treatment module is configured to provide access to different ones of the thermally-controlled regions for substrate loading and unloading using a movable platform, the movable platform configured to move the thermally-controlled regions in at least one axis.

19. The electronic device fabrication system of claim 1, wherein the printing system comprises an inkjet printing system.

20. The electronic device fabrication system of claim 1, wherein the substrate transfer module comprises an enclosed interior configured to receive a substrate from the first processing environment and provide a substrate to the second processing environment.

21. The electronic device fabrication system of claim 1, further comprising a gas controller operably coupled to establish the second processing environment, wherein the substrate transfer module is configured to transfer the substrate from the printing system to the chamber of the thermal treatment module when the particulate contamination level, the water vapor content, the oxygen content, and the ozone content of the second processing environment are maintained by the gas controller below the second specified limits within the chamber of the thermal treatment module.

22. The electronic device fabrication system of claim 1, further comprising a gas controller operably coupled to establish the second processing environment in the chamber of the thermal treatment module at a pressure at or above atmospheric pressure, wherein the substrate transfer module is configured to transfer the substrate to the chamber of the thermal treatment module without raising the oxygen content within the chamber of the thermal treatment module to a level of more than 10 parts per million.

23. The electronic device fabrication system of claim 1, further comprising a substrate handler configured to move the substrate within the chamber of the thermal treatment module.

24. The electronic device fabrication system of claim 1, wherein the temperature controller is configured to independently control the temperatures of each of the thermally-controlled regions so as to maintain a specified substrate temperature.

25. The electronic device fabrication system of claim 1, wherein the temperature controller is configured to independently control the temperatures of each of the thermally-controlled regions so as to maintain a specified substrate temperature uniformity.

26. The electronic device fabrication system of claim 1, further comprising a drying module configured to receive the substrate from the printing system, the drying module being configured to dry the organic material deposited on the substrate.

27. The electronic device fabrication system of claim 26, wherein the drying module is configured to one or more of at least partially evacuate or purge an atmosphere within the drying module.

28. The electronic device fabrication system of claim 1, further comprising a gas controller operably coupled to establish the second processing environment to have the oxygen content of less than 10 parts-per-million.

29. The electronic device fabrication system of claim 1, wherein the temperature controller is configured to independently control the temperatures of each of the thermally-controlled regions.

30. The electronic device fabrication system of claim 29, wherein the temperature controller is configured to independently control the temperatures of each of the thermally-controlled regions so as to maintain different specified substrate temperatures or different specified substrate temperature uniformities.

31. The electronic device fabrication system of claim 1, further comprising at least two heating devices associated with the at least two of the thermally-controlled regions, respectively, and wherein the temperature controller is configured to independently control the at least two heating devices so as to independently control the temperatures of the at least two of the thermally-controlled regions.

32. An electronic device fabrication system, comprising:
two or more printing systems each configured to deposit an organic material on a substrate in a first processing environment, each of the two or more printing systems located in an enclosure capable of maintaining the first processing environment having a particulate contamination level, a water vapor content, and an ozone content below first specified limits;
a thermal treatment module configured to thermally treat the organic material deposited on the substrate in a second processing environment so as to form a patterned organic layer on the substrate, the patterned organic layer comprising at least a portion of a light-emitting device being fabricated upon the substrate, wherein the thermal treatment module comprises a chamber housing a stacked configuration of thermally-controlled regions, each thermally-controlled region configured to accommodate a substrate, the thermal treatment module capable of maintaining the second processing environment in the chamber, wherein the second processing environment has a particulate contamination level, a water vapor content, an oxygen content, and an ozone content below second specified limits;
a temperature controller operably coupled to independently control temperatures of at least two of the thermally-controlled regions; and
a substrate transfer module configured to receive the substrate from the two or more printing systems and configured to provide the substrate to the second processing environment within the chamber of the thermal treatment module;
wherein a level of an oxygen content of the first processing environment in the enclosure that houses at least one of the two or more printing systems is at least 100 times greater than a level of the oxygen content of the second processing environment in the chamber of the thermal treatment module.

33. The electronic device fabrication system of claim 32, wherein each of the two or more printing systems is configured to deposit a different organic material to form a different patterned organic layer on the substrate; and wherein the thermal treatment module is configured to provide a thermal treatment to the substrate between or after deposition of the different organic materials.

* * * * *